United States Patent
Kallai et al.

(10) Patent No.: US 11,082,770 B2
(45) Date of Patent: *Aug. 3, 2021

(54) MULTI-CHANNEL PAIRING IN A MEDIA SYSTEM

(71) Applicant: Sonos, Inc, Santa Barbara, CA (US)

(72) Inventors: Christopher Kallai, Santa Barbara, CA (US); Michael Darrell Andrew Ericson, Santa Barbara, CA (US); Robert A. Lambourne, Santa Barbara, CA (US); Robert Reimann, Santa Barbara, CA (US); Mark Triplett, St. Charles, IL (US)

(73) Assignee: Sonos, Inc., Santa Barbara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/405,931

(22) Filed: Jan. 13, 2017

(65) Prior Publication Data

US 2017/0134855 A1 May 11, 2017

Related U.S. Application Data

(63) Continuation of application No. 14/825,961, filed on Aug. 13, 2015, now Pat. No. 9,756,424, which is a
(Continued)

(51) Int. Cl.
*G06F 17/00* (2019.01)
*H04R 3/12* (2006.01)
(Continued)

(52) U.S. Cl.
CPC ............... *H04R 3/12* (2013.01); *G06F 3/165* (2013.01); *H03G 3/20* (2013.01); *H03G 3/3005* (2013.01);
(Continued)

(58) Field of Classification Search
CPC . H04R 3/12; H04R 5/04; H04R 27/00; H04R 2227/003; H04R 2227/005;
(Continued)

(56) References Cited

U.S. PATENT DOCUMENTS 3,956,591 A 5/1976 Gates, Jr.
4,105,974 A 8/1978 Rogers
(Continued)

FOREIGN PATENT DOCUMENTS

CA 2320451 A1 3/2001
CN 1598767 A 3/2005
(Continued)

OTHER PUBLICATIONS

Yamaha DME designer (Year: 2004).*
(Continued)

*Primary Examiner* — Paul C McCord
(74) *Attorney, Agent, or Firm* — Akerman LLP

(57) ABSTRACT

Systems and methods for output of audio content are disclosed. An example first playback device includes a processor. The example processor is configured to at least process audio content to determine a portion of the audio content to be output by the first playback device based on a type of pairing of the first playback device and the audio content. The example processor is configured to at least determine, when the type of pairing pairs the first playback device with a second playback device to output the audio content, a time delay to facilitate sound synchronization with the second playback device. The example processor is configured to at least configure, based on the type of pairing and the time delay, the first playback device to output the portion of the audio content via an amplifier and a plurality of speaker drivers.

22 Claims, 21 Drawing Sheets

Related U.S. Application Data continuation of application No. 14/299,847, filed on Jun. 9, 2014, now Pat. No. 9,219,959, which is a continuation of application No. 13/083,499, filed on Apr. 8, 2011, now Pat. No. 8,788,080, which is a continuation-in-part of application No. 13/013,740, filed on Jan. 25, 2011, now Pat. No. 9,202,509, which is a continuation-in-part of application No. 11/853,790, filed on Sep. 11, 2007, now Pat. No. 8,483,853.

(60) Provisional application No. 60/825,407, filed on Sep. 12, 2006.

(51) Int. Cl.
  *G06F 3/16* (2006.01)
  *H04R 27/00* (2006.01)
  *H04S 7/00* (2006.01)
  *H03G 3/20* (2006.01)
  *H04R 5/04* (2006.01)
  *H03G 3/30* (2006.01)
  *H03G 5/16* (2006.01)

(52) U.S. Cl.
  CPC .............. *H03G 5/165* (2013.01); *H04R 5/04* (2013.01); *H04R 27/00* (2013.01); *H04S 7/30* (2013.01); *H04R 2227/003* (2013.01); *H04R 2227/005* (2013.01); *H04R 2420/01* (2013.01); *H04R 2420/07* (2013.01); *H04S 2400/01* (2013.01)

(58) Field of Classification Search
  CPC . H04R 2420/07; H04R 2420/01; G06F 3/165; H03G 3/20; H03G 3/3005; H03G 5/165; H04S 7/30; H04S 2400/01
  USPC .......................................................... 700/94
  See application file for complete search history.

(56) References Cited

U.S. PATENT DOCUMENTS

| | | |
|---|---|---|
| D260,764 S | 9/1981 | Castagna et al. |
| 4,296,278 A | 10/1981 | Cullison et al. |
| 4,306,114 A | 12/1981 | Callahan |
| 4,382,158 A | 5/1983 | Ohshita et al. |
| 4,509,211 A | 4/1985 | Robbins |
| D279,779 S | 7/1985 | Taylor |
| 4,530,091 A | 7/1985 | Crockett |
| 4,661,902 A | 4/1987 | Hochsprung et al. |
| 4,689,786 A | 8/1987 | Sidhu et al. |
| 4,696,037 A | 9/1987 | Fierens |
| 4,701,629 A | 10/1987 | Citroen |
| 4,712,105 A | 12/1987 | Koehler |
| D293,671 S | 1/1988 | Beaumont |
| 4,731,814 A | 3/1988 | Becker et al. |
| 4,816,989 A | 3/1989 | Finn et al. |
| 4,824,059 A | 4/1989 | Butler |
| D301,037 S | 5/1989 | Matsuda |
| 4,845,751 A | 7/1989 | Schwab |
| D304,443 S | 11/1989 | Grinyer et al. |
| D313,023 S | 12/1990 | Kolenda et al. |
| D313,398 S | 1/1991 | Gilchrist |
| D313,600 S | 1/1991 | Weber |
| 4,994,908 A | 2/1991 | Kuban et al. |
| 4,995,778 A | 2/1991 | Bruessel |
| D320,598 S | 10/1991 | Auerbach et al. |
| D322,609 S | 12/1991 | Patton |
| 5,086,385 A | 2/1992 | Launey et al. |
| D326,450 S | 5/1992 | Watanabe |
| D327,060 S | 6/1992 | Wachob et al. |
| 5,151,922 A | 9/1992 | Weiss |
| 5,153,579 A | 10/1992 | Fisch et al. |
| D331,388 S | 12/1992 | Dahnert et al. |
| 5,182,552 A | 1/1993 | Paynting |
| D333,135 S | 2/1993 | Wachob et al. |
| 5,185,680 A | 2/1993 | Kakubo |
| 5,197,099 A | 3/1993 | Hirasawa |
| 5,237,327 A | 8/1993 | Saitoh et al. |
| 5,239,458 A | 8/1993 | Suzuki |
| 5,272,757 A | 12/1993 | Scofield et al. |
| 5,299,266 A | 3/1994 | Lumsden |
| 5,313,524 A | 5/1994 | Van Hulle et al. |
| D350,531 S | 9/1994 | Tsuji |
| D350,962 S | 9/1994 | Reardon et al. |
| 5,361,381 A | 11/1994 | Short |
| 5,372,441 A | 12/1994 | Louis |
| D354,059 S | 1/1995 | Hendricks |
| D354,751 S | 1/1995 | Hersh et al. |
| D356,093 S | 3/1995 | McCauley et al. |
| D356,312 S | 3/1995 | Althans |
| D357,024 S | 4/1995 | Tokiyama et al. |
| 5,406,634 A | 4/1995 | Anderson et al. |
| 5,430,485 A | 7/1995 | Lankford et al. |
| 5,440,644 A | 8/1995 | Farinelli et al. |
| D362,446 S | 9/1995 | Gasiorek et al. |
| 5,457,448 A | 10/1995 | Totsuka et al. |
| D363,933 S | 11/1995 | Starck |
| 5,467,342 A | 11/1995 | Logston et al. |
| D364,877 S | 12/1995 | Tokiyama et al. |
| D364,878 S | 12/1995 | Green et al. |
| D365,102 S | 12/1995 | Gioscia |
| D366,044 S | 1/1996 | Hara et al. |
| 5,481,251 A | 1/1996 | Buys et al. |
| 5,491,839 A | 2/1996 | Schotz |
| 5,515,345 A | 5/1996 | Barreira et al. |
| 5,519,641 A | 5/1996 | Beers et al. |
| 5,533,021 A | 7/1996 | Branstad et al. |
| D372,716 S | 8/1996 | Thorne |
| 5,553,147 A | 9/1996 | Pineau |
| 5,553,222 A | 9/1996 | Milne et al. |
| 5,553,314 A | 9/1996 | Grube et al. |
| D377,651 S | 1/1997 | Biasotti et al. |
| 5,596,696 A | 1/1997 | Tindell et al. |
| 5,602,992 A | 2/1997 | Danneels |
| 5,623,483 A | 4/1997 | Agrawal et al. |
| 5,625,350 A | 4/1997 | Fukatsu et al. |
| D379,816 S | 6/1997 | Laituri et al. |
| 5,640,388 A | 6/1997 | Woodhead et al. |
| 5,642,171 A | 6/1997 | Baumgartner et al. |
| D380,752 S | 7/1997 | Hanson |
| 5,652,749 A | 7/1997 | Davenport et al. |
| D382,271 S | 8/1997 | Akwiwu |
| 5,661,665 A | 8/1997 | Glass et al. |
| 5,668,884 A | 9/1997 | Clair, Jr. et al. |
| 5,673,323 A | 9/1997 | Schotz et al. |
| D384,940 S | 10/1997 | Kono et al. |
| D387,352 S | 12/1997 | Kaneko et al. |
| 5,696,896 A | 12/1997 | Badovinatz et al. |
| D388,792 S | 1/1998 | Nykerk |
| D389,143 S | 1/1998 | Wicks |
| D392,641 S | 3/1998 | Fenner |
| 5,726,989 A | 3/1998 | Dokic |
| D393,628 S | 4/1998 | Ledbetter et al. |
| 5,740,235 A | 4/1998 | Lester et al. |
| 5,742,623 A | 4/1998 | Nuber et al. |
| D394,659 S | 5/1998 | Biasotti et al. |
| 5,751,819 A | 5/1998 | Dorrough |
| 5,761,320 A | 6/1998 | Farinelli et al. |
| 5,774,016 A | 6/1998 | Ketterer |
| D395,889 S | 7/1998 | Gerba et al. |
| 5,787,249 A | 7/1998 | Badovinatz et al. |
| 5,790,543 A | 8/1998 | Cloutier |
| D397,996 S | 9/1998 | Smith |
| 5,808,662 A | 9/1998 | Kinney et al. |
| 5,812,201 A | 9/1998 | Yoo |
| 5,815,689 A | 9/1998 | Shaw et al. |
| 5,818,948 A | 10/1998 | Gulick |
| D401,587 S | 11/1998 | Rudolph |
| 5,832,024 A | 11/1998 | Schotz et al. |
| 5,848,152 A | 12/1998 | Slipy et al. |
| 5,852,722 A | 12/1998 | Hamilton |
| 5,852,744 A | 12/1998 | Agatone et al. |

(56) References Cited

U.S. PATENT DOCUMENTS

| | | |
|---|---|---|
| D404,741 S | 1/1999 | Schumaker et al. |
| D405,071 S | 2/1999 | Gambaro |
| 5,867,691 A | 2/1999 | Shiraishi |
| 5,875,233 A | 2/1999 | Cox |
| 5,875,354 A | 2/1999 | Charlton et al. |
| D406,847 S | 3/1999 | Gerba et al. |
| D407,071 S | 3/1999 | Keating |
| 5,887,143 A | 3/1999 | Saito et al. |
| 5,905,768 A | 5/1999 | Maturi et al. |
| D410,927 S | 6/1999 | Yamagishi |
| 5,910,990 A | 6/1999 | Jang |
| 5,910,991 A | 6/1999 | Farrar |
| D412,337 S | 7/1999 | Hamano |
| 5,923,869 A | 7/1999 | Kashiwagi et al. |
| 5,923,902 A | 7/1999 | Inagaki |
| 5,946,343 A | 8/1999 | Schotz et al. |
| 5,956,025 A | 9/1999 | Goulden et al. |
| 5,956,088 A | 9/1999 | Shen et al. |
| 5,960,006 A | 9/1999 | Maturi et al. |
| 5,960,167 A | 9/1999 | Roberts et al. |
| D415,496 S | 10/1999 | Gerba et al. |
| D416,021 S | 11/1999 | Godette et al. |
| 5,984,512 A | 11/1999 | Jones et al. |
| 5,987,611 A | 11/1999 | Freund |
| 5,990,884 A | 11/1999 | Douma et al. |
| 5,991,307 A | 11/1999 | Komuro et al. |
| 5,999,906 A | 12/1999 | Mercs et al. |
| 6,009,457 A | 12/1999 | Moller |
| 6,018,376 A | 1/2000 | Nakatani |
| D420,006 S | 2/2000 | Tonino |
| 6,026,150 A | 2/2000 | Frank et al. |
| 6,026,297 A | 2/2000 | Haartsen |
| 6,029,196 A | 2/2000 | Lenz |
| 6,031,818 A | 2/2000 | Lo et al. |
| 6,032,202 A | 2/2000 | Lea et al. |
| 6,038,614 A | 3/2000 | Chan et al. |
| 6,046,550 A | 4/2000 | Ference et al. |
| 6,061,457 A | 5/2000 | Stockhamer |
| 6,078,725 A | 6/2000 | Tanaka |
| 6,081,266 A | 6/2000 | Sciammarella |
| 6,085,236 A | 7/2000 | Lea |
| 6,088,063 A | 7/2000 | Shiba |
| D429,246 S | 8/2000 | Holma |
| D430,143 S | 8/2000 | Renk |
| 6,101,195 A | 8/2000 | Lyons et al. |
| 6,108,485 A | 8/2000 | Kim |
| 6,108,686 A | 8/2000 | Williams, Jr. |
| 6,119,239 A | 9/2000 | Fujii |
| 6,122,668 A | 9/2000 | Teng et al. |
| 6,122,749 A | 9/2000 | Gulick |
| D431,552 S | 10/2000 | Backs et al. |
| D432,525 S | 10/2000 | Beecroft |
| 6,127,941 A | 10/2000 | Van Ryzin |
| 6,128,318 A | 10/2000 | Sato |
| 6,131,130 A | 10/2000 | Van Ryzin |
| 6,148,205 A | 11/2000 | Cotton |
| 6,157,957 A | 12/2000 | Berthaud |
| 6,163,647 A | 12/2000 | Terashima et al. |
| 6,169,725 B1 | 1/2001 | Gibbs et al. |
| 6,175,872 B1 | 1/2001 | Neumann et al. |
| 6,181,383 B1 | 1/2001 | Fox et al. |
| 6,185,737 B1 | 2/2001 | Northcutt et al. |
| 6,195,435 B1 | 2/2001 | Kitamura |
| 6,195,436 B1 | 2/2001 | Scibora et al. |
| 6,199,169 B1 | 3/2001 | Voth |
| 6,212,282 B1 | 4/2001 | Mershon |
| 6,246,701 B1 | 6/2001 | Slattery |
| 6,253,293 B1 | 6/2001 | Rao et al. |
| D444,475 S | 7/2001 | Levey et al. |
| 6,255,961 B1 | 7/2001 | Van Ryzin et al. |
| 6,256,554 B1 | 7/2001 | Dilorenzo |
| 6,269,406 B1 | 7/2001 | Dutcher et al. |
| 6,301,012 B1 | 10/2001 | White et al. |
| 6,308,207 B1 | 10/2001 | Tseng et al. |
| 6,310,652 B1 | 10/2001 | Li et al. |
| 6,313,879 B1 | 11/2001 | Kubo et al. |
| 6,321,252 B1 | 11/2001 | Bhola et al. |
| 6,324,586 B1 | 11/2001 | Johnson |
| D452,520 S | 12/2001 | Gotham et al. |
| 6,332,147 B1 | 12/2001 | Moran et al. |
| 6,336,219 B1 | 1/2002 | Nathan |
| 6,343,028 B1 | 1/2002 | Kuwaoka |
| 6,349,285 B1 | 2/2002 | Liu et al. |
| 6,349,339 B1 | 2/2002 | Williams |
| 6,349,352 B1 | 2/2002 | Lea |
| 6,351,821 B1 | 2/2002 | Voth |
| 6,353,172 B1 | 3/2002 | Fay et al. |
| 6,356,871 B1 | 3/2002 | Hemkumar et al. |
| 6,404,811 B1 | 6/2002 | Cvetko et al. |
| 6,418,150 B1 | 7/2002 | Staats |
| 6,430,353 B1 | 8/2002 | Honda et al. |
| 6,442,443 B1 | 8/2002 | Fujii et al. |
| D462,339 S | 9/2002 | Allen et al. |
| D462,340 S | 9/2002 | Allen et al. |
| D462,945 S | 9/2002 | Skulley |
| 6,449,642 B2 | 9/2002 | Bourke-Dunphy et al. |
| 6,449,653 B2 | 9/2002 | Klemets et al. |
| 6,456,783 B1 | 9/2002 | Ando et al. |
| 6,463,474 B1 | 10/2002 | Fuh et al. |
| 6,466,832 B1 | 10/2002 | Zuqert et al. |
| 6,469,633 B1 | 10/2002 | Wachter |
| D466,108 S | 11/2002 | Glodava et al. |
| 6,487,296 B1 | 11/2002 | Allen et al. |
| 6,493,832 B1 | 12/2002 | Itakura et al. |
| D468,297 S | 1/2003 | Ikeda |
| 6,522,886 B1 | 2/2003 | Youngs et al. |
| 6,526,325 B1 | 2/2003 | Sussman et al. |
| 6,535,121 B2 | 3/2003 | Mathney et al. |
| D474,763 S | 5/2003 | Tozaki |
| D475,993 S | 6/2003 | Meyer |
| D476,643 S | 7/2003 | Yamagishi |
| D477,310 S | 7/2003 | Moransais |
| 6,587,127 B1 | 7/2003 | Leeke et al. |
| 6,598,172 B1 | 7/2003 | Vandeusen et al. |
| D478,051 S | 8/2003 | Sagawa |
| D478,069 S | 8/2003 | Beck et al. |
| D478,896 S | 8/2003 | Summers |
| 6,604,023 B1 | 8/2003 | Brown et al. |
| 6,611,537 B1 | 8/2003 | Edens et al. |
| D479,520 S | 9/2003 | De Saulles |
| D481,056 S | 10/2003 | Kawasaki et al. |
| 6,631,410 B1 | 10/2003 | Kowalski et al. |
| 6,636,269 B1 | 10/2003 | Baldwin |
| 6,653,899 B2 | 11/2003 | Organvidez et al. |
| 6,654,720 B1 | 11/2003 | Graham et al. |
| 6,654,956 B1 | 11/2003 | Trinh et al. |
| 6,658,091 B1 | 12/2003 | Naidoo et al. |
| 6,674,803 B1 | 1/2004 | Kesselring |
| 6,684,060 B1 | 1/2004 | Curtin |
| D486,145 S | 2/2004 | Kaminski et al. |
| 6,687,664 B1 | 2/2004 | Sussman et al. |
| 6,703,940 B1 | 3/2004 | Allen et al. |
| 6,704,421 B1 | 3/2004 | Kitamura |
| 6,731,760 B2 | 5/2004 | Pedersen |
| 6,732,176 B1 | 5/2004 | Stewart et al. |
| 6,741,708 B1 | 5/2004 | Nakatsugawa |
| 6,741,961 B2 | 5/2004 | Lim |
| D491,925 S | 6/2004 | Griesau et al. |
| 6,757,517 B2 | 6/2004 | Chang |
| D493,148 S | 7/2004 | Shibata et al. |
| 6,763,274 B1 | 7/2004 | Gilbert |
| D495,333 S | 8/2004 | Borsboom |
| 6,772,267 B2 | 8/2004 | Thaler et al. |
| 6,778,073 B2 | 8/2004 | Lutter et al. |
| 6,778,493 B1 | 8/2004 | Ishii |
| 6,778,869 B2 | 8/2004 | Champion |
| D496,003 S | 9/2004 | Spira |
| D496,005 S | 9/2004 | Wang |
| D496,335 S | 9/2004 | Spira |
| 6,788,938 B1 | 9/2004 | Sugaya et al. |
| D497,363 S | 10/2004 | Olson et al. |
| 6,803,964 B1 | 10/2004 | Post et al. |
| 6,809,635 B1 | 10/2004 | Kaaresoja |
| D499,086 S | 11/2004 | Polito |

(56) References Cited

U.S. PATENT DOCUMENTS

| | | |
|---|---|---|
| 6,816,510 B1 | 11/2004 | Banerjee |
| 6,816,818 B2 | 11/2004 | Wolf et al. |
| 6,823,225 B1 | 11/2004 | Sass |
| 6,826,283 B1 | 11/2004 | Wheeler et al. |
| D499,395 S | 12/2004 | Hsu |
| D499,718 S | 12/2004 | Chen |
| D500,015 S | 12/2004 | Gubbe |
| 6,836,788 B2 | 12/2004 | Kim et al. |
| 6,839,752 B1 | 1/2005 | Miller et al. |
| D501,477 S | 2/2005 | Hall |
| 6,859,460 B1 | 2/2005 | Chen |
| 6,859,538 B1 | 2/2005 | Voltz |
| 6,870,934 B2 | 3/2005 | Krochmal et al. |
| 6,873,862 B2 | 3/2005 | Reshefsky |
| 6,882,335 B2 | 4/2005 | Saarinen |
| D504,872 S | 5/2005 | Uehara et al. |
| D504,885 S | 5/2005 | Zhang et al. |
| 6,889,207 B2 | 5/2005 | Slemmer et al. |
| 6,898,642 B2 | 5/2005 | Chafle et al. |
| 6,901,439 B1 | 5/2005 | Bonasia et al. |
| D506,463 S | 6/2005 | Daniels |
| 6,907,458 B2 | 6/2005 | Tomassetti et al. |
| 6,912,610 B2 | 6/2005 | Spencer |
| 6,915,347 B2 | 7/2005 | Hanko et al. |
| 6,916,980 B2 | 7/2005 | Ishida et al. |
| 6,917,592 B1 | 7/2005 | Ramankutty et al. |
| 6,919,771 B2 | 7/2005 | Nakajima |
| 6,920,373 B2 | 7/2005 | Xi et al. |
| 6,931,134 B1 | 8/2005 | Waller, Jr. et al. |
| 6,931,557 B2 | 8/2005 | Togawa |
| 6,934,766 B1 | 8/2005 | Russell |
| 6,937,988 B1 | 8/2005 | Hemkumar et al. |
| 6,950,666 B2 | 9/2005 | Asakawa |
| 6,965,948 B1 | 11/2005 | Eneborg et al. |
| 6,970,481 B2 | 11/2005 | Gray, III et al. |
| 6,970,482 B2 | 11/2005 | Kim |
| 6,981,259 B2 | 12/2005 | Luman et al. |
| 6,985,694 B1 | 1/2006 | De Bonet et al. |
| 6,987,767 B2 | 1/2006 | Saito |
| 6,987,947 B2 | 1/2006 | Richenstein et al. |
| 6,993,570 B1 | 1/2006 | Irani |
| D515,072 S | 2/2006 | Lee |
| D515,557 S | 2/2006 | Okuley |
| 7,007,106 B1 | 2/2006 | Flood et al. |
| 7,020,791 B1 | 3/2006 | Aweya et al. |
| D518,475 S | 4/2006 | Yang et al. |
| 7,043,477 B2 | 5/2006 | Mercer et al. |
| 7,043,651 B2 | 5/2006 | Aweya et al. |
| 7,046,677 B2 | 5/2006 | Monta et al. |
| 7,047,308 B2 | 5/2006 | Deshpande |
| 7,054,888 B2 | 5/2006 | Lachapelle et al. |
| 7,058,889 B2 | 6/2006 | Trovato et al. |
| 7,068,596 B1 | 6/2006 | Mou |
| D524,296 S | 7/2006 | Kita |
| 7,072,477 B1 | 7/2006 | Kincaid |
| 7,076,204 B2 | 7/2006 | Richenstein et al. |
| D527,375 S | 8/2006 | Flora et al. |
| 7,092,528 B2 | 8/2006 | Patrick et al. |
| 7,092,694 B2 | 8/2006 | Griep et al. |
| 7,096,169 B2 | 8/2006 | Crutchfield et al. |
| 7,107,442 B2 | 9/2006 | Cheshire |
| 7,113,999 B2 | 9/2006 | Pestoni et al. |
| 7,115,017 B1 | 10/2006 | Laursen et al. |
| 7,120,168 B2 | 10/2006 | Zimmermann |
| 7,123,731 B2 | 10/2006 | Cohen et al. |
| 7,130,316 B2 | 10/2006 | Kovacevic |
| 7,130,368 B1 | 10/2006 | Aweya et al. |
| 7,130,608 B2 | 10/2006 | Hollstrom et al. |
| 7,130,616 B2 | 10/2006 | Janik |
| 7,136,934 B2 | 11/2006 | Carter et al. |
| 7,139,981 B2 | 11/2006 | Mayer et al. |
| 7,143,141 B1 | 11/2006 | Morgan et al. |
| 7,143,939 B2 | 12/2006 | Henzerling |
| 7,146,260 B2 | 12/2006 | Preston et al. |
| 7,158,488 B2 | 1/2007 | Fujimori |
| 7,158,783 B2 | 1/2007 | Eguchi |
| 7,161,939 B2 | 1/2007 | Israel et al. |
| 7,162,315 B2 | 1/2007 | Gilbert |
| 7,171,010 B2 | 1/2007 | Martin et al. |
| 7,174,157 B2 | 2/2007 | Gassho et al. |
| 7,184,774 B2 | 2/2007 | Robinson et al. |
| 7,185,090 B2 | 2/2007 | Kowalski et al. |
| 7,187,947 B1 | 3/2007 | White et al. |
| 7,197,148 B2 | 3/2007 | Nourse et al. |
| 7,206,367 B1 | 4/2007 | Moore |
| 7,206,618 B2 | 4/2007 | Latto et al. |
| 7,206,967 B1 | 4/2007 | Marti et al. |
| 7,209,795 B2 | 4/2007 | Sullivan et al. |
| 7,215,649 B2 | 5/2007 | Yu et al. |
| 7,218,708 B2 | 5/2007 | Berezowski |
| 7,236,739 B2 | 6/2007 | Chang |
| 7,236,773 B2 | 6/2007 | Thomas |
| 7,246,374 B1 | 7/2007 | Simon et al. |
| 7,257,398 B1 | 8/2007 | Ukita et al. |
| 7,260,616 B1 | 8/2007 | Cook |
| 7,263,110 B2 | 8/2007 | Fujishiro |
| 7,269,338 B2 | 9/2007 | Janevski |
| 7,274,761 B2 | 9/2007 | Muller et al. |
| 7,275,156 B2 | 9/2007 | Balfanz et al. |
| 7,277,547 B1 | 10/2007 | Delker et al. |
| 7,286,652 B1 | 10/2007 | Azriel et al. |
| 7,289,631 B2 | 10/2007 | Ishidoshiro |
| 7,293,060 B2 | 11/2007 | Komsi |
| 7,295,548 B2 | 11/2007 | Blank et al. |
| 7,302,468 B2 | 11/2007 | Wijeratne |
| 7,305,694 B2 | 12/2007 | Commons et al. |
| 7,308,188 B2 | 12/2007 | Namatame |
| 7,308,489 B2 | 12/2007 | Weast |
| 7,310,334 B1 | 12/2007 | Fitzgerald et al. |
| 7,312,785 B2 | 12/2007 | Tsuk et al. |
| 7,313,384 B1 | 12/2007 | Meenan et al. |
| 7,313,593 B1 | 12/2007 | Pulito et al. |
| 7,319,764 B1 | 1/2008 | Reid et al. |
| 7,324,857 B2 | 1/2008 | Goddard |
| 7,330,875 B1 | 2/2008 | Parasnis et al. |
| 7,333,519 B2 | 2/2008 | Sullivan et al. |
| 7,346,332 B2 | 3/2008 | McCarty et al. |
| 7,356,011 B1 | 4/2008 | Waters et al. |
| 7,359,006 B1 | 4/2008 | Xiang et al. |
| 7,363,363 B2 | 4/2008 | Dal Canto et al. |
| 7,366,206 B2 | 4/2008 | Lockridge et al. |
| 7,372,846 B2 | 5/2008 | Zwack |
| 7,376,834 B2 | 5/2008 | Edwards et al. |
| 7,391,791 B2 | 6/2008 | Balassanian et al. |
| 7,392,102 B2 | 6/2008 | Sullivan et al. |
| 7,392,387 B2 | 6/2008 | Balfanz et al. |
| 7,392,481 B2 | 6/2008 | Gewickey et al. |
| 7,400,644 B2 | 7/2008 | Sakamoto et al. |
| 7,400,732 B2 | 7/2008 | Staddon et al. |
| 7,412,499 B2 | 8/2008 | Chang et al. |
| 7,424,267 B2 | 9/2008 | Eisenbach |
| 7,428,310 B2 | 9/2008 | Park |
| 7,430,181 B1 | 9/2008 | Hong |
| 7,454,619 B2 | 11/2008 | Smetters et al. |
| 7,457,948 B1 | 11/2008 | Bilicksa et al. |
| 7,472,058 B2 | 12/2008 | Tseng et al. |
| 7,474,677 B2 | 1/2009 | Trott |
| 7,483,538 B2 * | 1/2009 | McCarty .................. H04R 5/04 381/77 |
| 7,483,540 B2 | 1/2009 | Rabinowitz et al. |
| 7,483,958 B1 | 1/2009 | Elabbady et al. |
| 7,490,044 B2 | 2/2009 | Kulkarni |
| 7,492,912 B2 | 2/2009 | Chung et al. |
| 7,505,889 B2 | 3/2009 | Salmonsen et al. |
| 7,509,181 B2 | 3/2009 | Champion |
| 7,519,188 B2 | 4/2009 | Berardi et al. |
| 7,519,667 B1 | 4/2009 | Capps |
| 7,532,862 B2 | 5/2009 | Cheshire |
| 7,539,551 B2 | 5/2009 | Komura et al. |
| 7,548,744 B2 | 6/2009 | Oesterling et al. |
| 7,548,851 B1 | 6/2009 | Lau et al. |
| 7,558,224 B1 | 7/2009 | Surazski et al. |
| 7,558,635 B1 | 7/2009 | Thiel et al. |
| 7,561,697 B2 | 7/2009 | Harris |

(56) References Cited

U.S. PATENT DOCUMENTS

| | | |
|---|---|---|
| 7,561,932 B1 | 7/2009 | Holmes et al. |
| 7,571,014 B1 | 8/2009 | Lambourne et al. |
| 7,574,274 B2 | 8/2009 | Holmes |
| 7,581,096 B2 | 8/2009 | Balfanz et al. |
| 7,599,685 B2 | 10/2009 | Goldberg et al. |
| 7,606,174 B2 | 10/2009 | Ochi et al. |
| 7,620,468 B2 | 11/2009 | Shimizu |
| 7,626,952 B2 | 12/2009 | Slemmer et al. |
| 7,627,825 B2 | 12/2009 | Kakuda |
| 7,630,500 B1 | 12/2009 | Beckman et al. |
| 7,630,501 B2 | 12/2009 | Blank et al. |
| 7,631,119 B2 | 12/2009 | Moore et al. |
| 7,634,093 B2 | 12/2009 | McGrath |
| 7,643,894 B2 | 1/2010 | Braithwaite et al. |
| 7,653,344 B1 | 1/2010 | Feldman et al. |
| 7,657,224 B2 | 2/2010 | Goldberg et al. |
| 7,657,255 B2 | 2/2010 | Abel et al. |
| 7,657,644 B1 | 2/2010 | Zheng |
| 7,657,910 B1 | 2/2010 | McAulay et al. |
| 7,665,115 B2 | 2/2010 | Gallo et al. |
| 7,668,990 B2 | 2/2010 | Krzyzanowski et al. |
| 7,669,113 B1 | 2/2010 | Moore et al. |
| 7,669,219 B2 | 2/2010 | Scott |
| 7,672,470 B2 | 3/2010 | Lee |
| 7,675,943 B2 | 3/2010 | Mosig et al. |
| 7,676,044 B2 | 3/2010 | Sasaki et al. |
| 7,676,142 B1 | 3/2010 | Hung |
| 7,688,306 B2 | 3/2010 | Wehrenberg et al. |
| 7,689,304 B2 | 3/2010 | Sasaki |
| 7,689,305 B2 | 3/2010 | Kreifeldt et al. |
| 7,690,017 B2 | 3/2010 | Stecyk et al. |
| 7,702,279 B2 | 4/2010 | Ko et al. |
| 7,702,403 B1 | 4/2010 | Gladwin et al. |
| 7,710,941 B2 | 5/2010 | Rietschel et al. |
| 7,711,774 B1 | 5/2010 | Rothschild |
| 7,716,375 B2 | 5/2010 | Blum et al. |
| 7,720,096 B2 | 5/2010 | Klemets |
| 7,721,032 B2 | 5/2010 | Bushell et al. |
| 7,742,740 B2 | 6/2010 | Goldberg et al. |
| 7,742,832 B1 | 6/2010 | Feldman et al. |
| 7,743,009 B2 | 6/2010 | Hangartner et al. |
| 7,746,906 B2 | 6/2010 | Jinzaki et al. |
| 7,752,329 B1 | 7/2010 | Meenan et al. |
| 7,757,076 B2 | 7/2010 | Stewart et al. |
| 7,761,176 B2 | 7/2010 | Ben-Yaacov et al. |
| 7,765,315 B2 | 7/2010 | Batson et al. |
| RE41,608 E | 8/2010 | Blair et al. |
| 7,792,311 B1 | 9/2010 | Holmgren et al. |
| 7,793,206 B2 | 9/2010 | Lim et al. |
| 7,804,972 B2 | 9/2010 | Melanson |
| 7,805,210 B2 | 9/2010 | Cucos et al. |
| 7,817,960 B2 | 10/2010 | Tan et al. |
| 7,827,259 B2 | 11/2010 | Heller et al. |
| 7,831,054 B2 | 11/2010 | Ball et al. |
| 7,835,689 B2 | 11/2010 | Goldberg et al. |
| 7,849,181 B2 | 12/2010 | Slemmer et al. |
| 7,853,341 B2 | 12/2010 | McCarty et al. |
| 7,865,137 B2 | 1/2011 | Goldberg et al. |
| 7,882,234 B2 | 2/2011 | Watanabe et al. |
| 7,885,622 B2 | 2/2011 | Krampf et al. |
| 7,899,656 B2 | 3/2011 | Crutchfield, Jr. |
| 7,904,720 B2 | 3/2011 | Smetters et al. |
| 7,907,736 B2 | 3/2011 | Yuen et al. |
| 7,907,819 B2 | 3/2011 | Ando et al. |
| 7,916,861 B2 | 3/2011 | Conley et al. |
| 7,916,877 B2 | 3/2011 | Goldberg et al. |
| 7,917,082 B2 | 3/2011 | Goldberg et al. |
| 7,933,418 B2 | 4/2011 | Morishima |
| 7,934,239 B1 | 4/2011 | Dagman |
| 7,937,089 B2 | 5/2011 | Smetters et al. |
| 7,937,752 B2 | 5/2011 | Balfanz et al. |
| 7,945,636 B2 | 5/2011 | Nelson et al. |
| 7,945,708 B2 | 5/2011 | Ohkita |
| 7,958,441 B2 | 6/2011 | Heller et al. |
| 7,962,482 B2 | 6/2011 | Handman et al. |
| 7,966,388 B1 | 6/2011 | Pugaczewski et al. |
| 7,975,051 B2 | 7/2011 | Saint Clair et al. |
| 7,987,294 B2 | 7/2011 | Bryce et al. |
| 7,995,732 B2 | 8/2011 | Koch et al. |
| 7,996,566 B1 | 8/2011 | Sylvain et al. |
| 7,996,588 B2 | 8/2011 | Subbiah et al. |
| 8,014,423 B2 | 9/2011 | Thaler et al. |
| 8,015,306 B2 | 9/2011 | Bowman |
| 8,020,023 B2 | 9/2011 | Millington et al. |
| 8,023,663 B2 | 9/2011 | Goldberg |
| 8,028,038 B2 | 9/2011 | Weel |
| 8,028,323 B2 | 9/2011 | Weel |
| 8,041,062 B2 | 10/2011 | Cohen et al. |
| 8,045,721 B2 | 10/2011 | Burgan et al. |
| 8,045,952 B2 | 10/2011 | Qureshey et al. |
| 8,050,203 B2 | 11/2011 | Jacobsen et al. |
| 8,050,652 B2 | 11/2011 | Qureshey et al. |
| 8,054,987 B2 | 11/2011 | Seydoux |
| 8,055,364 B2 | 11/2011 | Champion |
| 8,063,698 B2 | 11/2011 | Howard |
| 8,074,253 B1 | 12/2011 | Nathan |
| 8,086,287 B2 | 12/2011 | Mooney et al. |
| 8,086,752 B2 | 12/2011 | Millington et al. |
| 8,090,317 B2 | 1/2012 | Burge et al. |
| 8,103,009 B2 | 1/2012 | McCarty et al. |
| 8,111,132 B2 | 2/2012 | Allen et al. |
| 8,112,032 B2 | 2/2012 | Ko et al. |
| 8,116,476 B2 | 2/2012 | Inohara |
| 8,126,172 B2 | 2/2012 | Horbach et al. |
| 8,131,389 B1 | 3/2012 | Hardwick et al. |
| 8,131,390 B2 | 3/2012 | Braithwaite et al. |
| 8,134,650 B2 | 3/2012 | Maxson et al. |
| 8,135,141 B2 | 3/2012 | Shiba |
| 8,139,774 B2 | 3/2012 | Berardi et al. |
| 8,144,883 B2 | 3/2012 | Pdersen et al. |
| 8,148,622 B2 | 4/2012 | Rothkopf et al. |
| 8,150,079 B2 | 4/2012 | Maeda et al. |
| 8,156,337 B2 | 4/2012 | Balfanz et al. |
| 8,160,281 B2 | 4/2012 | Kim et al. |
| 8,169,938 B2 | 5/2012 | Duchscher et al. |
| 8,170,222 B2 | 5/2012 | Dunko |
| 8,170,260 B2 | 5/2012 | Reining et al. |
| 8,175,292 B2 | 5/2012 | Aylward et al. |
| 8,175,297 B1 | 5/2012 | Ho et al. |
| 8,185,674 B2 | 5/2012 | Moore et al. |
| 8,189,824 B2 | 5/2012 | Strauss et al. |
| 8,194,874 B2 | 6/2012 | Starobin et al. |
| 8,204,890 B1 | 6/2012 | Gogan |
| 8,208,653 B2 | 6/2012 | Eo et al. |
| 8,214,447 B2 | 7/2012 | Deslippe et al. |
| 8,214,740 B2 | 7/2012 | Johnson |
| 8,214,873 B2 | 7/2012 | Weel |
| 8,218,790 B2 | 7/2012 | Bull et al. |
| 8,229,125 B2 | 7/2012 | Short |
| 8,230,099 B2 | 7/2012 | Weel |
| 8,233,029 B2 | 7/2012 | Yoshida et al. |
| 8,233,632 B1 | 7/2012 | MacDonald et al. |
| 8,233,635 B2 | 7/2012 | Shiba |
| 8,233,648 B2 | 7/2012 | Sorek et al. |
| 8,234,395 B2 | 7/2012 | Millington et al. |
| 8,238,578 B2 | 8/2012 | Aylward |
| 8,239,559 B2 | 8/2012 | Rajapakse |
| 8,239,748 B1 | 8/2012 | Moore et al. |
| 8,243,961 B1 | 8/2012 | Morrill |
| 8,250,218 B2 | 8/2012 | Watanabe et al. |
| 8,265,310 B2 | 9/2012 | Berardi et al. |
| 8,270,631 B2 | 9/2012 | Kusunoki |
| 8,279,709 B2 | 10/2012 | Choisel et al. |
| 8,281,001 B2 | 10/2012 | Busam et al. |
| 8,285,404 B1 | 10/2012 | Kekki |
| 8,290,185 B2 | 10/2012 | Kim |
| 8,290,603 B2 | 10/2012 | Lambourne |
| 8,300,845 B2 | 10/2012 | Zurek et al. |
| 8,306,235 B2 | 11/2012 | Mahowald |
| 8,311,226 B2 | 11/2012 | Lorgeoux et al. |
| 8,315,555 B2 | 11/2012 | Ko et al. |
| 8,316,147 B2 | 11/2012 | Batson et al. |
| 8,325,931 B2 | 12/2012 | Howard et al. |
| 8,325,935 B2 | 12/2012 | Rutschman |

(56) References Cited

U.S. PATENT DOCUMENTS

| | | |
|---|---|---|
| 8,331,585 B2 | 12/2012 | Hagen et al. |
| 8,340,330 B2 | 12/2012 | Yoon et al. |
| 8,345,709 B2 | 1/2013 | Nitzpon et al. |
| 8,364,295 B2 | 1/2013 | Beckmann et al. |
| 8,370,678 B2 | 2/2013 | Millington et al. |
| 8,374,595 B2 | 2/2013 | Chien et al. |
| 8,391,501 B2 | 3/2013 | Khawand et al. |
| 8,407,623 B2 | 3/2013 | Kerr et al. |
| 8,411,883 B2 | 4/2013 | Matsumoto |
| 8,423,659 B2 | 4/2013 | Millington |
| 8,423,893 B2 | 4/2013 | Ramsay et al. |
| 8,432,851 B2 | 4/2013 | Xu et al. |
| 8,433,076 B2 | 4/2013 | Zurek et al. |
| 8,442,239 B2 | 5/2013 | Bruelle-Drews et al. |
| 8,452,020 B2 | 5/2013 | Gregg et al. |
| 8,457,334 B2 | 6/2013 | Yoon et al. |
| 8,463,184 B2 | 6/2013 | Dua |
| 8,463,875 B2 | 6/2013 | Katz et al. |
| 8,473,844 B2 | 6/2013 | Kreifeldt et al. |
| 8,477,958 B2 | 7/2013 | Moeller et al. |
| 8,483,853 B1 | 7/2013 | Lambourne |
| 8,498,726 B2 | 7/2013 | Kim et al. |
| 8,509,211 B2 | 8/2013 | Trotter et al. |
| 8,509,463 B2 | 8/2013 | Goh et al. |
| 8,515,389 B2 | 8/2013 | Smetters et al. |
| 8,520,870 B2 | 8/2013 | Sato et al. |
| 8,565,455 B2 | 10/2013 | Worrell et al. |
| 8,577,045 B2 | 11/2013 | Gibbs |
| 8,577,048 B2 | 11/2013 | Chaikin et al. |
| 8,588,432 B1 | 11/2013 | Simon |
| 8,588,949 B2 | 11/2013 | Lambourne et al. |
| 8,600,075 B2 | 12/2013 | Lim |
| 8,600,084 B1 | 12/2013 | Garrett |
| 8,601,394 B2 | 12/2013 | Sheehan et al. |
| 8,611,559 B2 | 12/2013 | Sanders |
| 8,615,091 B2 | 12/2013 | Terwal |
| 8,620,006 B2 | 12/2013 | Berardi et al. |
| 8,639,830 B2 | 1/2014 | Bowman |
| 8,654,995 B2 | 2/2014 | Silber et al. |
| 8,672,744 B1 | 3/2014 | Gronkowski et al. |
| 8,683,009 B2 | 3/2014 | Ng et al. |
| 8,688,431 B2 | 4/2014 | Lyons et al. |
| 8,700,730 B2 | 4/2014 | Rowe |
| 8,731,206 B1 | 5/2014 | Park |
| 8,750,282 B2 | 6/2014 | Gelter et al. |
| 8,751,026 B2 | 6/2014 | Sato et al. |
| 8,762,565 B2 | 6/2014 | Togashi et al. |
| 8,768,252 B2 | 7/2014 | Watson et al. |
| 8,775,546 B2 | 7/2014 | Millington |
| 8,788,080 B1 | 7/2014 | Kallai et al. |
| 8,797,926 B2 | 8/2014 | Kearney, III et al. |
| 8,818,538 B2 | 8/2014 | Sakata |
| 8,819,554 B2 | 8/2014 | Basso et al. |
| 8,843,224 B2 | 9/2014 | Holmgren et al. |
| 8,843,228 B2 | 9/2014 | Lambourne |
| 8,843,586 B2 | 9/2014 | Pantos et al. |
| 8,855,319 B2 | 10/2014 | Liu et al. |
| 8,861,739 B2 | 10/2014 | Ojanpera |
| 8,879,761 B2 | 11/2014 | Johnson et al. |
| 8,885,851 B2 | 11/2014 | Westenbroek |
| 8,886,347 B2 | 11/2014 | Lambourne |
| 8,904,066 B2 | 12/2014 | Moore et al. |
| 8,914,559 B2 | 12/2014 | Kalayjian et al. |
| 8,917,877 B2 | 12/2014 | Haaff et al. |
| 8,923,997 B2 | 12/2014 | Kallai et al. |
| 8,930,006 B2 | 1/2015 | Haatainen |
| 8,934,647 B2 | 1/2015 | Joyce et al. |
| 8,934,655 B2 | 1/2015 | Breen et al. |
| 8,942,252 B2 | 1/2015 | Balassanian et al. |
| 8,942,395 B2 | 1/2015 | Lissaman et al. |
| 8,954,177 B2 | 2/2015 | Sanders |
| 8,965,544 B2 | 2/2015 | Ramsay |
| 8,965,546 B2 | 2/2015 | Visser et al. |
| 8,966,394 B2 | 2/2015 | Gates et al. |
| 8,977,974 B2 | 3/2015 | Kraut |
| 8,984,442 B2 | 3/2015 | Pirnack et al. |
| 9,014,833 B2 | 4/2015 | Goh et al. |
| 9,020,153 B2 | 4/2015 | Britt, Jr. |
| 9,042,556 B2 | 5/2015 | Kallai et al. |
| 9,078,281 B2 | 7/2015 | Matsuda et al. |
| 9,112,622 B2 | 8/2015 | Miyata et al. |
| 9,137,602 B2 | 9/2015 | Mayman et al. |
| 9,160,965 B2 | 10/2015 | Redmann et al. |
| 9,195,258 B2 | 11/2015 | Millington |
| 9,219,959 B2 | 12/2015 | Kallai et al. |
| 9,226,073 B2 | 12/2015 | Ramos et al. |
| 9,245,514 B2 | 1/2016 | Donaldson |
| 9,325,286 B1 | 4/2016 | Yang |
| 9,344,206 B2 | 5/2016 | Lambourne |
| 9,524,098 B2 | 12/2016 | Griffiths et al. |
| 9,560,448 B2 | 1/2017 | Hartung |
| 9,998,321 B2 | 6/2018 | Cheshire |
| 2001/0001160 A1 | 5/2001 | Shoff et al. |
| 2001/0009604 A1 | 7/2001 | Ando et al. |
| 2001/0020193 A1 | 9/2001 | Teramachi et al. |
| 2001/0022823 A1 | 9/2001 | Renaud |
| 2001/0027498 A1 | 10/2001 | Van De Meulenhof et al. |
| 2001/0032188 A1 | 10/2001 | Miyabe et al. |
| 2001/0042107 A1 | 11/2001 | Palm |
| 2001/0043456 A1 | 11/2001 | Atkinson |
| 2001/0046235 A1 | 11/2001 | Trevitt et al. |
| 2001/0047377 A1 | 11/2001 | Sincaglia et al. |
| 2001/0050991 A1 | 12/2001 | Eves |
| 2001/0055950 A1 | 12/2001 | Davies et al. |
| 2002/0002039 A1 | 1/2002 | Qureshey et al. |
| 2002/0002562 A1 | 1/2002 | Moran et al. |
| 2002/0002565 A1 | 1/2002 | Ohyama |
| 2002/0003548 A1 | 1/2002 | Krusche et al. |
| 2002/0022453 A1 | 2/2002 | Balog et al. |
| 2002/0026442 A1 | 2/2002 | Lipscomb et al. |
| 2002/0034374 A1 | 3/2002 | Barton |
| 2002/0042844 A1 | 4/2002 | Chiazzese |
| 2002/0049843 A1 | 4/2002 | Barone et al. |
| 2002/0062406 A1 | 5/2002 | Chang et al. |
| 2002/0065926 A1 | 5/2002 | Hackney et al. |
| 2002/0067909 A1 | 6/2002 | Iivonen |
| 2002/0072816 A1 | 6/2002 | Shdema et al. |
| 2002/0072817 A1 | 6/2002 | Champion |
| 2002/0073228 A1 | 6/2002 | Cognet et al. |
| 2002/0078161 A1 | 6/2002 | Cheng |
| 2002/0078293 A1 | 6/2002 | Kou et al. |
| 2002/0080783 A1 | 6/2002 | Fujimori |
| 2002/0083172 A1 | 6/2002 | Knowles et al. |
| 2002/0083342 A1 | 6/2002 | Webb et al. |
| 2002/0090914 A1 | 7/2002 | Kang et al. |
| 2002/0093478 A1 | 7/2002 | Yeh |
| 2002/0095460 A1 | 7/2002 | Benson |
| 2002/0098878 A1 | 7/2002 | Mooney et al. |
| 2002/0101357 A1 | 8/2002 | Gharapetian |
| 2002/0103635 A1 | 8/2002 | Mesarovic |
| 2002/0109710 A1 | 8/2002 | Holtz et al. |
| 2002/0112084 A1 | 8/2002 | Deen et al. |
| 2002/0112244 A1 | 8/2002 | Liou et al. |
| 2002/0114354 A1 | 8/2002 | Sinha et al. |
| 2002/0114359 A1 | 8/2002 | Ibaraki et al. |
| 2002/0124097 A1 | 9/2002 | Isely et al. |
| 2002/0129128 A1 | 9/2002 | Gold et al. |
| 2002/0129156 A1 | 9/2002 | Yoshikawa |
| 2002/0131398 A1 | 9/2002 | Taylor |
| 2002/0131761 A1 | 9/2002 | Kawasaki et al. |
| 2002/0136335 A1 | 9/2002 | Liou et al. |
| 2002/0137505 A1 | 9/2002 | Eiche et al. |
| 2002/0143547 A1 | 10/2002 | Fay et al. |
| 2002/0143998 A1 | 10/2002 | Rajagopal et al. |
| 2002/0146981 A1 | 10/2002 | Saint-Hilaire et al. |
| 2002/0150053 A1 | 10/2002 | Gray et al. |
| 2002/0159596 A1 | 10/2002 | Durand et al. |
| 2002/0163361 A1 | 11/2002 | Parkin |
| 2002/0165721 A1 | 11/2002 | Chang et al. |
| 2002/0165921 A1 | 11/2002 | Sapieyevski |
| 2002/0168938 A1 | 11/2002 | Chang |
| 2002/0173273 A1 | 11/2002 | Spurgat et al. |
| 2002/0174243 A1 | 11/2002 | Spurgat et al. |
| 2002/0177411 A1 | 11/2002 | Yajima et al. |

(56) References Cited

U.S. PATENT DOCUMENTS

| | | |
|---|---|---|
| 2002/0181355 A1 | 12/2002 | Shikunami et al. |
| 2002/0184310 A1 | 12/2002 | Traversat et al. |
| 2002/0188762 A1 | 12/2002 | Tomassetti |
| 2002/0194309 A1 | 12/2002 | Carter et al. |
| 2002/0196951 A1 | 12/2002 | Tsai |
| 2003/0002609 A1 | 1/2003 | Faller et al. |
| 2003/0002689 A1 | 1/2003 | Folio |
| 2003/0002849 A1 | 1/2003 | Lord |
| 2003/0008616 A1 | 1/2003 | Anderson |
| 2003/0014486 A1 | 1/2003 | May |
| 2003/0018797 A1 | 1/2003 | Dunning et al. |
| 2003/0020763 A1 | 1/2003 | Mayer et al. |
| 2003/0023411 A1 | 1/2003 | Witmer et al. |
| 2003/0023741 A1 | 1/2003 | Tomassetti |
| 2003/0031333 A1 | 2/2003 | Cohen et al. |
| 2003/0035072 A1 | 2/2003 | Hagg |
| 2003/0035444 A1 | 2/2003 | Zwack |
| 2003/0041173 A1 | 2/2003 | Hoyle |
| 2003/0041174 A1 | 2/2003 | Wen et al. |
| 2003/0043856 A1 | 3/2003 | Lakaniemi et al. |
| 2003/0043924 A1 | 3/2003 | Haddad et al. |
| 2003/0046703 A1 | 3/2003 | Knowles et al. |
| 2003/0050058 A1 | 3/2003 | Walsh et al. |
| 2003/0055892 A1 | 3/2003 | Huitema et al. |
| 2003/0056220 A1 | 3/2003 | Thornton et al. |
| 2003/0061428 A1 | 3/2003 | Garney et al. |
| 2003/0063755 A1 | 4/2003 | Nourse et al. |
| 2003/0066094 A1 | 4/2003 | Van Der Schaar et al. |
| 2003/0067437 A1 | 4/2003 | McClintock et al. |
| 2003/0073432 A1 | 4/2003 | Meade |
| 2003/0091322 A1 | 5/2003 | Van Der Schaar |
| 2003/0097478 A1 | 5/2003 | King |
| 2003/0099212 A1 | 5/2003 | Anjum et al. |
| 2003/0099221 A1 | 5/2003 | Rhee |
| 2003/0100335 A1 | 5/2003 | Gassho et al. |
| 2003/0101253 A1 | 5/2003 | Saito et al. |
| 2003/0103088 A1 | 6/2003 | Dresti et al. |
| 2003/0103464 A1 | 6/2003 | Wong et al. |
| 2003/0110329 A1 | 6/2003 | Higaki et al. |
| 2003/0126211 A1 | 7/2003 | Anttila et al. |
| 2003/0135822 A1 | 7/2003 | Evans |
| 2003/0157951 A1 | 8/2003 | Hasty |
| 2003/0161479 A1 | 8/2003 | Yang et al. |
| 2003/0167335 A1 | 9/2003 | Alexander |
| 2003/0172123 A1 | 9/2003 | Polan et al. |
| 2003/0177889 A1 | 9/2003 | Koseki et al. |
| 2003/0179780 A1 | 9/2003 | Walker et al. |
| 2003/0185400 A1 | 10/2003 | Yoshizawa et al. |
| 2003/0195964 A1 | 10/2003 | Mane |
| 2003/0198254 A1 | 10/2003 | Sullivan et al. |
| 2003/0198255 A1 | 10/2003 | Sullivan et al. |
| 2003/0198257 A1 | 10/2003 | Sullivan et al. |
| 2003/0200001 A1 | 10/2003 | Goddard |
| 2003/0204273 A1 | 10/2003 | Dinker et al. |
| 2003/0204509 A1 | 10/2003 | Dinker et al. |
| 2003/0210796 A1 | 11/2003 | McCarty et al. |
| 2003/0212802 A1 | 11/2003 | Rector et al. |
| 2003/0215097 A1* | 11/2003 | Crutchfield, Jr. .... H04R 29/001 381/61 |
| 2003/0219007 A1 | 11/2003 | Barrack et al. |
| 2003/0220705 A1 | 11/2003 | Ibey |
| 2003/0225834 A1 | 12/2003 | Lee et al. |
| 2003/0227478 A1 | 12/2003 | Chatfield |
| 2003/0229900 A1 | 12/2003 | Reisman |
| 2003/0231208 A1 | 12/2003 | Hanon et al. |
| 2003/0231871 A1 | 12/2003 | Ushimaru |
| 2003/0235304 A1 | 12/2003 | Evans et al. |
| 2004/0001106 A1 | 1/2004 | Deutscher et al. |
| 2004/0001484 A1 | 1/2004 | Ozguner |
| 2004/0001591 A1 | 1/2004 | Mani et al. |
| 2004/0008852 A1 | 1/2004 | Also et al. |
| 2004/0010727 A1 | 1/2004 | Fujinami |
| 2004/0012620 A1 | 1/2004 | Buhler et al. |
| 2004/0014426 A1 | 1/2004 | Moore |
| 2004/0015252 A1 | 1/2004 | Aiso et al. |
| 2004/0019497 A1 | 1/2004 | Volk et al. |
| 2004/0019807 A1 | 1/2004 | Freund et al. |
| 2004/0019911 A1 | 1/2004 | Gates et al. |
| 2004/0023697 A1 | 2/2004 | Komura |
| 2004/0024478 A1 | 2/2004 | Hans et al. |
| 2004/0024925 A1 | 2/2004 | Cypher et al. |
| 2004/0027166 A1 | 2/2004 | Mangum et al. |
| 2004/0032348 A1 | 2/2004 | Lai et al. |
| 2004/0032421 A1 | 2/2004 | Williamson et al. |
| 2004/0037433 A1 | 2/2004 | Chen |
| 2004/0041836 A1 | 3/2004 | Zaner et al. |
| 2004/0042629 A1 | 3/2004 | Mellone et al. |
| 2004/0044742 A1 | 3/2004 | Evron et al. |
| 2004/0048569 A1 | 3/2004 | Kawamura |
| 2004/0059842 A1 | 3/2004 | Hanson et al. |
| 2004/0059965 A1 | 3/2004 | Marshall et al. |
| 2004/0066736 A1 | 4/2004 | Kroeger |
| 2004/0071299 A1 | 4/2004 | Yoshino |
| 2004/0075767 A1 | 4/2004 | Neuman et al. |
| 2004/0078383 A1 | 4/2004 | Mercer et al. |
| 2004/0080671 A1 | 4/2004 | Siemens et al. |
| 2004/0093096 A1 | 5/2004 | Huang et al. |
| 2004/0098754 A1 | 5/2004 | Vella et al. |
| 2004/0111473 A1 | 6/2004 | Lysenko et al. |
| 2004/0114771 A1 | 6/2004 | Vaughan et al. |
| 2004/0117044 A1 | 6/2004 | Konetski |
| 2004/0117462 A1 | 6/2004 | Bodin et al. |
| 2004/0128701 A1 | 7/2004 | Kaneko et al. |
| 2004/0131192 A1 | 7/2004 | Metcalf |
| 2004/0133689 A1 | 7/2004 | Vasisht |
| 2004/0143368 A1 | 7/2004 | May et al. |
| 2004/0143852 A1 | 7/2004 | Meyers |
| 2004/0147224 A1 | 7/2004 | Lee |
| 2004/0148237 A1 | 7/2004 | Bittmann et al. |
| 2004/0168081 A1 | 8/2004 | Ladas et al. |
| 2004/0170383 A1 | 9/2004 | Mazur |
| 2004/0171346 A1 | 9/2004 | Lin |
| 2004/0176025 A1 | 9/2004 | Holm et al. |
| 2004/0177167 A1 | 9/2004 | Iwamura et al. |
| 2004/0179554 A1 | 9/2004 | Tsao |
| 2004/0183827 A1 | 9/2004 | Putterman et al. |
| 2004/0185773 A1 | 9/2004 | Gerber et al. |
| 2004/0195313 A1 | 10/2004 | Lee |
| 2004/0203354 A1 | 10/2004 | Yue |
| 2004/0203376 A1 | 10/2004 | Phillipps |
| 2004/0203378 A1 | 10/2004 | Powers |
| 2004/0203590 A1 | 10/2004 | Shteyn |
| 2004/0203936 A1 | 10/2004 | Ogino et al. |
| 2004/0208158 A1 | 10/2004 | Fellman et al. |
| 2004/0213230 A1 | 10/2004 | Douskalis et al. |
| 2004/0214524 A1 | 10/2004 | Noda et al. |
| 2004/0220687 A1 | 11/2004 | Klotz et al. |
| 2004/0223622 A1 | 11/2004 | Lindemann et al. |
| 2004/0224638 A1 | 11/2004 | Fadell et al. |
| 2004/0225389 A1 | 11/2004 | Ledoux et al. |
| 2004/0228367 A1 | 11/2004 | Mosig et al. |
| 2004/0248601 A1 | 12/2004 | Chang |
| 2004/0249490 A1 | 12/2004 | Sakai |
| 2004/0249965 A1 | 12/2004 | Huggins et al. |
| 2004/0249982 A1 | 12/2004 | Arnold et al. |
| 2004/0252400 A1 | 12/2004 | Blank et al. |
| 2004/0253969 A1 | 12/2004 | Nguyen et al. |
| 2004/0264717 A1 | 12/2004 | Fujita et al. |
| 2005/0002535 A1 | 1/2005 | Liu et al. |
| 2005/0010691 A1 | 1/2005 | Oyadomari et al. |
| 2005/0011388 A1 | 1/2005 | Kouznetsov |
| 2005/0013394 A1 | 1/2005 | Rausch et al. |
| 2005/0015551 A1 | 1/2005 | Eames et al. |
| 2005/0021470 A1 | 1/2005 | Martin et al. |
| 2005/0021590 A1 | 1/2005 | Debique et al. |
| 2005/0027821 A1 | 2/2005 | Alexander et al. |
| 2005/0031135 A1 | 2/2005 | Devantier et al. |
| 2005/0047605 A1 | 3/2005 | Lee et al. |
| 2005/0058149 A1 | 3/2005 | Howe |
| 2005/0060435 A1 | 3/2005 | Xue et al. |
| 2005/0062637 A1 | 3/2005 | El Zabadani et al. |
| 2005/0069153 A1 | 3/2005 | Hall et al. |
| 2005/0081213 A1 | 4/2005 | Suzuoki et al. |
| 2005/0100166 A1 | 5/2005 | Smetters et al. |

(56) References Cited

U.S. PATENT DOCUMENTS

| | | |
|---|---|---|
| 2005/0100174 A1 | 5/2005 | Howard et al. |
| 2005/0105052 A1 | 5/2005 | McCormick et al. |
| 2005/0114538 A1 | 5/2005 | Rose |
| 2005/0120128 A1 | 6/2005 | Willes et al. |
| 2005/0125222 A1 | 6/2005 | Brown et al. |
| 2005/0125357 A1 | 6/2005 | Saadat et al. |
| 2005/0129240 A1 | 6/2005 | Balfanz et al. |
| 2005/0131558 A1 | 6/2005 | Braithwaite et al. |
| 2005/0144284 A1 | 6/2005 | Ludwig et al. |
| 2005/0147261 A1 | 7/2005 | Yeh |
| 2005/0149204 A1 | 7/2005 | Manchester et al. |
| 2005/0154766 A1 | 7/2005 | Huang et al. |
| 2005/0159833 A1 | 7/2005 | Giaimo et al. |
| 2005/0160270 A1 | 7/2005 | Goldberg et al. |
| 2005/0166135 A1 | 7/2005 | Burke et al. |
| 2005/0168630 A1 | 8/2005 | Yamada et al. |
| 2005/0177256 A1 | 8/2005 | Shintani et al. |
| 2005/0177643 A1 | 8/2005 | Xu |
| 2005/0181348 A1 | 8/2005 | Carey et al. |
| 2005/0195205 A1 | 9/2005 | Abrams |
| 2005/0195823 A1 | 9/2005 | Chen et al. |
| 2005/0195999 A1 | 9/2005 | Takemura et al. |
| 2005/0197725 A1 | 9/2005 | Alexander et al. |
| 2005/0198574 A1 | 9/2005 | Lamkin et al. |
| 2005/0201549 A1 | 9/2005 | Dedieu et al. |
| 2005/0216556 A1 | 9/2005 | Manion et al. |
| 2005/0254505 A1 | 11/2005 | Chang et al. |
| 2005/0262217 A1 | 11/2005 | Nonaka et al. |
| 2005/0266798 A1 | 12/2005 | Moloney et al. |
| 2005/0266826 A1 | 12/2005 | Vlad |
| 2005/0281255 A1 | 12/2005 | Davies et al. |
| 2005/0283820 A1 | 12/2005 | Richards et al. |
| 2005/0288805 A1 | 12/2005 | Moore et al. |
| 2005/0289224 A1 | 12/2005 | Deslippe et al. |
| 2005/0289244 A1 | 12/2005 | Sahu et al. |
| 2006/0041616 A1 | 2/2006 | Ludwig et al. |
| 2006/0041639 A1 | 2/2006 | Lamkin et al. |
| 2006/0045281 A1 | 3/2006 | Korneluk et al. |
| 2006/0072489 A1 | 4/2006 | Toyoshima |
| 2006/0095516 A1 | 5/2006 | Wijeratne |
| 2006/0098936 A1 | 5/2006 | Ikeda et al. |
| 2006/0119497 A1 | 6/2006 | Miller et al. |
| 2006/0143236 A1 | 6/2006 | Wu |
| 2006/0149402 A1 | 7/2006 | Chung |
| 2006/0155721 A1 | 7/2006 | Grunwald et al. |
| 2006/0173844 A1 | 8/2006 | Zhang et al. |
| 2006/0179160 A1 | 8/2006 | Uehara et al. |
| 2006/0193454 A1 | 8/2006 | Abou-Chakra et al. |
| 2006/0193482 A1 | 8/2006 | Harvey et al. |
| 2006/0199538 A1 | 9/2006 | Eisenbach |
| 2006/0205349 A1 | 9/2006 | Passier et al. |
| 2006/0222186 A1 | 10/2006 | Paige et al. |
| 2006/0227985 A1 | 10/2006 | Kawanami |
| 2006/0229752 A1 | 10/2006 | Chung |
| 2006/0259649 A1 | 11/2006 | Hsieh et al. |
| 2006/0265571 A1 | 11/2006 | Bosch et al. |
| 2006/0270395 A1 | 11/2006 | Dhawan et al. |
| 2006/0281409 A1 | 12/2006 | Levien et al. |
| 2006/0287746 A1 | 12/2006 | Braithwaite et al. |
| 2006/0294569 A1 | 12/2006 | Chung |
| 2007/0003067 A1 | 1/2007 | Gierl et al. |
| 2007/0003075 A1 | 1/2007 | Cooper et al. |
| 2007/0022207 A1 | 1/2007 | Millington et al. |
| 2007/0038999 A1 | 2/2007 | Millington et al. |
| 2007/0043847 A1 | 2/2007 | Carter et al. |
| 2007/0047712 A1 | 3/2007 | Gross et al. |
| 2007/0048713 A1 | 3/2007 | Plastina et al. |
| 2007/0054680 A1 | 3/2007 | Mo et al. |
| 2007/0071255 A1 | 3/2007 | Schobben |
| 2007/0087686 A1 | 4/2007 | Holm et al. |
| 2007/0142022 A1 | 6/2007 | Madonna et al. |
| 2007/0142944 A1 | 6/2007 | Goldberg et al. |
| 2007/0143493 A1 | 6/2007 | Mullig et al. |
| 2007/0169115 A1 | 7/2007 | Ko et al. |
| 2007/0180137 A1 | 8/2007 | Rajapakse |
| 2007/0189544 A1 | 8/2007 | Rosenberg |
| 2007/0192156 A1 | 8/2007 | Gauger |
| 2007/0206829 A1 | 9/2007 | Weinans et al. |
| 2007/0220150 A1 | 9/2007 | Garg |
| 2007/0223725 A1 | 9/2007 | Neumann et al. |
| 2007/0249295 A1 | 10/2007 | Ukita et al. |
| 2007/0265031 A1 | 11/2007 | Koizumi et al. |
| 2007/0271388 A1 | 11/2007 | Bowra et al. |
| 2007/0288610 A1 | 12/2007 | Saint Clair et al. |
| 2007/0299778 A1 | 12/2007 | Haveson et al. |
| 2008/0002836 A1 | 1/2008 | Moeller et al. |
| 2008/0007649 A1 | 1/2008 | Bennett |
| 2008/0007650 A1 | 1/2008 | Bennett |
| 2008/0007651 A1 | 1/2008 | Bennett |
| 2008/0018785 A1 | 1/2008 | Bennett |
| 2008/0022320 A1 | 1/2008 | Ver Steeg |
| 2008/0025535 A1 | 1/2008 | Rajapakse |
| 2008/0045140 A1 | 2/2008 | Korhonen |
| 2008/0065232 A1 | 3/2008 | Igoe |
| 2008/0066094 A1 | 3/2008 | Igoe |
| 2008/0066120 A1 | 3/2008 | Igoe |
| 2008/0072816 A1 | 3/2008 | Riess et al. |
| 2008/0075295 A1 | 3/2008 | Mayman et al. |
| 2008/0077261 A1 | 3/2008 | Baudino et al. |
| 2008/0077619 A1 | 3/2008 | Gilley et al. |
| 2008/0077620 A1 | 3/2008 | Gilley et al. |
| 2008/0086318 A1 | 4/2008 | Gilley et al. |
| 2008/0091771 A1 | 4/2008 | Allen et al. |
| 2008/0092204 A1 | 4/2008 | Bryce et al. |
| 2008/0109852 A1 | 5/2008 | Kretz et al. |
| 2008/0120429 A1 | 5/2008 | Millington et al. |
| 2008/0126943 A1 | 5/2008 | Parasnis |
| 2008/0144861 A1 | 6/2008 | Melanson et al. |
| 2008/0144864 A1 | 6/2008 | Huon |
| 2008/0146289 A1 | 6/2008 | Korneluk et al. |
| 2008/0152165 A1 | 6/2008 | Zacchi |
| 2008/0159545 A1 | 7/2008 | Takumai et al. |
| 2008/0162668 A1 | 7/2008 | Miller |
| 2008/0189272 A1 | 8/2008 | Powers et al. |
| 2008/0205070 A1 | 8/2008 | Osada |
| 2008/0212786 A1 | 9/2008 | Park |
| 2008/0215169 A1 | 9/2008 | Debettencourt et al. |
| 2008/0242222 A1 | 10/2008 | Bryce et al. |
| 2008/0247554 A1 | 10/2008 | Caffrey |
| 2008/0263010 A1 | 10/2008 | Roychoudhuri |
| 2008/0273714 A1 | 11/2008 | Hartung |
| 2008/0291863 A1 | 11/2008 | Agren |
| 2008/0303947 A1 | 12/2008 | Ohnishi et al. |
| 2009/0011798 A1 | 1/2009 | Yamada |
| 2009/0017868 A1 | 1/2009 | Ueda et al. |
| 2009/0031336 A1 | 1/2009 | Chavez et al. |
| 2009/0060219 A1 | 3/2009 | Inohara |
| 2009/0070434 A1 | 3/2009 | Himmelstein |
| 2009/0087000 A1 | 4/2009 | Ko |
| 2009/0089327 A1 | 4/2009 | Kalaboukis et al. |
| 2009/0097672 A1 | 4/2009 | Buil et al. |
| 2009/0100189 A1 | 4/2009 | Bahren et al. |
| 2009/0124289 A1 | 5/2009 | Nishida |
| 2009/0157905 A1 | 6/2009 | Davis |
| 2009/0164655 A1 | 6/2009 | Pettersson et al. |
| 2009/0169030 A1 | 7/2009 | Inohara |
| 2009/0180632 A1 | 7/2009 | Goldberg et al. |
| 2009/0193345 A1 | 7/2009 | Wensley et al. |
| 2009/0222115 A1 | 9/2009 | Malcolm et al. |
| 2009/0228919 A1 | 9/2009 | Zott et al. |
| 2009/0232326 A1 | 9/2009 | Gordon et al. |
| 2009/0251604 A1 | 10/2009 | Iyer |
| 2010/0004983 A1 | 1/2010 | Dickerson et al. |
| 2010/0010651 A1 | 1/2010 | Kirkeby et al. |
| 2010/0031366 A1 | 2/2010 | Knight et al. |
| 2010/0049835 A1 | 2/2010 | Ko et al. |
| 2010/0052843 A1 | 3/2010 | Cannistraro |
| 2010/0067716 A1 | 3/2010 | Katayama |
| 2010/0087089 A1 | 4/2010 | Struthers et al. |
| 2010/0142735 A1 | 6/2010 | Yoon et al. |
| 2010/0153097 A1 | 6/2010 | Hotho et al. |
| 2010/0228740 A1 | 9/2010 | Cannistraro et al. |
| 2010/0272270 A1 | 10/2010 | Chaikin et al. |
| 2010/0284389 A1 | 11/2010 | Ramsay et al. |

(56) References Cited

U.S. PATENT DOCUMENTS

| | | |
|---|---|---|
| 2010/0290643 A1 | 11/2010 | Mihelich et al. |
| 2010/0299639 A1 | 11/2010 | Ramsay et al. |
| 2011/0001632 A1 | 1/2011 | Hohorst |
| 2011/0002487 A1 | 1/2011 | Panther et al. |
| 2011/0044476 A1 | 2/2011 | Burlingame et al. |
| 2011/0066943 A1 | 3/2011 | Brillon et al. |
| 2011/0110533 A1 | 5/2011 | Choi et al. |
| 2011/0170710 A1 | 7/2011 | Son |
| 2011/0222701 A1 | 9/2011 | Donaldson et al. |
| 2011/0228944 A1 | 9/2011 | Croghan et al. |
| 2011/0299696 A1 | 12/2011 | Holmgren et al. |
| 2011/0316768 A1 | 12/2011 | McRae |
| 2012/0029671 A1 | 2/2012 | Millington |
| 2012/0030366 A1 | 2/2012 | Collart et al. |
| 2012/0047435 A1 | 2/2012 | Holladay et al. |
| 2012/0051558 A1 | 3/2012 | Kim et al. |
| 2012/0051567 A1 | 3/2012 | Castor-Perry |
| 2012/0060046 A1 | 3/2012 | Millington |
| 2012/0127831 A1 | 5/2012 | Gicklhorn et al. |
| 2012/0129446 A1 | 5/2012 | Ko et al. |
| 2012/0148075 A1 | 6/2012 | Goh et al. |
| 2012/0185771 A1 | 7/2012 | Rothkopf et al. |
| 2012/0192071 A1 | 7/2012 | Millington |
| 2012/0207290 A1 | 8/2012 | Moyers et al. |
| 2012/0237054 A1 | 9/2012 | Eo et al. |
| 2012/0263325 A1 | 10/2012 | Freeman et al. |
| 2012/0281058 A1 | 11/2012 | Laney et al. |
| 2012/0290621 A1 | 11/2012 | Heitz, III et al. |
| 2013/0010970 A1 | 1/2013 | Hegarty et al. |
| 2013/0018960 A1 | 1/2013 | Knysz et al. |
| 2013/0028443 A1 | 1/2013 | Pance et al. |
| 2013/0031475 A1 | 1/2013 | Maor et al. |
| 2013/0038726 A1 | 2/2013 | Kim |
| 2013/0041954 A1 | 2/2013 | Kim et al. |
| 2013/0047084 A1 | 2/2013 | Sanders |
| 2013/0051572 A1 | 2/2013 | Goh et al. |
| 2013/0052940 A1 | 2/2013 | Brillhart et al. |
| 2013/0070093 A1 | 3/2013 | Rivera et al. |
| 2013/0080599 A1 | 3/2013 | Ko et al. |
| 2013/0094670 A1 | 4/2013 | Millington |
| 2013/0124664 A1 | 5/2013 | Fonseca, Jr. et al. |
| 2013/0129122 A1 | 5/2013 | Johnson et al. |
| 2013/0132837 A1 | 5/2013 | Mead et al. |
| 2013/0159126 A1 | 6/2013 | Elkady |
| 2013/0167029 A1 | 6/2013 | Friesen et al. |
| 2013/0174100 A1 | 7/2013 | Seymour et al. |
| 2013/0174223 A1 | 7/2013 | Dykeman et al. |
| 2013/0179163 A1 | 7/2013 | Herbig et al. |
| 2013/0191454 A1 | 7/2013 | Oliver et al. |
| 2013/0197682 A1 | 8/2013 | Millington |
| 2013/0208911 A1 | 8/2013 | Millington |
| 2013/0208921 A1 | 8/2013 | Millington |
| 2013/0226323 A1 | 8/2013 | Millington |
| 2013/0230175 A1 | 9/2013 | Bech et al. |
| 2013/0232416 A1 | 9/2013 | Millington |
| 2013/0236029 A1 | 9/2013 | Millington |
| 2013/0243199 A1 | 9/2013 | Kallai et al. |
| 2013/0253679 A1 | 9/2013 | Lambourne |
| 2013/0253934 A1 | 9/2013 | Parekh et al. |
| 2013/0259254 A1 | 10/2013 | Xiang et al. |
| 2013/0279706 A1 | 10/2013 | Marti |
| 2013/0287186 A1 | 10/2013 | Quady |
| 2013/0290504 A1 | 10/2013 | Quady |
| 2013/0293345 A1 | 11/2013 | Lambourne |
| 2014/0006483 A1 | 1/2014 | Garmark et al. |
| 2014/0016784 A1 | 1/2014 | Sen et al. |
| 2014/0016786 A1 | 1/2014 | Sen |
| 2014/0016802 A1 | 1/2014 | Sen |
| 2014/0023196 A1 | 1/2014 | Xiang et al. |
| 2014/0037097 A1 | 2/2014 | Labosco |
| 2014/0064501 A1 | 3/2014 | Olsen et al. |
| 2014/0075308 A1 | 3/2014 | Sanders et al. |
| 2014/0075311 A1 | 3/2014 | Boettcher et al. |
| 2014/0079242 A1 | 3/2014 | Nguyen et al. |
| 2014/0108929 A1 | 4/2014 | Garmark et al. |
| 2014/0112481 A1 | 4/2014 | Li et al. |
| 2014/0123005 A1 | 5/2014 | Forstall et al. |
| 2014/0140530 A1 | 5/2014 | Gomes-Casseres et al. |
| 2014/0161265 A1 | 6/2014 | Chaikin et al. |
| 2014/0181569 A1 | 6/2014 | Millington et al. |
| 2014/0219456 A1 | 8/2014 | Morrell et al. |
| 2014/0226823 A1 | 8/2014 | Sen et al. |
| 2014/0242913 A1 | 8/2014 | Pang |
| 2014/0256260 A1 | 9/2014 | Ueda et al. |
| 2014/0267148 A1 | 9/2014 | Luna et al. |
| 2014/0270202 A1 | 9/2014 | Ivanov et al. |
| 2014/0273859 A1 | 9/2014 | Luna et al. |
| 2014/0279889 A1 | 9/2014 | Luna |
| 2014/0285313 A1 | 9/2014 | Luna et al. |
| 2014/0286496 A1 | 9/2014 | Luna et al. |
| 2014/0294200 A1 | 10/2014 | Baumgarte et al. |
| 2014/0298174 A1 | 10/2014 | Ikonomov |
| 2014/0323036 A1 | 10/2014 | Daley et al. |
| 2014/0344689 A1 | 11/2014 | Scott et al. |
| 2014/0355768 A1 | 12/2014 | Sen et al. |
| 2014/0355794 A1 | 12/2014 | Morrell et al. |
| 2014/0378056 A1 | 12/2014 | Liu |
| 2015/0019670 A1 | 1/2015 | Redmann |
| 2015/0026613 A1 | 1/2015 | Kwon et al. |
| 2015/0032844 A1 | 1/2015 | Tarr et al. |
| 2015/0043736 A1 | 2/2015 | Olsen et al. |
| 2015/0049248 A1 | 2/2015 | Wang et al. |
| 2015/0063610 A1 | 3/2015 | Mossner |
| 2015/0074527 A1 | 3/2015 | Sevigny et al. |
| 2015/0074528 A1 | 3/2015 | Sakalowsky et al. |
| 2015/0098576 A1 | 4/2015 | Sundaresan et al. |
| 2015/0139210 A1 | 5/2015 | Marin et al. |
| 2015/0146886 A1 | 5/2015 | Baumgarte |
| 2015/0201274 A1 | 7/2015 | Ellner et al. |
| 2015/0256954 A1 | 9/2015 | Carlsson et al. |
| 2015/0281866 A1 | 10/2015 | Williams et al. |
| 2015/0286360 A1 | 10/2015 | Wachter et al. |
| 2015/0304288 A1 | 10/2015 | Balasaygun et al. |
| 2015/0365987 A1 | 12/2015 | Weel |
| 2016/0234615 A1 | 8/2016 | Lambourne |
| 2017/0188152 A1 | 6/2017 | Watson et al. |

FOREIGN PATENT DOCUMENTS

| | | |
|---|---|---|
| CN | 101095372 A | 12/2007 |
| CN | 101292500 A | 10/2008 |
| CN | 101785182 A | 7/2010 |
| EP | 0251584 A2 | 1/1988 |
| EP | 0672985 A1 | 9/1995 |
| EP | 0772374 A2 | 5/1997 |
| EP | 1058985 A2 | 12/2000 |
| EP | 1111527 A2 | 6/2001 |
| EP | 1122931 A2 | 8/2001 |
| EP | 1133896 B1 | 8/2002 |
| EP | 1312188 A1 | 5/2003 |
| EP | 1389853 A1 | 2/2004 |
| EP | 2713281 | 4/2004 |
| EP | 1517464 A2 | 3/2005 |
| EP | 0895427 A3 | 1/2006 |
| EP | 1416687 B1 | 8/2006 |
| EP | 1410686 | 3/2008 |
| EP | 2043381 A2 | 4/2009 |
| EP | 2161950 A2 | 3/2010 |
| EP | 1825713 B1 | 10/2012 |
| EP | 0742674 B1 | 4/2014 |
| EP | 2591617 B1 | 6/2014 |
| EP | 2860992 A1 | 4/2015 |
| EP | 2986034 B1 | 5/2017 |
| GB | 2284327 A | 5/1995 |
| GB | 2338374 | 12/1999 |
| GB | 2379533 A | 3/2003 |
| GB | 2486183 | 6/2012 |
| JP | 63269633 | 11/1988 |
| JP | 07-210129 | 8/1995 |
| JP | 2000149391 A | 5/2000 |
| JP | 2001034951 | 2/2001 |
| JP | 2002111817 | 4/2002 |
| JP | 2002123267 A | 4/2002 |
| JP | 2002358241 A | 12/2002 |

(56) References Cited

FOREIGN PATENT DOCUMENTS

| | | |
|---|---|---|
| JP | 2003037585 | 2/2003 |
| JP | 2003506765 A | 2/2003 |
| JP | 2003101958 | 4/2003 |
| JP | 2003169089 A | 6/2003 |
| JP | 2004193868 A | 7/2004 |
| JP | 2005108427 | 4/2005 |
| JP | 2005136457 | 5/2005 |
| JP | 2007241652 A | 9/2007 |
| JP | 2007288405 A | 11/2007 |
| JP | 2009506603 A | 2/2009 |
| JP | 2009135750 | 6/2009 |
| JP | 2009218888 | 9/2009 |
| JP | 2009535708 | 10/2009 |
| JP | 2009538006 A | 10/2009 |
| JP | 2011010183 A | 1/2011 |
| JP | 2011130496 | 6/2011 |
| JP | 2011176581 | 9/2011 |
| KR | 20030011128 A | 2/2003 |
| KR | 20060030713 A | 4/2006 |
| TW | 439027 | 6/2001 |
| WO | 199525313 | 9/1995 |
| WO | 9709756 A2 | 3/1997 |
| WO | 1999023560 | 5/1999 |
| WO | 199961985 | 12/1999 |
| WO | 0019693 A1 | 4/2000 |
| WO | 2000019693 A1 | 4/2000 |
| WO | 0110125 A1 | 2/2001 |
| WO | 200153994 | 7/2001 |
| WO | 02073851 | 9/2002 |
| WO | 03096741 A2 | 11/2003 |
| WO | 2003093950 A2 | 11/2003 |
| WO | 2005013047 A2 | 2/2005 |
| WO | 2007023120 A1 | 3/2007 |
| WO | 2007127485 | 11/2007 |
| WO | 2007131555 | 11/2007 |
| WO | 2007135581 A2 | 11/2007 |
| WO | 2008046530 A2 | 4/2008 |
| WO | 2008082350 A1 | 7/2008 |
| WO | 2008114389 A1 | 9/2008 |
| WO | 2012050927 | 4/2012 |
| WO | 2012137190 A1 | 10/2012 |
| WO | 2013012582 | 1/2013 |
| WO | 2014004182 | 1/2014 |
| WO | 2014149533 A2 | 9/2014 |
| WO | 2015024881 A1 | 2/2015 |

OTHER PUBLICATIONS

*Sonos, Inc. v. D&M Holdings Inc. et al.*, Complaint for Patent Infringement, filed Oct. 21, 2014, 20 pages.
*Sonos, Inc. v. D&M Holdings Inc. et al.*, Defendant's Amended Invalidity Contentions, filed Sep. 14, 2016, 100 pages.
*Sonos, Inc. v. D&M Holdings Inc. et al.*, Defendant's Initial Invalidity Contentions, filed Apr. 15, 2016, 97 pages.
*Sonos, Inc. v. D&M Holdings Inc. et al.*, Defendant's Preliminary Identification of Indefinite Terms, provided Jul. 29, 2016, 8 pages.
*Sonos, Inc. v. D&M Holdings Inc. et al.*, Defendants' Amended Answer, Defenses, and Counterclaims for Patent Infringement, filed Nov. 30, 2015, 47 pages.
*Sonos, Inc. v. D&M Holdings Inc. et al.*, Defendants' Answer to Plaintiff's Second Amended Complaint, filed Apr. 30, 2015, 19 pages.
*Sonos, Inc. v. D&M Holdings Inc. et al.*, Defendants' First Amended Answer to Plaintiffs' Third Amended Complaint, filed Sep. 7, 2016, 23 pages.
*Sonos, Inc. v. D&M Holdings Inc. et al.*, Defendants' Reply in Support of Partial Motion for Judgment on the Pleadings, filed Jun. 10, 2016, 15 pages.
*Sonos, Inc. v. D&M Holdings Inc. et al.*, Exhibit A: Defendants' First Amended Answer to Plaintiffs' Third Amended Complaint, provided Aug. 1, 2016, 26 pages.
*Sonos, Inc. v. D&M Holdings Inc. et al.*, Exhibit A: Defendants' Second Amended Answer to Plaintiffs' Third Amended Complaint, filed Sep. 9, 2016, 43 pages.
*Sonos, Inc. v. D&M Holdings Inc. et al.*, Exhibit A: Defendants' Second Amended Answer to Plaintiffs' Third Amended Complaint, provided. Sep. 9, 2016, 88 pages.
*Sonos, Inc. v. D&M Holdings Inc. et al.*, First Amended Complaint for Patent Infringement, filed Dec. 17, 2014, 26 pages.
*Sonos, Inc. v. D&M Holdings Inc. et al.*, Joint Claim Construction Chart, vol. 1 of 3 with Exhibits A-O, filed Aug. 17, 2016, 30 pages.
*Sonos, Inc. v. D&M Holdings Inc. et al.*, Opening Brief in Support of Defendants' Partial Motion for Judgment on the Pleadings for Lack of Patent-Eligible Subject Matter, filed May 6, 2016, 27 pages.
*Sonos, Inc. v. D&M Holdings Inc. et al.*, Plaintiff Sonos, Inc.'s Response in Opposition to Defendants' Partial Motion for Judgment on the Pleadings, filed May 27, 2016, 24 pages.
*Sonos, Inc. v. D&M Holdings Inc. et al.*, Second Amended Complaint for Patent Infringement, filed Feb. 27, 2015, 49 pages.
*Sonos, Inc. v. D&M Holdings Inc. et al.*, Sonos's Motion to Strike Defendants' New Amended Answer Submitted with their Reply Brief, provided Sep. 15, 2016, 10 pages.
*Sonos, Inc. v. D&M Holdings Inc. et al.*, Sonos's Opposition to Defendants' Motion for Leave to Amend their Answer to Add the Defense of Inequitable Conduct, provided Oct. 31, 2016, 26 pages.
*Sonos, Inc. v. D&M Holdings Inc. et al.*, Third Amended Complaint for Patent Infringement, filed Jan. 29, 2016, 47 pages.
*Sonos, Inc. v. D&M Holdings, Inc.*, Defendants' Final Invalidity Contentions (Jan. 18, 2017) (106 pages).
*Sonos, Inc. v. D&M Holdings*, DI 226, Opinion Denying Inequitable Conduct Defenses, Feb. 6, 2017, updated, 5 pages.
*Sonos, Inc. v. D&M Holdings*, DI 242, US District Judge Andrews 101 Opinion, Mar. 13, 2017, 16 pages.
*Sonos, Inc. v D&M Holdings*, Sonos Supp Opening Markman Brief including Exhibits, Mar. 3, 2017, 17 pages.
*Sonos, Inc. v. D&M Holdings*, Sonos Supp Reply Markman Brief including Exhibits, Mar. 29, 2017, 36 pages.
*Sonos, Inc. v. D&M Holdings Inc. et al.*, Declaration of Steven C. Visser, executed Sep. 9, 2016, 40 pages.
*Sonos, Inc. v. D&M Holdings Inc. et al.*, Defendants Amended Invalidity Contentions Exhibit 1: Defendants' Invalidity Contentions for U.S. Pat. No. 7,571,014 filed Sep. 16, 2016, 270 pages.
*Sonos, Inc. v. D&M Holdings Inc. et al.*, Defendants Amended Invalidity Contentions Exhibit 10: Defendants' Invalidity Contentions for U.S. Pat. No. 9,219,959 filed Sep. 27, 2016, 236 pages.
*Sonos, Inc. v. D&M Holdings Inc. et al.*, Defendants Amended Invalidity Contentions Exhibit 11: Defendants' Invalidity Contentions for U.S. Pat. No. D. 559,197 filed Sep. 27, 2016, 52 pages.
*Sonos, Inc. v. D&M Holdings Inc. et al.*, Defendant's Amended Invalidity Contentions Exhibit 2: Defendants' Invalidity Contentions for U.S. Pat. No. 8,588,949 filed Sep. 27, 2016, 224 pages.
*Sonos, Inc. v. D&M Holdings Inc. et al.*, Defendant's Amended Invalidity Contentions Exhibit 3: Defendants' Invalidity Contentions for U.S. Pat. No. 8,843,224 filed Sep. 27, 2016, 147 pages.
*Sonos, Inc. v. D&M Holdings Inc. et al.*, Defendant's Amended Invalidity Contentions Exhibit 4: Defendants' Invalidity Contentions for U.S. Pat. No. 8,938,312 filed Sep. 27, 2016, 229 pages.
*Sonos, Inc. v. D&M Holdings Inc. et al.*, Defendant's Amended Invalidity Contentions Exhibit 5: Defendants' Invalidity Contentions for U.S. Pat. No. 8,938,637 filed Sep. 27, 2016, 213 pages.
*Sonos, Inc. v. D&M Holdings Inc. et al.*, Defendant's Amended Invalidity Contentions Exhibit 6: Defendants' Invalidity Contentions for U.S. Pat. No. 9,042,556 filed Sep. 27, 2016, 162 pages.
*Sonos, Inc. v. D&M Holdings Inc. et al.*, Defendant's Amended Invalidity Contentions Exhibit 7: Defendants' Invalidity Contentions for U.S. Pat. No. 9,195,258 filed Sep. 27, 2016, 418 pages.
*Sonos, Inc. v. D&M Holdings Inc. et al.*, Defendant's Amended Invalidity Contentions Exhibit 8: Defendants' Invalidity Contentions for U.S. Pat. No. 9,202,509 filed Sep. 27, 2016, 331 pages.
*Sonos, Inc. v. D&M Holdings Inc. et al.*, Defendant's Amended Invalidity Contentions Exhibit 9: Defendants' Invalidity Contentions for U.S. Pat. No. 9,213,357 filed Sep. 27, 2016, 251 pages.

(56) References Cited

OTHER PUBLICATIONS

*Sonos, Inc.* v. *D&M Holdings Inc. et al.*, Defendant's Initial Invalidity Contentions Exhibit 1: Defendants' Invalidity Contentions for U.S. Pat. No. 7,571,014 filed Apr. 15, 2016, 161 pages.
*Sonos, Inc.* v. *D&M Holdings Inc. et al.*, Defendant's Initial Invalidity Contentions Exhibit 10: Defendants' Invalidity Contentions for U.S. Pat. No. 9,213,357 filed Apr. 15, 2016, 244 pages.
*Sonos, Inc.* v. *D&M Holdings Inc. et al.*, Defendant's Initial Invalidity Contentions Exhibit 11: Defendants' Invalidity Contentions for U.S. Pat. No. 9,219,959 filed Apr. 15, 2016, 172 pages.
*Sonos, Inc.* v. *D&M Holdings Inc. et al.*, Defendant's Initial Invalidity Contentions Exhibit 12: Defendants' Invalidity Contentions for U.S. Pat. No. D. 559,197 filed Apr. 15, 2016, 36 pages.
*Sonos, Inc.* v. *D&M Holdings Inc. et al.*, Defendant's Initial Invalidity Contentions Exhibit 2: Defendants' Invalidity Contentions for U.S. Pat. No. 8,588,949 filed Apr. 15, 2016, 112 pages.
*Sonos, Inc.* v. *D&M Holdings Inc. et al.*, Defendant's Initial Invalidity Contentions Exhibit 3: Defendants' Invalidity Contentions for U.S. Pat. No. 8,843,224 filed Apr. 15, 2016, 118 pages.
*Sonos, Inc.* v. *D&M Holdings Inc. et al.*, Defendant's Initial Invalidity Contentions Exhibit 4: Defendants' Invalidity Contentions for U.S. Pat. No. 8,938,312 filed Apr. 15, 2016, 217 pages.
*Sonos, Inc.* v. *D&M Holdings Inc. et al.*, Defendant's Initial Invalidity Contentions Exhibit 5: Defendants' Invalidity Contentions for U.S. Pat. No. 8,938,637 filed Apr. 15, 2016, 177 pages.
*Sonos, Inc.* v. *D&M Holdings Inc. et al.*, Defendant's Initial Invalidity Contentions Exhibit 6: Defendants' Invalidity Contentions for U.S. Pat. No. 9,042,556 filed Apr. 15, 2016, 86 pages.
*Sonos, Inc.* v. *D&M Holdings Inc. et al.*, Defendant's Initial Invalidity Contentions Exhibit 7: Defendants' Invalidity Contentions for U.S. Pat. No. 9,130,771 filed Apr. 15, 2016, 203 pages.
*Sonos, Inc.* v. *D&M Holdings Inc. et al.*, Defendant's Initial Invalidity Contentions Exhibit 8: Defendants' Invalidity Contentions for U.S. Pat. No. 9,195,258 filed Apr. 15, 2016, 400 pages.
*Sonos, Inc.* v. *D&M Holdings Inc. et al.*, Defendant's Initial Invalidity Contentions Exhibit 9: Defendants' Invalidity Contentions for U.S. Pat. No. 9,202,509 filed Apr. 15, 2016, 163 pages.
*Sonos, Inc.* v. *D&M Holdings Inc. et al.*, Defendant's Preliminary Identification of Prior Art References, provided Jul. 29, 2016, 5 pages.
*Sonos, Inc.* v. *D&M Holdings Inc. et al.*, Defendants' Brief in Support of their Motion for Leave to Amend their Answer to Add the Defense of Inequitable Conduct, provided Oct. 12, 2016, 24 pages.
Final Office Action dated Jul. 1, 2016, issued in connection with U.S. Appl. No. 13/458,558, filed Apr. 27, 2012, 11 pages.
Final Office Action dated Jul. 2, 2015, issued in connection with U.S. Appl. No. 13/458,558, filed Apr. 27, 2012, 11 pages.
Final Office Action dated Aug. 3, 2015, issued in connection with U.S. Appl. No. 13/848,921, filed Mar. 22, 2013, 13 pages.
Final Office Action dated Dec. 3, 2014, issued in connection with U.S. Appl. No. 14/184,528, filed Feb. 19, 2014, 12 pages.
Final Office Action dated Jul. 3, 2012, issued in connection with U.S. Appl. No. 13/298,090, filed Nov. 16, 2011, 46 pages.
Final Office Action dated Jun. 3, 2016, issued in connection with U.S. Appl. No. 13/705,176, filed Dec. 5, 2012, 24 pages.
Final Office Action dated Mar. 3, 2015, issued in connection with U.S. Appl. No. 13/864,251, filed Apr. 17, 2013, 13 pages.
Final Office Action dated Mar. 4, 2015, issued in connection with U.S. Appl. No. 13/848,904, filed Mar. 22, 2013, 16 pages.
Final Office Action dated May 5, 2015, issued in connection with U.S. Appl. No. 13/888,203, filed May 6, 2013, 13 pages.
Final Office Action dated Jan. 7, 2015, issued in connection with U.S. Appl. No. 13/848,932, filed Mar. 22, 2013, 14 pages.
Final Office Action dated Mar. 9, 2015, issued in connection with U.S. Appl. No. 14/516,867, filed Oct. 17, 2014, 14 pages.
Final Office Action dated Aug. 10, 2015, issued in connection with U.S. Appl. No. 14/290,493, filed May 29, 2014, 26 pages.
Final Office Action dated Feb. 10, 2014, issued in connection with U.S. Appl. No. 13/013,740, filed Jan. 25, 2011, 13 pages.
Final Office Action dated Apr. 11, 2013, issued in connection with U.S. Appl. No. 13/864,247, filed Apr. 17, 2013, 15 pages.
Final Office Action dated Feb. 11, 2015, issued in connection with U.S. Appl. No. 14/184,526, filed Feb. 19, 2014, 13 pages.
Final Office Action dated Feb. 11, 2015, issued in connection with U.S. Appl. No. 14/184,935, filed Feb. 20, 2014, 17 pages.
Final Office Action dated Feb. 12, 2015, issued in connection with U.S. Appl. No. 14/184,522, filed Feb. 19, 2014, 20 pages.
Final Office Action dated Apr. 13, 2017, issued in connection with U.S. Appl. No. 14/563,515, filed Dec. 8, 2014, 13 pages.
Final Office Action dated Dec. 13, 2016, issued in connection with U.S. Appl. No. 14/629,937, filed Feb. 24, 2015, 14 pages.
Final Office Action dated Oct. 13, 2011, issued in connection with U.S. Appl. No. 11/853,790, filed Sep. 11, 2007, 10 pages.
Final Office Action dated Oct. 13, 2011, issued in connection with U.S. Appl. No. 12/035,112, filed Feb. 21, 2008, 10 pages.
Final Office Action dated Jul. 15, 2015, issued in connection with U.S. Appl. No. 14/504,812, filed Oct. 2, 2014, 18 pages.
Final Office Action dated Jun. 15, 2015, issued in connection with U.S. Appl. No. 14/184,522, filed Feb. 19, 2014, 25 pages.
Final Office Action dated Dec. 17, 2014, issued in connection with U.S. Appl. No. 13/533,105, filed Jun. 26, 2012, 36 pages.
Final Office Action dated Oct. 19, 2016, issued in connection with U.S. Appl. No. 13/848,921, filed Mar. 22, 2013, 14 pages.
Final Office Action dated Jan. 21, 2010, issued in connection with U.S. Appl. No. 11/906,702, filed Oct. 2, 2007, 27 pages.
Final Office Action dated Oct. 22, 2014, issued in connection with U.S. Appl. No. 14/186,850, filed Feb. 21, 2014, 12 pages.
Final Office Action dated Oct. 23, 2014, issued in conection with U.S. Appl. No. 13/705,176, filed Dec. 5, 2012, 23 pages.
Final Office Action dated Feb. 24, 2016, issued in connection with U.S. Appl. No. 13/871,795, filed Apr. 26, 2013, 28 pages.
Final Office Action dated May 25, 2016, issued in connection with U.S. Appl. No. 14/290,493, filed May 29, 2014, 33 pages.
Final Office Action dated Apr. 28, 2015, issued in connection with U.S. Appl. No. 14/186,850, filed Feb. 21, 2014, 20 pages.
Final Office Action dated Jun. 29, 2015, issued in connection with U.S. Appl. No. 14/465,457, filed Aug. 21, 2014, 13 pages.
Final Office Action dated Nov. 30, 2015, issued in connection with U.S. Appl. No. 13/871,795, filed Apr. 26, 2013, 26 pages.
Final Office Action dated Apr. 6, 2017, issued in connection with U.S. Appl. No. 14/620,937, filed Feb. 12, 2015, 15 pages.
Fireball DVD and Music Manager DVDM-100 Installation and User's Guide, Copyright 2003, 185 pages.
Fireball MP-200 User's Manual, Copyright 2006, 93 pages.
Fireball Remote Control Guide WD006-1-1, Copyright 2003, 19 pages.
Fireball SE-D1 User's Manual, Copyright 2005, 90 pages.
First Action Interview Office Action Summary dated Apr. 15, 2015, issued in connection with U.S. Appl. No. 14/505,027, filed Oct. 2, 2014, 6 pages.
Fober et al., "Clock Skew Compensation over a High Latency Network," Proceedings of the ICMC, 2002, pp. 548-552.
Fries et al. "The MP3 and Internet Audio Handbook: Your Guide to the Digital Music Revolution." 2000, 320 pages.
Fulton et al., "The Network Audio System: Make Your Application Sing (As Well As Dance)!" The X Resource, 1994, 14 pages.
Gaston et al., "Methods for Sharing Stereo and Multichannel Recordings Among Planetariums," Audio Engineering Society Convention Paper 7474, 2008, 15 pages.
General Event Notification Architecture Base: Client to Arbiter (Apr. 2000) (23 pages).
Hans et al., "Interacting with Audio Streams for Entertainment and Communication," Proceedings of the Eleventh ACM International Conference on Multimedia, ACM, 2003, 7 pages.
Herre et al., "The Reference Model Architecture for MPEG Spatial Audio Coding," Audio Engineering Society Convention Paper (Presented at the 118th Convention), May 28-31, 2005, 13 pages.
Home Networking with Universal Plug and Play, IEEE Communications Magazine, vol. 39 No. 12 (Dec. 2001) (D+M_0402025-40) (16 pages).
"Home Theater Control Systems," Cinema Source, 2002, 19 pages.

(56) References Cited

OTHER PUBLICATIONS

Horwitz, Jeremy, "Logic3 i-Station25," retrieved from the internet: http://www.ilounge.com/index.php/reviews/entry/logic3-i-station25/, last visited Dec. 17, 2013, 5 pages.
Huang C.M., et al., "A Synchronization Infrastructure for Multicast Multimedia at the Presentation Layer," IEEE Transactions on Consumer Electronics, 1997, pp. 370-380, vol. 43, No. 3.
Notice of Allowance dated Sep. 10, 2014, issued in connection with U.S. Appl. No. 13/892,230, filed May 10, 2013, 5 pages.
Notice of Allowance dated Apr. 11, 2016, issued in connection with U.S. Appl. No. 13/864,247, filed Apr. 17, 2013, 21 pages.
Notice of Allowance dated Jan. 11, 2016, issued in connection with U.S. Appl. No. 14/564,544, filed Dec. 9, 2014, 5 pages.
Notice of Allowance dated Jul. 11, 2017, issued in connection with U.S. Appl. No. 14/825,961, filed Aug. 13, 2015, 5 pages.
Notice of Allowance dated Aug. 12, 2015, issued in connection with U.S. Appl. No. 13/435,739, filed Mar. 30, 2012, 27 pages.
Notice of Allowance dated Jun. 12, 2014, issued in connection with U.S. Appl. No. 13/896,829, filed May 17, 2013, 5 pages.
Notice of Allowance dated Jul. 13, 2015, issued in connection with U.S. Appl. No. 14/184,526, filed Feb. 19, 2014, 22 pages.
Notice of Allowance dated May 13, 2015, issued in connection with U.S. Appl. No. 14/299,847, filed Jun. 9, 2014, 10 pages.
Notice of Allowance dated Nov. 13, 2013, issued in connection with U.S. Appl. No. 13/724,048, filed Dec. 21, 2012, 7 pages.
Notice of Allowance dated Oct. 13, 2015, issued in connection with U.S. Appl. No. 13/864,251, filed Apr. 17, 2013, 7 pages.
Notice of Allowance dated Jun. 14, 2012, issued in connection with U.S. Appl. No. 12/035,112, filed Feb. 21, 2008, 9 pages.
Notice of Allowance dated Jul. 15, 2015, issued in connection with U.S. Appl. No. 13/705,174, filed Dec. 5, 2012, 18 pages.
Notice of Allowance dated Mar. 15, 2016, issued in connection with U.S. Appl. No. 14/937,571, filed Nov. 10, 2015, 5 pages.
Notice of Allowance dated Jun. 16, 2009, issued in connection with U.S. Appl. No. 10/861,653, filed Jun. 5, 2004, 11 pages.
Notice of Allowance dated May 16, 2017, issued in connection with U.S. Appl. No. 15/228,685, filed Aug. 4, 2016, 10 pages.
Notice of Allowance dated Jul. 17, 2015, issued in connection with U.S. Appl. No. 13/864,251, filed Apr. 17, 2013, 20 pages.
Notice of Allowance dated Aug. 19, 2016, issued in connection with U.S. Appl. No. 14/619,813, filed Feb. 11, 2015, 9 pages.
Notice of Allowance dated May 19, 2015, issued in connection with U.S. Appl. No. 13/907,666, filed May 31, 2013, 7 pages.
Notice of Allowance dated Oct. 19, 2016, issued in connection with U.S. Appl. No. 14/290,493, filed May 29, 2014, 14 pages.
Notice of Allowance dated Jan. 20, 2016, issued in connection with U.S. Appl. No. 14/465,457, filed Aug. 21, 2014, 10 pages.
Notice of Allowance dated Oct. 21, 2015, issued in connection with U.S. Appl. No. 14/174,244, filed Feb. 6, 2014, 5 pages.
Notice of Allowance dated Oct. 21, 2015, issued in connection with U.S. Appl. No. 14/174,253, filed Feb. 6, 2014, 6 pages.
Notice of Allowance dated Sep. 21, 2015, issued in connection with U.S. Appl. No. 13/297,000, filed Nov. 15, 2011, 11 pages.
Notice of Allowance dated Jan. 22, 2015, issued in connection with U.S. Appl. No. 13/630,565, filed Sep. 28, 2012, 7 pages.
Notice of Allowance dated Sep. 22, 2015, issued in connection with U.S. Appl. No. 13/888,203, filed May 6, 2013, 7 pages.
Notice of Allowance dated May 24, 2017, issued in connection with U.S. Appl. No. 14/806,070, filed Jul. 22, 2015, 5 pages.
Notice of Allowance dated Oct. 24, 2016, issued in connection with U.S. Appl. No. 15/134,761, filed Apr. 21, 2016, 7 pages.
Notice of Allowance dated Oct. 24, 2016, issued in connection with U.S. Appl. No. 15/134,767, filed Apr. 21, 2016, 7 pages.
Notice of Allowance dated Sep. 24, 2015, issued in connection with U.S. Appl. No. 13/705,174, filed Dec. 5, 2012, 7 pages.
Notice of Allowance dated Sep. 24, 2015, issued in connection with U.S. Appl. No. 14/184,935, filed Feb. 20, 2014, 7 pages.
Notice of Allowance dated Sep. 25, 2014, issued in connection with U.S. Appl. No. 14/176,808, filed Feb. 10, 2014, 5 pages.
Notice of Allowance dated Aug. 27, 2015, issued in connection with U.S. Appl. No. 13/705,177, filed Dec. 5, 2012, 34 pages.
Notice of Allowance dated Aug. 27, 2015, issued in connection with U.S. Appl. No. 14/505,027, filed Oct. 2, 2014, 18 pages.
Notice of Allowance dated Dec. 27, 2011, issued in connection with U.S. Appl. No. 10/816,217, filed Apr. 1, 2004, 15 pages.
Notice of Allowance dated Oct. 27, 2015, issued in connection with U.S. Appl. No. 14/299,847, filed Jun. 9, 2014, 5 pages.
Notice of Allowance dated Oct. 28, 2014, issued in connection withU.S. Appl. No. 13/896,037, filed May 16, 2013, 7 pages.
Notice of Allowance dated Jul. 29, 2015, issued in connection with U.S. Appl. No. 13/359,976, filed Jan. 27, 2012, 28 pages.
Notice of Allowance dated Jul. 29, 2015, issued in connection with U.S. Appl. No. 14/186,850, filed Feb. 21, 2014, 9 pages.
Notice of Allowance dated Aug. 30, 2016, issued in connection with U.S. Appl. No. 14/290,493, filed May 29, 2014, 7 pages.
Notice of Allowance dated Jul. 30, 2015, issued in connection with U.S. Appl. No. 13/705,178, filed Dec. 5, 2012, 18 pages.
Notice of Allowance dated Aug. 5, 2015, issued in connection with U.S. Appl. No. 13/435,776, filed Mar. 30, 2012, 26 pages.
Notice of Allowance dated Jul. 6, 2015, issued in connection with U.S. Appl. No. 13/297,000, filed Nov. 15, 2011, 24 pages.
Notice of Allowance dated Apr. 7, 2017, issued in connection with U.S. Appl. No. 14/629,937, filed Feb. 24, 2015, 8 pages.
Notice of Incomplete Re-Exam Request dated May 25, 2017, issued in connection with U.S. Appl. No. 90/013,959, filed Apr. 1, 2016, 10 pages.
Notice of Intent to Issue Re-Examination Certificate dated Mar. 24, 2017, issued in connection with U.S. Appl. No. 90/013,859, filed Nov. 4, 2016, 10 pages.
Nutzel et al., "Sharing Systems for Future HiFi Systems," IEEE, 2004, 9 pages.
Palm, Inc., "Handbook for the Palm VII Handheld," May 2000, 311 pages.
Parasound Zpre2 Zone Preamplifier with PTZI Remote Control, 2005, 16 pages.
Park et al., "Group Synchronization in MultiCast Media Communications," Proceedings of the 5th Research on Multicast Technology Workshop, 2003, 5 pages.
Pillai et al., "A Method to Improve the Robustness of MPEG Video Applications over Wireless Networks," Kent Ridge Digital Labs, 2000, 15 pages.
Non-Final Office Action dated Jun. 4, 2015, issued in connection with U.S. Appl. No. 13/871,795, filed Apr. 26, 2013, 16 pages.
Non-Final Office Action dated Mar. 4, 2015, issued in connection with U.S. Appl. No. 13/435,776, filed Mar. 30, 2012, 16 pages.
Non-Final Office Action dated Oct. 4, 2016, issued in connection with U.S. Appl. No. 15/089,758, filed Apr. 4, 2016, 9 pages.
Non-Final Office Action dated Oct. 5, 2016, issued in connection with U.S. Appl. No. 13/864,250, filed Apr. 17, 2013, 10 pages.
Non-Final Office Action dated Oct. 5, 2016, issued in connection with U.S. Appl. No. 13/864,252, filed Apr. 17, 2013, 11 pages.
Non-Final Office Action dated Oct. 6, 2016, issued in connection with U.S. Appl. No. 15/088,678, filed Apr. 1, 2016, 9 pages.
Non-Final Office Action dated Jul. 7, 2015, issued in connection with U.S. Appl. No. 14/174,244, filed Feb. 6, 2014, 9 pages.
Non-Final Office Action dated Oct. 7, 2016, issued in connection with U.S. Appl. No. 15/156,392, filed May 17, 2016, 8 pages.
Non-Final Office Action dated Mar. 8, 2011, issued in connection with U.S. Appl. No. 11/853,790, filed Sep. 11, 2007, 10 pages.
Non-Final Office Action dated Mar. 8, 2013, issued in connection with U.S. Appl. No. 13/848,921, filed Mar. 22, 2013, 13 pages.
Non-Final Office Action dated Aug. 9, 2016, issued in connection with U.S. Appl. No. 13/871,795, filed Apr. 26, 2013, 31 pages.
Non-Final Office Action dated May 9, 2014, issued in connection with U.S. Appl. No. 13/892,230, filed May 10, 2013, 10 pages.
Non-Final Office Action dated Feb. 10, 2016, issued in connection with U.S. Appl. No. 14/937,571, filed Nov. 10, 2015, 9 pages.
Non-Final Office Action dated Mar. 10, 2011, issued in connection with U.S. Appl. No. 12/035,112, filed Feb. 21, 2008, 12 pages.
Non-Final Office Action dated May 10, 2016, issued in connection with U.S. Appl. No. 14/504,812, filed Oct. 2, 2014, 22 pages.

(56) References Cited

OTHER PUBLICATIONS

Non-Final Office Action dated Nov. 10, 2016, issued in connection with U.S. Appl. No. 15/243,355, filed Aug. 22, 2016, 11 pages.
Non-Final Office Action dated Dec. 12, 2016, issued in connection with U.S. Appl. No. 15/343,019, filed Nov. 3, 2016, 8 pages.
Non-Final Office Action dated Jun. 12, 2015, issued in connection with U.S. Appl. No. 13/848,932, filed Mar. 22, 2013, 16 pages.
Non-Final Office Action dated Mar. 12, 2015, issued in connection with U.S. Appl. No. 13/705,174, filed Dec. 5, 2012, 13 pages.
Non-Final Office Action dated Oct. 12, 2016, issued in connection with U.S. Appl. No. 14/505,966, filed Oct. 3, 2014, 10 pages.
Non-Final Office Action dated Feb. 13, 2014, issued in connection with U.S. Appl. No. 13/896,037, filed May 16, 2013, 10 pages.
Non-Final Office Action dated Feb. 13, 2015, issued in connection with U.S. Appl. No. 13/013,740, filed Jan. 25, 2011, 14 pages.
Non-Final Office Action dated Jan. 13, 2016, issued in connection with U.S. Appl. No. 14/184,528, filed Feb. 19, 2014, 14 pages.
Non-Final Office Action dated Jun. 13, 2016, issued in connection with U.S. Appl. No. 14/620,937, filed Feb. 12, 2015, 12 pages.
Non-Final Office Action dated Jun. 13, 2016, issued in connection with U.S. Appl. No. 15/134,761, filed Apr. 21, 2016, 10 pages.
Non-Final Office Action dated Mar. 13, 2015, issued in connection with U.S. Appl. No. 13/705,177, filed Dec. 5, 2012, 15 pages.
Non-Final Office Action dated Dec. 15, 2016, issued in connection with U.S. Appl. No. 13/458,558, filed Apr. 27, 2012, 12 pages.
Non-Final Office Action dated Jul. 15, 2015, issued in connection with U.S. Appl. No. 14/174,253, filed Feb. 6, 2014, 9 pages.
Non-Final Office Action dated Nov. 16, 2016, issued in connection with U.S. Appl. No. 15/228,639, filed Aug. 4, 2016, 15 pages.
Non-Final Office Action dated Dec. 17, 2015, issued in connection with U.S. Appl. No. 13/458,558, filed Apr. 27, 2012, 10 pages.
Non-Final Office Action dated Nov. 17, 2014, issued in connection with U.S. Appl. No. 13/864,247, filed Apr. 17, 2013, 11 pages.
Non-Final Office Action dated Nov. 17, 2016, issued in connection with U.S. Appl. No. 14/620,937, filed Feb. 12, 2015, 14 pages.
Non-Final Office Action dated Feb. 18, 2009, issued in connection with U.S. Appl. No. 10/861,653, filed Jun. 5, 2004, 18 pages.
Non-Final Office Action dated Nov. 18, 2014, issued in connection with U.S. Appl. No. 13/435,739, filed Mar. 30, 2012, 10 pages.
Non-Final Office Action dated Jun. 19, 2015, issued in connection with U.S. Appl. No. 13/533,105, filed Jun. 26, 2012, 38 pages.
Non-Final Office Action dated Nov. 19, 2014, issued in connection with U.S. Appl. No. 13/848,921, filed Mar. 22, 2013, 9 pages.
Non-Final Office Action dated Aug. 20, 2009, issued in connection with U.S. Appl. No. 11/906,702, filed Oct. 2, 2007, 27 pages.
Non-Final Office Action dated Oct. 20, 2016, issued in connection with U.S. Appl. No. 14/563,515, filed Dec. 8, 2014, 10 pages.
Non-Final Office Action dated Sep. 21, 2016, issued in connection with U.S. Appl. No. 15/080,591, filed Mar. 25, 2016, 9 pages.
Non-Final Office Action dated Sep. 21, 2016, issued in connection with U.S. Appl. No. 15/080,716, filed Mar. 25, 2016, 8 pages.
Non-Final Office Action dated Sep. 21, 2016, issued in connection with U.S. Appl. No. 15/088,283, filed Apr. 1, 2016, 9 pages.
Non-Final Office Action dated Sep. 21, 2016, issued in connection with U.S. Appl. No. 15/088,532, filed Apr. 1, 2016, 9 pages.
Non-Final Office Action dated Dec. 22, 2014, issued in connection with U.S. Appl. No. 13/458,558, filed Apr. 27, 2012, 11 pages.
Non-Final Office Action dated Sep. 22, 2016, issued in connection with U.S. Appl. No. 15/088,906, filed Apr. 1, 2016, 9 pages.
Non-Final Office Action dated Sep. 22, 2016, issued in connection with U.S. Appl. No. 15/155,149, filed May 16, 2016, 7 pages.
Non-Final Office Action dated Jun. 23, 2015, issued in connection with U.S. Appl. No. 13/705,176, filed Dec. 5, 2012, 30 pages.
Non-Final Office Action dated Mar. 23, 2015, issued in connection with U.S. Appl. No. 14/299,847, filed Jun. 9, 2014, 14 pages.
Non-Final Office Action dated Oct. 23, 2014, issued in connection with U.S. Appl. No. 13/848,904, filed Mar. 22, 2013, 11 pages.
Non-Final Office Action dated Oct. 23, 2014, issued in connection with U.S. Appl. No. 13/864,251, filed Apr. 17, 2013, 11 pages.
Non-Final Office Action dated Oct. 23, 2014, issued in connection with U.S. Appl. No. 13/888,203, filed May 6, 2013, 9 pages.
Liu et al., "Adaptive Delay Concealment for Internet Voice Applications with Packet-Based Time-Scale Modification," Information Technologies 2000, pp. 91-102.
Louderback, Jim, "Affordable Audio Receiver Furnishes Homes With MP3," TechTV Vault. Jun. 28, 2000 retrieved Jul. 10, 2014, 2 pages.
Maniactools, "Identify Duplicate Files by Sound," Sep. 28, 2010, http://www.maniactools.com/soft/music-duplicate-remover/identify-duplicate-files-by-sound.shtml.
MediaRenderer:1 Device Template Version 1.01 for UPnP, Version 1.0 (Jun. 25, 2002) (12 pages).
MediaServer:1 Device Template Version 1.01 for UPnP, Version 1.0 (Jun. 25, 2002) (12 pages).
Microsoft, Universal Plug and Play (UPnP) Client Support ("Microsoft UPnP") (Aug. 2001) (D+M_0402007-24) (18 pages).
Microsoft Window's XP Reviewer's Guide (Aug. 2001) (D+M_0402225-85) (61 pages).
"Microsoft Windows XP File and Printer Share with Microsoft Windows" Microsoft Windows XP Technical Article, 2003, 65 pages.
Mills David L., "Network Time Protocol (Version 3) Specification, Implementation and Analysis," Network Working Group, Mar. 1992, 7 pages.
Mills, David L., "Precision Synchronization of Computer Network Clocks," ACM SIGCOMM Computer Communication Review, 1994, pp. 28-43, vol. 24, No. 2.
"Model MRC44 Four Zone—Four Source Audio/Video Controller/Amplifier System," Xantech Corporation, 2002, 52 pages.
Motorola, "Simplefi, Wireless Digital Audio Receiver, Installation and User Guide," Dec. 31, 2001, 111 pages.
"SMPTE Made Simple: A Time Code Tutor by Timeline," 1996, 46 pages.
Network Time Protocol (NTP), RFC 1305 (Mar. 1992) (D+M_0397417-536) (120 pages).
"NexSys Software v.3 Manual," Crest Audio, Inc., 1997, 76 pages.
Niederst, Jennifer "O'Reilly Web Design in a Nutshell," Second Edition, Sep. 2001, 678 pages.
Nilsson, M., "ID3 Tag Version 2," Mar. 26, 1998, 28 pages.
Non-Final Office Action dated May 1, 2014, issued in connection with U.S. Appl. No. 14/184,522, filed Feb. 19, 2014, 31 pages.
Non-Final Office Action dated Dec. 5, 2013, issued in connection with U.S. Appl. No. 13/827,653, filed Mar. 14, 2013, 28 pages.
Non-Final Office Action dated Jan. 5, 2012, issued in connection with U.S. Appl. No. 13/298,090, filed Nov. 16, 2011, 40 pages.
Non-Final Office Action dated May 6, 2014, issued in connection with U.S. Appl. No. 13/705,176, filed Dec. 5, 2012, 23 pages.
Non-Final Office Action dated Jan. 7, 2014, issued in connection with U.S. Appl. No. 13/896,829, filed May 17, 2013, 11 pages.
Non-Final Office Action dated Sep. 7, 2016, issued in connection with U.S. Appl. No. 13/864,248, filed Apr. 17, 2013, 12 pages.
Non-final Office Action dated Apr. 10, 2013, issued in connection with U.S. Appl. No. 13/619,237, filed Sep. 14, 2012, 10 pages.
Non-Final Office Action dated Feb. 10, 2014, issued in connection with U.S. Appl. No. 13/083,499, filed Apr. 8, 2011, 12 pages.
Non-Final Office Action dated May 12, 2014, issued in connection with U.S. Appl. No. 14/184,528, filed Feb. 19, 2014, 23 pages.
Non-Final Office Action dated May 14, 2014, issued in connection with U.S. Appl. No. 13/848,932, filed Mar. 22, 2013, 14 pages.
Non-Final Office Action dated Jun. 17, 2014, issued in connection with U.S. Appl. No. 14/176,808, filed Feb. 10, 2014, 6 pages.
Non-Final Office Action dated Dec. 18, 2013, issued in connection with U.S. Appl. No. 13/907,666, filed May 31, 2013, 12 pages.
Non-Final Office Action dated Jan. 18, 2008, issued in connection with U.S. Appl. No. 10/816,217, filed Apr. 1, 2004, 38 pages.
Non-Final Office Action dated Apr. 19, 2010, issued in connection with U.S. Appl. No. 11/801,468, filed May 9, 2007, 16 pages.
Non-Final Office Action dated Mar. 19, 2013, issued in connection with U.S. Appl. No. 13/724,048, filed Dec. 21, 2012, 9 pages.
Non-Final Office Action dated Jun. 21, 2011, issued in connection with U.S. Appl. No. 10/816,217, filed Apr. 1, 2004, 13 pages.

(56) References Cited

OTHER PUBLICATIONS

Non-Final Office Action dated Jan. 22, 2009, issued in connection with U.S. Appl. No. 10/816,217, filed Apr. 1, 2004, 18 pages.
Non-Final Office Action dated Jul. 23, 2014, issued in connection with U.S. Appl. No. 14/256,434, filed Apr. 18, 2014, 12 pages.
Non-Final Office Action dated Jul. 25, 2014, issued in connection with U.S. Appl. No. 14/184,526, filed Feb. 19, 2014, 9 pages.
Non-Final Office Action dated Jul. 25, 2014, issued in connection with U.S. Appl. No. 14/184,935, filed Feb. 20, 2014, 11 pages.
Non-Final Office Action dated Jun. 25, 2010, issued in connection with U.S. Appl. No. 10/816,217, filed Apr. 1, 2004, 17 pages.
Non-Final Office Action dated Nov. 25, 2013, issued in connection with U.S. Appl. No. 13/533,105, filed Jun. 26, 2012, 19 pages.
Non-Final Office Action dated May 27, 2014, issued in connection with U.S. Appl. No. 14/186,850, filed Feb. 21, 2014, 13 pages.
Non-Final Office Action dated Feb. 29, 2012, issued in connection with U.S. Appl. No. 13/297,000, filed Nov. 15, 2011, 10 pages.
Non-Final Office Action dated Nov. 29, 2010, issued in connection with U.S. Appl. No. 11/801,468, filed May 9, 2007, 17 pages.
Non-Final Office Action dated Jul. 30, 2013 issued in connection with U.S. Appl. No. 13/724,048, filed Dec. 21, 2012, 7 pages.
Non-Final Office Action dated Jul. 31, 2014, issued in connection with U.S. Appl. No. 13/533,105, filed Jun. 26, 2012, 31 pages.
Non-Final Office Action dated Dec. 1, 2014, issued in connection with U.S. Appl. No. 14/516,867, filed Oct. 17, 2014, 11 pages.
Non-Final Office Action dated Jun. 1, 2016, issued in connection with U.S. Appl. No. 14/184,522, filed Feb. 19, 2014, 21 pages.
Non-Final Office Action dated Jan. 3, 2017, issued in connection with U.S. Appl. No. 14/808,397, filed Jul. 24, 2015, 11 pages.
Non-Final Office Action dated Jun. 3, 2015, issued in connection with U.S. Appl. No. 14/564,544, filed Dec. 9, 2014, 7 pages.
Non-Final Office Action dated Nov. 3, 2016, issued in connection with U.S. Appl. No. 14/184,528, filed Feb. 19, 2014, 17 pages.
Non-Final Office Action dated Jan. 4, 2017, issued in connection with U.S. Appl. No. 14/825,961, filed Aug. 13, 2015, 11 pages.
Non-Final Office Action dated Sep. 23, 2014, issued in connection with U.S. Appl. No. 13/630,565, filed Sep. 28, 2012, 7 pages.
Non-Final Office Action dated Feb. 24, 2017, issued in connection with U.S. Appl. No. 14/619,813, filed Feb. 11, 2015, 9 pages.
Non-Final Office Action dated May 24, 2016, issued in connection with U.S. Appl. No. 15/134,767, filed Apr. 21, 2016, 12 pages.
Non-final Office Action dated Oct. 24, 2014, issued in connection with U.S. Appl. No. 13/435,776, filed Mar. 30, 2012, 14 pages.
Non-Final Office Action dated Feb. 26, 2015, issued in connection with U.S. Appl. No. 14/186,850, filed Feb. 21, 2014, 25 pages.
Non-Final Office Action dated Mar. 26, 2015, issued in connection with U.S. Appl. No. 14/184,528, filed Feb. 19, 2014, 18 pages.
Non-Final Office Action dated Jan. 27, 2015, issued in connection with U.S. Appl. No. 14/465,457, filed Apr. 21, 2014, 11 pages.
Non-Final Office Action dated Jun. 27, 2008, issued in connection with U.S. Appl. No. 10/861,653, filed Jun. 5, 2004, 19 pages.
Non-Final Office Action dated Mar. 27, 2015, issued in connection with U.S. Appl. No. 13/705,178, filed Dec. 5, 2012, 14 pages.
Non-Final Office Action dated Sep. 27, 2013,issued in connection with U.S. Appl. No. 13/013,740, filed Jan. 25, 2011, 12 pages.
Non-Final Office Action dated Sep. 27, 2016, issued in connection with U.S. Appl. No. 15/228,685, filed Aug. 4, 2016, 8 pages.
Non-Final Office Action dated Dec. 28, 2015, issued in connection with U.S. Appl. No. 14/290,493, filed May 29, 2014, 29 pages.
Non-Final Office Action dated Dec. 28, 2016, issued in connection with U.S. Appl. No. 15/343,000, filed Nov. 3, 2016, 11 pages.
Non-Final Office Action dated Jan. 29, 2016, issued in connection with U.S. Appl. No. 14/937,523, filed Nov. 10, 2015, 10 pages.
Non-Final Office Action dated Jun. 29, 2016, issued in connection with U.S. Appl. No. 14/629,937, filed Feb. 24, 2015, 12 pages.
Non-Final Office Action dated Apr. 30, 2012, issued in connection with U.S. Appl. No. 13/204,511, filed Aug. 5, 2011, 16 pages.
Non-Final Office Action dated Jan. 30, 2015, issued in connection with U.S. Appl. No. 14/504,812, filed Oct. 2, 2014, 13 pages.
Non-Final Office Action dated Jan. 30, 2015, issued in connection with U.S. Appl. No. 14/290,493, filed May 29, 2014, 29 pages.
Non-Final Office Action dated Nov. 30, 2016, issued in connection with U.S. Appl. No. 15/243,186, filed Aug. 22, 2016, 12 pages.
Non-Final Office Action dated Sep. 30, 2016, issued in connection with U.S. Appl. No. 13/864,249, filed Apr. 17, 2013, 12 pages.
Non-Final Office Action dated Oct. 31, 2016, issued in connection with U.S. Appl. No. 14/806,070, filed Jul. 22, 2015, 11 pages.
North American MPEG-2 Information, "The MPEG-2 Transport Stream," Retrieved from the Internet: URL: http://www.coolstf.com/mpeg/#ts, 2006, pp. 1-5.
Notice of Allowability dated Apr. 18, 2013, issued in connection with U.S. Appl. No. 11/853,790, filed Sep. 11, 2007, 4 pages.
Notice of Allowance dated Jan. 31, 2013, issued in connection with U.S. Appl. No. 13/298,090, filed Nov. 16, 2011, 19 pages.
Notice of Allowance dated Dec. 1, 2016, issued in connection with U.S. Appl. No. 15/088,283, filed Apr. 1, 2016, 9 pages.
Notice of Allowance dated Jun. 1, 2017, issued in connection with U.S. Appl. No. 14/808,397, filed Jul. 24, 2015, 5 pages.
Notice of Allowance dated Dec. 2, 2016, issued in connection with U.S. Appl. No. 15/088,532, filed Apr. 1, 2016, 9 pages.
Notice of Allowance dated Dec. 2, 2016, issued in connection with U.S. Appl. No. 15/088,678, filed Apr. 1, 2016, 9 pages.
Notice of Allowance dated Dec. 2, 2016, issued in connection with U.S. Appl. No. 15/089,758, filed Apr. 4, 2016, 9 pages.
Notice of Allowance dated Dec. 2, 2016, issued in connection with U.S. Appl. No. 15/155,149, filed May 16, 2016, 9 pages.
Notice of Allowance dated Jul. 2, 2015, issued in connection with U.S. Appl. No. 13/848,904, filed Mar. 22, 2013, 17 pages.
Notice of Allowance dated Jul. 2, 2015, issued in connection with U.S. Appl. No. 13/888,203, filed May 6, 2013, 19 pages.
Notice of Allowance dated Jul. 2, 2015, issued in connection with U.S. Appl. No. 14/184,935, filed Feb. 20, 2014, 23 pages.
Notice of Allowance dated Jun. 2, 2014, issued in connection with U.S. Appl. No. 13/083,499, filed Apr. 8, 2011, 5 pages.
Notice of Allowance dated Sep. 3, 2015, issued in connection with U.S. Appl. No. 13/705,174, filed Dec. 5, 2012, 4 pages.
Notice of Allowance dated Aug. 4, 2015, issued in connection with U.S. Appl. No. 14/516,867, filed Oct. 17, 2014, 13 pages.
Notice of Allowance dated Dec. 5, 2014, issued in connection with U.S. Appl. No. 14/256,434, filed Apr. 18, 2014, 7 pages.
Notice of Allowance dated Oct. 5, 2012, issued in connection with U.S. Appl. No. 13/204,511, filed Aug. 5, 2011, 11 pages.
Notice of Allowance dated Mar. 6, 2014, issued in connection with U.S. Appl. No. 13/827,653, filed Mar. 14, 2013, 17 pages.
Notice of Allowance dated May 6, 2011, issued in connection with U.S. Appl. No. 11/801,468, filed May 9, 2007, 10 pages.
Notice of Allowance dated Sep. 6, 2013, issued in connection with U.S. Appl. No. 13/619,237, filed Sep. 14, 2012, 10 pages.
Notice of Allowance dated Sep. 6, 2016, issued in connection with U.S. Appl. No. 15/134,767, filed Apr. 21, 2016, 7 pages.
Notice of Allowance dated Apr. 7, 2016, issued in connection with U.S. Appl. No. 13/533,105, filed Jun. 26, 2012, 40 pages.
Notice of Allowance dated Oct. 7, 2015, issued in connection with U.S. Appl. No. 14/184,526, filed Feb. 19, 2014, 7 pages.
Notice of Allowance dated Oct. 9, 2015, issued in connection with U.S. Appl. No. 13/435,739, filed Mar. 30, 2012, 4 pages.
Notice of Allowance dated Sep. 9, 2016, issued in connection with U.S. Appl. No. 15/134761, filed Apr. 21, 2016, 7 pages.
Notice of Allowance dated Aug. 10, 2015, issued in connection with U.S. Appl. No. 13/848,904, filed Mar. 22, 2013, 9 pages.
Notice of Allowance dated Jul. 10, 2015, issued in connection with U.S. Appl. No. 13/013,740, filed Jan. 25, 2011, 7 pages.
Notice of Allowance dated Mar. 10, 2016, issued in connection with U.S. Appl. No. 14/937,523, filed Nov. 10, 2015, 5 pages.
Notice of Allowance dated Nov. 10, 2011, issued in connection with U.S. Appl. No. 11/906,702, filed Oct. 2, 2007, 17 pages.
IBM Home Director Installation and Service Manual, Copyright1998, 124 pages.
IBM Home Director Owner's Manual, Copyright 1999, 67 pages.
ID3 tag version 2.4.0—Native Frames, Draft Specification, copyright 2000, 41 pages.

(56) References Cited

OTHER PUBLICATIONS

*Implicit, LLC* v. *Sonos, Inc.*, Defendant's Original Complaint (Mar. 3, 2017) (15 pages).
Integra Audio Network Receiver NAC 2.3 Instruction Manual, 68 pages.
Integra Audio Network Server NAS 2.3 Instruction Manual, pp. 1-32.
Integra Service Manual, Audio Network Receiver Model NAC-2.3, Dec. 2002, 44 pages.
Intel Designing a UPnP AV Media Renderer, v. 1.0 ("Intel AV Media Renderer") (May 20, 2003) (SONDM000115117-62) (46 pages).
Intel Media Renderer Device Interface ("Intel Media Renderer") (Sep. 6, 2002) (62 pages).
Intel SDK for UPnP Devices Programming Guide, Version 1.2.1, (Nov. 2002) (30 pages).
International Bureau, International Preliminary Report on Patentability dated Jan. 8, 2015, issued in connection with International Application No. PCT/US2013/046372, filed on Jun. 18, 2013, 6 pages.
International Bureau, International Preliminary Report on Patentability, dated Jan. 8, 2015, issued in connection with International Application No. PCT/US2013/046386, filed on Jun. 18, 2013, 8 pages.
International Bureau, International Preliminary Report on Patentability, dated Oct. 17, 2013, issued in connection with International Application No. PCT/IB2012/052071, filed on Apr. 26, 2012, 7 pages.
International Bureau, International Preliminary Report on Patentability dated Jan. 30, 2014, issued in connection with International Application No. PCT/US2012/045894, filed on Jul. 9, 2012, 6 pages.
International Searching Authority, International Search Report dated Aug. 1, 2008, in connection with International Application No. PCT/US2004/023102, 5 pages.
International Searching Authority, International Search Report dated Aug. 23, 2012, issued in connection with International Application No. PCT/IB2012/052071, filed on Apr. 26, 2012, 3 pages.
International Searching Authority, International Search Report dated Aug. 26, 2013, issued in connection with International Application No. PCT/US2013/046372, filed on Jun. 18, 2013, 3 pages.
International Searching Authority, International Search Report dated Dec. 26, 2012, issued in connection with International Application No. PCT/US2012/045894, filed on Jul. 9, 2012, 3 pages.
International Searching Authority, International Search Report dated Sep. 30, 2013, issued in connection with International Application No. PCT/US2013/046386, filed on Jun. 18, 2013, 3 pages.
International Searching Authority, Written Opinion dated Aug. 23, 2012, issued in connection with International Application No. PCT/IB2012/052071, filed on Apr. 26, 2012, 6 pages.
International Searching Authority, Written Opinion dated Aug. 26, 2013, issued in connection with International Application No. PCT/US2013/046372, filed on Jun. 18, 2013, 4 pages.
International Searching Authority, Written Opinion dated Dec. 26, 2012, issued in connection with International Application No. PCT/US2012/045894, filed on Jul. 9, 2012, 4 pages.
International Searching Authority, Written Opinion dated Sep. 30, 2013, issued in connection with International Application No. PCT/US2013/046386, filed on Jun. 18, 2013, 6 pages.
Ishibashi et al., "A Comparison of Media Synchronization Quality Among Reactive Control Schemes," IEEE Infocom, 2001, pp. 77-84.
Ishibashi et al., "A Group Synchronization Mechanism for Live Media in Multicast Communications," IEEE Global Telecommunications Conference, 1997, pp. 746-752, vol. 2.
Ishibashi et al., "A Group Synchronization Mechanism for Stored Media in Multicast Communications," IEEE Information Revolution and Communications, 1997, pp. 692-700, vol. 2.
Issues with Mixed IEEE 802.b/802.11g Networks, AVAGO0058, Agere Systems, Feb. 2004, 5 pages.

Japanese Patent Office, Decision of Rejection dated Jul. 8, 2014, issued in connection with Japanese Patent Application No. 2012-178711, 3 pages.
Japanese Patent Office, Notice of Rejection, dated Feb. 3, 2015, issued in connection with Japanese Patent Application No. 2014-521648, 7 pages.
Japanese Patent Office, Notice of Rejection dated Sep. 15, 2015, issued in connection with Japanese Patent Application No. 2014-220704, 7 pages.
Japanese Patent Office, Office Action dated Nov. 1, 2016, issued in connection with Japanese Application No. 2015-238682, 7 pages.
Japanese Patent Office, Office Action dated Jan. 6, 2015, issued in connection with Japanese Patent Application No. 2014-503273, 5 pages.
Japanese Patent Office, Office Action dated May 24, 2016, issued in connection with Japanese Patent Application No. 2014-220704, 7 pages.
Japanese Patent Office, Office Action dated Mar. 29, 2016, issued in connection with Japanese Patent Application No. JP2015-520288, 12 pages.
Japanese Patent Office, Office Action Summary dated Feb. 2, 2016, issued in connection with Japanese Patent Application No. 2015-520286, 6 pages.
Japanese Patent Office, Office Action Summary dated Sep. 8, 2015, issued in connection with Japanese Patent Application No. 2014-503273, 4 pages.
Japanese Patent Office, Office Action Summary dated Nov. 19, 2013, issued in connection with Japanese Patent Application No. 2012-178711, 5 pages.
Jo et al., "Synchronized One-to-many Media Streaming with Adaptive Playout Control," Proceedings of SPIE, 2002, pp. 71-82, vol. 4861.
Jones, Stephen, "Dell Digital Audio Receiver: Digital upgrade for your analog stereo," Analog Stereo, Jun. 24, 2000 retrieved Jun. 18, 2014, 2 pages.
Kou et al., "RenderingControl:1 Service Template Verion 1.01," Contributing Members of the UPnP Forum, Jun. 25, 2002, 63 pages.
Lake Processors: Lake® LM Series Digital Audio Processors Operation Manual, 2011, 71 pages.
Levergood et al., "AudioFile: A Network-Transparent System for Distributed Audio Applications," Digital Equipment Corporation, 1993, 109 pages.
LG: RJP-201M Remote Jack Pack Installation and Setup Guide, 2010, 24 pages.
Lienhart et al., "On the Importance of Exact Synchronization for Distributed Audio Signal Processing," Session L: Poster Session II—ICASSP'03 Papers, 2002, 1 page.
LinkSys by Cisco, Wireless Home Audio Controller, Wireless-N Touchscreen Remote DMRW1000 Datasheet, Copyright 2008, 2 pages.
LinkSys by Cisco, Wireless Home Audio Controller, Wireless-N Touchscreen Remote DMRW1000 User Guide, Copyright 2008, 64 pages.
LinkSys by Cisco, Wireless Home Audio Player, Wireless-N Music Extender DMP100 Quick Installation Guide, Copyright 2009, 32 pages.
LinkSys by Cisco, Wireless Home Audio Player, Wireless-N Music Extender DMP100 User Guide, Copyright 2008, 65 pages.
Linux SDK for UPnP Devices v. 1.2 (Sep. 6, 2002) (101 pages).
Liu et al., "A synchronization control scheme for real-time streaming multimedia applications," Packet Video, 2003, 10 pages, vol. 2003.
WANCommonInterfaceConfig:1 Service Template Version 1.01 for UPnP, Ver. 1.0 (Nov. 12, 2001) (D+M_0401820-43) (24 pages).
WANIPConnection:1 Service Template Version 1.01 for UPnP Ver. 1.0 (Nov. 12, 2001) (D+M_0401844-917) (74 pages).
WANPPPConnection:1 Service Template Version 1.01 for UPnP, Version 1.0 (Nov. 12, 2001) (D+M_0401918-2006) (89 pages).
WaveLan High-Speed Multimode Chip Set, AVAGO0003, Agere Systems, Feb. 2003, 4 pages.
WaveLan High-Speed Multimode Chip Set, AVAGO0005, Agere Systems, Feb. 2003, 4 pages.

(56) References Cited

OTHER PUBLICATIONS

WaveLAN Wireless Integration Developer Kit (WI-DK) for Access Point Developers, AVAGO0054, Agere Systems, Jul. 2003, 2 pages.
WaveLAN Wireless Integration-Developer Kit (WI-DK) Hardware Control Function (HCF), AVAGO0052, Agere Systems, Jul. 2003, 2 pages.
"Welcome. You're watching Apple TV." Apple TV 1st Generation Setup Guide, Apr. 8, 2008 Retrieved Oct. 14, 2014, 40 pages.
"Welcome. You're watching Apple TV." Apple TV 2nd Generation Setup Guide, Mar. 10, 2011 Retrieved Oct. 16, 2014, 36 pages.
"Welcome. You're watching Apple TV." Apple TV 3rd Generation Setup Guide, Mar. 16, 2012 Retrieved Oct. 16, 2014, 36 pages.
WI-DK Release 2 WaveLan Embedded Drivers for VxWorks and Linux, AVAGO0056, Agere Systems, Jul. 2003, 2 pages.
WI-DK Release 2 WaveLan END Reference Driver for VxWorks, AVAGO0044, Agere Systems, Jul. 2003, 4 pages.
WI-DK Release 2 WaveLan LKM Reference Drivers for Linux, AVAGO0048, Agere Systems, Jul. 2003, 4 pages.
Windows Media Connect Device Compatibility Specification (Apr. 12, 2004) (16 pages).
WPA Reauthentication Rates, AVAGO0063, Agere Systems, Feb. 2004, 3 pages.
Yamaha DME 32 manual: copyright 2001.
Yamaha DME 64 Owner's Manual; copyright 2004, 80 pages.
Yamaha DME Designer 3.5 setup manual guide; copyright 2004, 16 pages.
Yamaha DME Designer 3.5 User Manual; Copyright 2004, 507 pages.
Yamaha DME Designer software manual: Copyright 2004, 482 pages.
"Symantec pcAnywhere User's Guide," v 10.5.1, 1995-2002, 154 pages.
"Systemline Modular Installation Guide, Multiroom System," Systemline, 2003, pp. 1-22.
"ZR-8630AV MultiZone AudioNideo Receiver, Installation and Operation Guide," Niles Audio Corporation, 2003, 86 pages.
ZX135: Installation Manual,LA Audio, Apr. 2003, 44 pages.
UPnP; "Universal Plug and Play Device Architecture," Jun. 8, 2000; version 1.0; Microsoft Corporation; pp. 1-54.
U.S. Appl. No. 13/083,499, filed Apr. 8, 2011, "Multi-Channel Pairing in a Media System."
Final Office Action dated Jun. 30, 2008, issued in connection with U.S. Appl. No. 10/816,217, filed Apr. 1, 2004, 30 pages.
Final Office Action dated Jan. 28, 2011, issued in connection with U.S. Appl. No. 10/816,217, filed Apr. 1, 2004, 21 pages.
Final Office Action dated Mar. 27, 2014, issued in connection with U.S. Appl. No. 13/533,105, filed Jun. 26, 2012, 29 pages.
Final Office Action dated Jul. 23, 2014, issued in connection with U.S. Appl. No. 13/896,037, filed May 16, 2013, 12 pages.
Final Office Action dated Oct. 21, 2011, issued in connection with U.S. Appl. No. 10/816,217, filed Apr. 1, 2004, 19 pages.
Final Office Action dated Nov. 18, 2015, issued in connection with U.S. Appl. No. 13/533,105, filed Jun. 26, 2012, 56 pages.
Final Office Action dated Sep. 13, 2012, issued in connection with U.S. Appl. No. 13/297,000, filed Nov. 15, 2011, 17 pages.
Final Office Action dated Jul. 13, 2009, issued in connection with U.S. Appl. No. 10/816,217, filed Apr. 1, 2004, 16 pages.
Final Office Action dated Jun. 5, 2014, issued in connection with U.S. Appl. No. 13/907,666, filed May 31, 2013, 12 pages.
File History of Re-Examination U.S. Appl. No. 90/013,423.
Faller, Christof, "Coding of Spatial Audio Compatible with Different Playback Formats," Audio Engineering Society Convention Paper (Presented at the 117th Convention), Oct. 28-31, 2004, 12 pages.
European Patent Office, Examination Report dated Oct. 24, 2016, issued in connection with European Patent Application No. 13808623.6, 4 pages.
European Patent Office, Extended European Search Report dated Jul. 5, 2016, issued in connection with European Patent Application No. 16156940.5, 7 pages.

Falcone, John, "Sonos BU150 Digital Music System review," CNET, CNET [online] Jul. 27, 2009 [retrieved on Mar. 16, 2016], 11 pages Retrieved from the Internet: URL:http://www.cnet.com/products/sonos-bu150-digital-music-system/.
Sonos, Inc. v. D&M Holdings Inc. et al., Defendants' Opposition to Sonos's Motion to Strike Defendants' New Amended Answer Submitted with their Reply, provided Oct. 3, 2016, 15 pages.
Sonos, Inc. v. D&M Holdings Inc. et al., Exhibit A: Defendants' Second Amended Answer to Plaintiffs' Third Amended Complaint, provided Oct. 12, 2016, 43 pages.
Sonos, Inc. v. D&M Holdings Inc. et al., Exhibit B: Defendants' Second Amended Answer to Plaintiffs' Third Amended Complaint, provided Oct. 12, 2016, 43 pages.
Sonos, Inc. v. D&M Holdings Inc. et al., Opening Brief in Support of Defendants' Motion for Leave to Amend Their Answer to Add the Defense of Inequitable Conduct, provided Aug. 1, 2016, 11 pages.
Sonos, Inc. v. D&M Holdings Inc. et al., Order, provided Oct. 7, 2016, 2 pages.
Sonos, Inc. v. D&M Holdings Inc. et al., Plaintiff's Opposition to Defendants' Motion for Leave to Amend Their Answer to Add the Defense of Inequitable Conduct, provided Aug. 26, 2016, 25 pages.
Sonos, Inc. v. D&M Holdings Inc. et al., Plaintiff Sonos, Inc.'s Opening Claim Construction Brief, filed Sep. 9, 2016, 26 pages.
Sonos, Inc. v. D&M Holdings Inc. et al., Redlined Exhibit B: Defendants' First Amended Answer to Plaintiffs' Third Amended Complaint, provided Aug. 1, 2016, 27 pages.
Sonos, Inc. v. D&M Holdings Inc. et al., Reply Brief in Support of Defendants' Motion for Leave to Amend their Answer to Add the Defense of Inequitable Conduct, provided Nov. 10, 2016, 16 pages.
Sonos, Inc. v. D&M Holdings Inc. et al., Reply Brief in Support of Defendants' Motion for Leave to Amend their Answer to Add the Defense of Inequitable Conduct, provided Sep. 9, 2016, 16 pages.
Sonos, Inc. v. D&M Holdings, DI 206-1, Transcript of 101 Hearing (Nov. 28, 2016) (28 pages).
Sonos, Inc. v. D&M Holdings, DI 207, Public Joint Claim Construction Brief (Nov. 30, 2016) (88 pages).
Sonos, Inc. v. D&M Holdings, DI 214, D&M Post-Markman Letter (Dec. 22, 2016) (13 pages).
Sonos, Inc. v. D&M Holdings, DI 215, Sonos Post-Markman Letter (Dec. 22, 2016) (15 pages).
Sonos, Inc. v. D&M Holdings, DI 219, Claim Construction Opinion (Jan. 12, 2017) (24 pages).
Sonos, Inc. v. D&M Holdings, DI 221, Claim Construction Order (Jan. 18, 2017) (2 pages).
Sonos, Inc. v. D&M Holdings, Markman Hearing Transcript (Dec. 14, 2016) (69 pages).
Sonos Multi-Room Music System User Guide, Version: 091001, 2009, 299 pages.
Sonos Play:3 Product Guide; copyright 2004-2011; 2 pages.
Sonos Play:3 Product Guide; copyright 2004-2012; 14 pages.
Sonos Play:3 Product Guide; copyright 2004-2013; 15 pages.
Sonos Play:3 Teardown; https://www.ifixit.com/Teardown/Sonos+Play%3A3+Teardown/12475; 11 pages.
Sony: AIR-SA 50R Wireless Speaker, Copyright 2009, 2 pages.
Sony: Altus Quick Setup Guide ALT-SA32PC, Copyright 2009, 2 pages.
Sony: BD/DVD Home Theatre System Operating Instructions for BDV-E300, E301 and E801, Copyright 2009, 115 pages.
Sony: BD/DVD Home Theatre System Operating Instructions for BDV-IT1000/BDV-IS1000, Copyright 2008, 159 pages.
Blu-ray Disc/DVD Home Theatre System Operating Instructions for BDV-IZ1000W, Copyright 2010, 88 pages.
Sony: DVD Home Theatre System Operating Instructions for DAV-DZ380W/DZ680W/DZ880W, Copyright 2009, 136 pages.
Sony: DVD Home Theatre System Operating Instructions for DAV-DZ870W, Copyright 2008, 128 pages.
Sony Ericsson MS500 User Guide, Copyright 2009, 2 pages.
Sony: Home Theatre System Operating Instructions for HT-IS100, Copyright 2008, 168 pages.
Sony: HT-IS100, 5.1 Channel Audio System, last updated Nov. 2009, 2 pages.

(56) References Cited

OTHER PUBLICATIONS

Sony: Multi Channel AV Receiver Operating Instructions, 2007, 80 pages.
Sony: Multi Channel AV Receiver Operating Instructions for Str-DN1000, Copyright 2009, 136 pages.
Sony: STR-DN1000, Audio Video Receiver, last updated Aug. 2009, 2 pages.
Sony: Wireless Surround Kit Operating Instructions for WHAT-SA2, Copyright 2010, 56 pages.
Taylor, Marilou, "Long Island Sound," Audio Video Interiors, Apr. 2000, 8 pages.
Third Party Request for Ex Parte Re-Examination, U.S. Appl. No. 90/013,859, filed Nov. 4, 2016, 424 pages.
TOA Corporation, Digital Processor DP-0206 DACsys2000 Version 2.00 Software Instruction Manual, Copyright 2001, 67 pages.
Understanding Universal Plug and Play, Microsoft White Paper (Jun. 2000) (D+M_0402074-118) (45 pages).
United States Patent and Trademark Office, U.S. Appl. No. 60/490,768, filed Jul. 28, 2003, entitled "Method for synchronizing audio playback between multiple networked devices," 13 pages.
United States Patent and Trademark Office, U.S. Appl. No. 60/825,407, filed Sep. 12, 2006, entitled "Controlling and manipulating groupings in a multi-zone music or media system," 82 pages.
Universal Plug and Play Device Architecture V. 1.0, (Jun. 8, 2000) (54 pages).
Universal Plug and Play in Windows XP, Tom Fout. Microsoft Corporation (Jul. 2001) (D+M_0402041-73) (33 pages).
Universal Plug and Play ("UPnP") AV Architecture:1 for UPnP, Version 1.0, (Jun. 25, 2002) (D+M_0298151-72) (22 pages).
Universal Plug and Play Vendor's Implementation Guide (Jan. 5, 2000) (7 pages).
UPnP AV Architecture:0.83 (Jun. 12, 2002) (SONDM000115483-504) (22 pages).
UPnP Design by Example, A Software Developers Guide to Universal Plug and Play Michael Jeronimo and JackWeast, Intel Press (D+M_0401307-818) (Apr. 2003) (511 pages).
Polycom Conference Composer User Guide, copyright 2001, 29 pages.
Postel, J., "User Datagram Protocol," RFC: 768, USC/Information Sciences Institute, Aug. 1980, 3 pages.
Preinterview First Office Action dated Jun. 8, 2016, issued in connection with U.S. Appl. No. 14/619,813, filed Feb. 11, 2015, 4 pages.
Pre-Interview First Office Action dated Mar. 10, 2015, issued in connection with U.S. Appl. No. 14/505,027, filed Oct. 2, 2014, 4 pages.
Presentations at WinHEC 2000, May 2000, 138 pages.
Prismiq, Inc., "PRISMIQ Media Player User Guide," 2003, 44 pages.
Proficient Audio Systems M6 Quick Start Guide, 2011, 5 pages.
Proficient Audio Systems: Proficient Editor Advanced Programming Guide, 2007, 40 pages.
Programming Interface for WL54040 Dual-Band Wireless Transceiver, AVAGO0066, Agere Systems, May 2004, 16 pages.
Radio Shack, "Auto-Sensing 4-Way Audio/Video Selector Switch," 2004, 1 page.
RadioShack, Pro-2053 Scanner, 2002 Catalog, part 1, 100 pages.
RadioShack, Pro-2053 Scanner, 2002 Catalog, part 2, 100 pages.
RadioShack, Pro-2053 Scanner, 2002 Catalog, part 3, 100 pages.
RadioShack, Pro-2053 Scanner, 2002 Catalog, part 4, 100 pages.
RadioShack, Pro-2053 Scanner, 2002 Catalog, part 5, 46 pages.
Rane: DragNet software; available for sale at least 2006.
Rangan et al., "Feedback Techniques for Continuity and Synchronization in Multimedia Information Retrieval," ACM Transactions on Information Systems, 1995, pp. 145-176, vol. 13, No. 2.
Real Time Control Protocol (RTCP) and Realtime Transfer Protocol (RTP), RFC 1889 (Jan. 1996) (D+M_0397810-84) (75 pages).
Realtime Streaming Protocol (RTSP), RFC 2326 (Apr. 1998) (D+M_0397945-8036) (92 pages).
Realtime Transport Protocol (RTP), RFC 3550 (Jul. 2003) (D+M_0398235-323) (89 pages).
Re-Exam Final Office Action dated Aug. 5, 2015, issued in connection with U.S. Appl. No. 90/013,423, filed Jan. 5, 2015, 25 pages.
Reexam Non-Final Office Action dated Oct. 17, 2016, issued in connection with U.S. Appl. No. 90/013,756, filed May 25, 2016, 31 pages.
Re-Exam Non-Final Office Action dated Apr. 22, 2015, issued in connection with U.S. Appl. No. 90/013,423, filed Jan. 5, 2015, 16 pages.
Reid, Mark, "Multimedia conferencing over ISDN and IP networks using ITU-T H-series recommendations: architecture, control and coordination," Computer Networks, 1999, pp. 225-235, vol. 31.
RenderingControl:1 Service Template Version 1.01 for UPnP, Version 1.0, (Jun. 25, 2002) (SONDM000115187-249) (63 pages).
Renewed Request for Ex Parte Re-Examination, U.S. Appl. No. 90/013,959, filed Jun. 16, 2017, 126 pages.
Renkus Heinz Manual; available for sale at least 2004, 6 pages.
Request for Ex Parte Reexamination submitted in U.S. Pat. No. 9,213,357 on May 22, 2017, 85 pages.
"Residential Distributed Audio Wiring Practices," Leviton Network Solutions, 2001, 13 pages.
Ritchie et al., "MediaServer:1 Device Template Version 1.01," Contributing Members of the UPnP Forum, Jun. 25, 2002, 12 pages.
Ritchie et al., "UPnP AV Architecture:1, Version 1.0," Contributing Members of the UPnP Forum, Jun. 25, 2002, 22 pages.
Ritchie, John, "MediaRenderer:1 Device Template Version 1.01," Contributing Members of the UPnP Forum, Jun. 25, 2002, 12 pages.
Roland Corporation, "Roland announces BA-55 Portable PA System," press release, Apr. 6, 2011, 2 pages.
Rothermel et al., "An Adaptive Protocol for Synchronizing Media Streams," Institute of Parallel and Distributed High-Performance Systems (IPVR), 1997, 26 pages.
Rothermel et al., "An Adaptive Stream Synchronization Protocol," 5th International Workshop on Network and Operating System Support for Digital Audio and Video, Apr. 18-21, 1995, 12 pages.
Rothermel et al., "Clock Hierarchies—An Abstraction for Grouping and Controlling Media Streams," University of Stuttgart Institute of Parallel and Distributed High-Performance Systems, Jan. 1996, 23 pages.
Rothermel et al., "Synchronization in Joint-Viewing Environments," University of Stuttgart Institute of Parallel and Distributed High-Performance Systems, 1992, 13 pages.
Rothermel, Kurt, "State-of-the-Art and Future Research in Stream Synchronization," University of Stuttgart, 3 pages.
*Sonos, Inc.* v. *D&M Holdings*, Expert Report of Jay P. Kesan including Appendices A-P, Feb. 20, 2017, 776 pages.
"RVL-6 Modular Multi-Room Controller, Installation & Operation Guide," Nile Audio Corporations, 1999, 46 pages.
Schmandt et al., "Impromptu: Managing Networked Audio Applications for Mobile Users," 2004, 11 pages.
Schulzrinne et al., "RTP: A Transport Protocol for Real-Time Applications," Network Working Group, RFC: 3550, Standards Track, Jul. 2003, 104 pages.
Schulzrinne H., et al., "RTP: A Transport Protocol for Real-Time Applications, RFC 3550," Network Working Group, 2003, pp. 1-89.
Simple Network Time Protocol (SNTPI), RFC 1361 (Aug. 1992) (D+M_0397537-46) (10 pages).
Simple Network Time Protocol (SNTPII), RFC 1769 (Mar. 1995) (D+M_0397663-76) (14 pages).
Simple Service Discovery Protocol/1.0 Operating without an Arbiter (Oct. 28, 1999) (24 pages).
Sonos Controller for iPad Product Guide; copyright 2004-2013; 47 pages.
Sonos Digital Music System User Guide, Version: 050801, Aug. 2005, 114 pages.
*Sonos, Inc.* v *D&M Holdings*, D&M Supp Opposition Brief including Exhibits, Mar. 17, 2017, 23 pages.
Breebaart et al., "Multi-Channel Goes Mobile: MPEG Surround Binaural Rendering," AES 29th International Conference, Sep. 2-4, 2006, pp. 1-13.

(56) References Cited

OTHER PUBLICATIONS

Bretl W.E., et al., MPEG2 Tutorial [online], 2000 [retrieved on Jan. 13, 2009] Retrieved from the Internet:, pp. 1-23.
Buerk et al., "AVTransport:1 Service Template Version 1.01," Contributing Members of the UPnP Forum, Jun. 25, 2002, 67 pages.
Canadian Intellectual Property Office, Canadian Office Action dated Apr. 4, 2016, issued in connection with Canadian Patent Application No. 2,842,342, 5 pages.
Canadian Intellectual Property Office, Canadian Office Action dated Sep. 14, 2015, issued in connection with Canadian Patent Application No. 2,842,342, 2 pages.
Canadian Patent Office, Office Action dated Apr. 10, 2015, issued in connection with Canadian Patent Application No. 2,832,542, 3 pages.
Cen et al., "A Distributed Real-Time MPEG Video Audio Player," Department of Computer Science and Engineering, Oregon Graduate Institute of Science and Technology, 1995, 12 pages.
Chakrabarti et al., "A Remotely Controlled Bluetooth Enabled Environment," IEEE, 2004, pp. 77-81.
Change Notification: Agere Systems WaveLan Multimode Reference Design (D2 to D3), AVAGO0042, Agere Systems, Nov. 2004, 2 pages.
Chinese Patent Office, Office Action dated Jul. 5, 2016, issued in connection with Chinese Patent Application No. 201380044380.2, 25 pages.
Chinese Patent Office, Office Action dated Nov. 27, 2015, issued in connection with Chinese Patent Application No. 201280028038.9, 26 pages.
Connection Manager: 1 Service Template Version 1.01 for UPnP, Version 1.0 (Jun. 25, 2002) (25 pages).
ContentDirectory:1 Service Template Version 1.01 for UPnP, Version 1.0 (Jun. 25, 2002) (89 pages).
Corrected Notice of Allowance dated Mar. 12, 2015, issued in connection with U.S. Appl. No. 13/630,565, filed Sep. 28, 2012, 4 pages.
Corrected Notice of Allowance dated Aug. 19, 2015, issued in connection with U.S. Appl. No. 13/907,666, filed May 31, 2013, 2 pages.
Corrected Notice of Allowance dated Oct. 30, 2015, issued in connection with U.S. Appl. No. 13/013,740, filed Jan. 25, 2011, 2 pages.
Creative, "Connecting Bluetooth Devices with Creative D200," http://support.creative.com/kb/ShowArticle.aspx?url=http://ask.creative.com:80/SRVS/CGI-BIN/WEBCGI.EXE/,/?St=106,E=00000000000396859016,K=9377,Sxi=8, VARSET=ws:http://us.creative.com,case=63350>, available on Nov. 28, 2011, 2 pages.
Crown PIP Manual available for sale at least 2004, 68 pages.
Dannenberg et al., "A. System Supporting Flexible Distributed Real-Time Music Processing," Proceedings of the 2001 International Computer Music Conference, 2001, 4 pages.
Dannenberg, Roger B., "Remote Access to Interactive Media," Proceedings of the SPIE 1785, 1993, pp. 230-237.
Day, Rebecca, "Going Elan!" Primedia Inc., 2003, 4 pages.
Deep-Sleep Implementation in WL60011 for IEEE 802.11b Applications, AVAGO0020, Agere Systems, Jul. 2004, 22 pages.
Dell, Inc. "Dell Digital Audio Receiver: Reference Guide," Jun. 2000, 70 pages.
Dell, Inc. "Start Here," Jun. 2000, 2 pages.
"Denon 2003-2004 Product Catalog," Denon, 2003-2004, 44 pages.
Denon AV Surround Receiver AVR-1604/684 User's Manual, 2004, 128 pages.
Denon AV Surround Receiver AVR-5800 Operating Instructions, Copyright 2000, 67 pages.
Designing a UPnP AV MediaServer, Nelson Kidd (2003) (SONDM000115062-116) (55 pages).
Dorwaldt, Carl, "Ease 4.1 Tutorial," Renkus-Heinz, Inc., 2004, 417 pages.
"DP-0206 Digital Signal Processor," TOA Electronics, Inc., 2001, pp. 1-12.

Dynaudio Acoustics Air Series, http://www.soundonsound.com/sos/sep02/articles/dynaudioair.asp, 2002, 4 pages.
European Patent Office, European Extended Search Report dated Mar. 7, 2016, issued in connection with EP Application No. 13810340.3, 9 pages.
European Patent Office, European Extended Search Report dated Feb. 28, 2014, issued in connection with EP Application No. 13184747.7, 8 pages.
European Patent Office, European Extended Search Report dated Mar. 31, 2015, issued in connection with EP Application No. 14181454.1, 9 pages.
European Patent Office, European Search Report dated Jul. 5, 2016, issued in connection with European Patent Application No. 16156935.5, 9 pages.
European Patent Office, Examination Report dated Mar. 22, 2016, issued in connection with European Patent Application No. EP14181454.1, 6 pages.
"884+ Automatic Matrix Mixer Control System," Ivie Technologies, Inc., 2000, pp. 1-4.
Advanced Driver Tab User Interface WaveLan GUI Guide, AVAGO0009, Agere Systems, Feb. 2004, 4 pages.
Advisory Action dated Feb. 2, 2016, issued in connection with U.S. Appl. No. 13/848,921, filed Mar. 22, 2013, 8 pages.
Advisory Action dated Sep. 18, 2008, issued in connection with U.S. Appl. No. 10/816,217, filed Apr. 1, 2004, 8 pages.
Advisory Action dated Feb. 1, 2016, issued in connection with U.S. Appl. No. 13/864,247, filed Apr. 17, 2013, 6 pages.
Advisory Action dated Jun. 1, 2015, issued in connection with U.S. Appl. No. 14/516,867, filed Oct. 17, 2014, 11 pages.
Advisory Action dated Mar. 2, 2015, issued in connection with U.S. Appl. No. 13/848,932, filed Mar. 22, 2013, 3 pages.
Advisory Action dated Jan. 5, 2012, issued in connection with U.S. Appl. No. 12/035,112, filed Feb. 21, 2008, 3 pages.
Advisory Action dated Oct. 5, 2015, issued in connection with U.S. Appl. No. 13/458,558, filed Apr. 27, 2012, 4 pages.
Advisory Action dated Sep. 5, 2014, issued in connection with U.S. Appl. No. 13/907,666, filed May 31, 2013, 3 pages.
Advisory Action dated Oct. 6, 2016, issued in connection with U.S. Appl. No. 13/458,558, filed Apr. 27, 2012, 4 pages.
Advisory Action dated Jan. 8, 2015, issued in connection with U.S. Appl. No. 13/705,176, filed Dec. 5, 2012, 4 pages.
Advisory Action dated Jun. 9, 2016, issued in connection with U.S. Appl. No. 13/871,795, filed Apr. 25, 2013, 3 pages.
Advisory Action dated Feb. 10, 2016, issued in connection with U.S. Appl. No. 13/871,795, filed Apr. 26, 2013, 3 pages.
Advisory Action dated Nov. 12, 2014, issued in connection with U.S. Appl. No. 13/907,666, filed May 31, 2013, 6 pages.
Advisory Action dated Apr. 15, 2015, issued in connection with U.S. Appl. No. 14/184,526, filed Feb. 19, 2014, 9 pages.
Advisory Action dated Apr. 15, 2015, issued in connection with U.S. Appl. No. 14/184,935, filed Feb. 20, 2014, 9 pages.
Advisory Action dated Dec. 22, 2011, issued in connection with U.S. Appl. No. 11/853,790, filed Sep. 11, 2007, 2 pages.
Advisory Action dated Mar. 25, 2015, issued in connection with U.S. Appl. No. 13/533,105, filed Jun. 26, 2012, 5 pages.
Advisory Action dated Feb. 26, 2015, issued in connection with U.S. Appl. No. 14/184,528, filed Feb. 19, 2014, 3 pages.
Advisory Action dated Nov. 26, 2014, issued in connection with U.S. Appl. No. 14/186,850, filed Feb. 21, 2014, 9 pages.
Advisory Action dated Jul. 28, 2015, issued in connection with U.S. Appl. No. 14/184,522, filed Feb. 19, 2014, 7 pages.
Advisory Action dated Sep. 28, 2009, issued in connection with U.S. Appl. No. 10/816,217, filed Apr. 1, 2004, 4 pages.
Agere Systems' Voice-over-Wireless LAN (VoWLAN) Station Quality of Service, AVAGO0015, Agere Systems, Jan. 2005, 5 pages.
Akyildiz et al., "Multimedia Group Synchronization Protocols for Integrated Services Networks," IEEE Journal on Selected Areas in Communications, 1996 pp. 162-173, vol. 14, No. 1.
Anonymous, "Information technology—Generic coding of moving pictures and associated audio information—Part 3: Audio," ISO/IEC 13818-3, Apr. 1998, pp. 11.
Anonymous, "Transmission Control Protocol," RFC: 793, USC/Information Sciences Institute, Sep. 1981, 91 pages.

(56) References Cited

OTHER PUBLICATIONS

Audio Authority: How to Install and Use the Model 1154 Signal Sensing Auto Selector, 2002, 4 pages.
Audio Authority: Model 1154B High Definition AV Auto Selector, 2008, 8 pages.
AudioSource: AMP 100 User Manual, 2003, 4 pages.
AudioTron Quick Start Guide, Version 1.0, Mar. 2001, 24 pages.
AudioTron Reference Manual, Version 3.0, May 2002, 70 pages.
AudioTron Setup Guide, Version 3.0, May 2002, 38 pages.
Automatic Profile Hunting Functional Description, AVAGO0013, Agere Systems, Feb. 2004, 2 pages.
"AV Surround Receiver AVR-5800," Denon Electronics, 2000, 2 pages.
"A/V System Controleer, Owner's Manual," B&K Compontents, Ltd., 1998, 52 pages.
AVTransport:1 Service Template Version 1.01 for UPnP, Version 1.0 (Jun. 25, 2002) (66 pages).
Axis Communication: AXIS P8221 Network I/O Audio Module, 2009, 41 pages.
Baldwin, Roberto. "How-To: Setup iTunes DJ on Your Max and iPhone", available at http://www.maclife.com/article/howtos/howto_setup_itunes_dj_your_mac_and_iphone, archived on Mar. 17, 2009, 4 pages.
Balfanz et al., "Network-in-a-Box: How to Set Up a Secure Wireless Network in Under a Minute," 13th USENIX Security Symposium—Technical Paper, 2002, 23 pages.
Balfanz et al., "Talking to Strangers: Authentication in Ad-Hoc Wireless Networks," Xerox Palo Alto Research Center, 2002, 13 pages.
Barham et al., "Wide Area Audio Synchronisation," University of Cambridge Computer Laboratory, 1995, 5 pages.
Baudisch et al., "Flat Volume Control: Improving Usability by Hiding the Volume Control Hierarchy in the User Interface," 2004, 8 pages.
Benslimane Abderrahim, "A Multimedia Synchronization Protocol for Multicast Groups," Proceedings of the 26th Euromicro Conference, 2000, pp. 456-463, vol. 1.
Biersack et al., "Intra- and Inter-Stream Synchronization for Stored Multimedia Streams," IEEE International Conference on Multimedia Computing and Systems, 1996, pp. 372-381.
Blakowski G. et al., "A Media Synchronization Survey: Reference Model, Specification, and Case Studies," Jan. 1996, pp. 5-35, vol. 14, No. 1.
Bluetooth. "Specification of the Bluetooth System: The ad hoc SCATTERNET for affordable and highly functional wireless connectivity," Core, Version 1.0 A, Jul. 26, 1999, 1068 pages.
Bluetooth. "Specification of the Bluetooth System: Wireless connections made easy," Core, Version 1.0 B, Dec. 1, 1999, 1076 pages.
Bogen Communications, Inc., ProMatrix Digitally Matrixed Amplifier Model PM3180, Copyright1996, 2 pages.
Brassil et al., "Enhancing Internet Streaming Media with Cueing Protocols," 2000, 9 pages.
Canadian Patent Office, Canadian Office Action dated Aug. 30, 2017, issued in connection with CA Application No. 2947275, 5 pages.
Chinese Patent Office, First Office Action dated Oct. 12, 2018, issued in connection with Chinese Application No. 201610804134.8, 10 pages.
Corrected Notice of Allowance dated Dec. 6, 2017, issued in connection with U.S. Appl. No. 15/228,685, filed Aug. 4, 2016, 5 pages.
Final Office Action dated Nov. 14, 2018, issued in connection with U.S. Appl. No. 15/130,919, filed Apr. 15, 2016, 12 pages.
Final Office Action dated Dec. 7, 2017, issued in connection with U.S. Appl. No. 14/619,813, filed Feb. 11, 2015, 11 pages.
Non-Final Office Action dated Nov. 1, 2018, issued in connection with U.S. Appl. No. 16/129,758, filed Sep. 12, 2018, 23 pages.
Non-Final Office Action dated Jun. 11, 2018, issued in connection with U.S. Appl. No. 15/405,931, filed Jan. 13, 2017, 14 pages.
Non-Final Office Action dated May 14, 2018, issued in connection with U.S. Appl. No. 15/228,812, filed Aug. 4, 2016, 15 pages.
Non-Final Office Action dated Jan. 19, 2018, issued in connection with U.S. Appl. No. 14/629,937, filed Feb. 24, 2015, 14 pages.
Non-Final Office Action dated Aug. 22, 2018, issued in connection with U.S. Appl. No. 15/487,686, filed Apr. 14, 2017, 13 pages.
Non-Final Office Action dated Apr. 25, 2018, issued in connection with U.S. Appl. No. 15/130,919, filed Apr. 15, 2016, 13 pages.
Non-Final Office Action dated Oct. 30, 2018, issued in connection with U.S. Appl. No. 16/128,443, filed Sep. 11, 2018, 21 pages.
Notice of Allowance dated Mar. 1, 2018, issued in connection with U.S. Appl. No. 14/619,813, filed Feb. 11, 2015, 7 pages.
Notice of Allowance dated Sep. 10, 2018, issued in connection with U.S. Appl. No. 14/629,937, filed Feb. 24, 2015, 7 pages.
Notice of Allowance dated Nov. 13, 2017, issued in connection with U.S. Appl. No. 14/563,515, filed Dec. 8, 2014, 11 pages.
Notice of Allowance dated Aug. 25, 2017, issued in connection with U.S. Appl. No. 14/505,966, filed Oct. 3, 2014, 5 pages.
Office Action in Ex Parte Reexamination mailed on Oct. 20, 2017, issued in connection with U.S. Patent Reexaminatin Application No. 90/013,959, filed Jun. 16, 2017, 50 pages.
*Sonos, Inc.* v. *D&M Holdings Inc. et al.*, Defendants' 35 U.S.C. § 282 Notice filed Nov. 2, 2017, 31 pages.
Canadian Patent Office, Canadian Office Action dated Jan. 27, 2020, issued in connection with Canadian Application No. 3032479, 4 pages.
Chinese Patent Office, Third Office Action and Translation dated Dec. 30, 2019, issued in connection with Chinese Application No. 201610804134.8, 10 pages.
European Patent Office, European Extended Search Report dated Mar. 25, 2020, issued in connection with European Application No. 19215348.4, 10 pages.
Final Office Action dated Feb. 12, 2020, issued in connection with U.S. Appl. No. 15/130,919, filed Apr. 15, 2016, 15 pages.
Non-Final Office Action dated Mar. 11, 2020, issued in connection with U.S. Appl. No. 16/773,966, filed Jan. 27, 2020, 34 pages.
Non-Final Office Action dated Feb. 13, 2020, issued in connection with U.S. Appl. No. 16/422,160, filed May 24, 2019, 8 pages.
Non-Final Office Action dated Jan. 27, 2020, issued in connection with U.S. Appl. No. 16/383,561, filed Apr. 12, 2019, 13 pages.
Notice of Allowance dated Nov. 27, 2019, issued in connection with U.S. Appl. No. 16/128,443, filed Sep. 11, 2018, 5 pages.
*Sonos, Inc.* v. *Google LLC*, Appendix A to Respondents' Response to the Complaint and Notice of Investigation, filed Feb. 27, 2020, 2 pages.
*Sonos, Inc.* v. *Google LLC*, Appendix B to Respondents' Response to the Complaint and Notice of Investigation, filed Feb. 27, 2020, 176 pages.
*Sonos, Inc.* v. *Google LLC*, Respondents' Response to the Complaint and Notice of Investigation, filed Feb. 27, 2020, 46 pages.
Squeezebox by Logitech. Owner's Guide, 2007, 32 pages.
Squeezebox Network Music Player. Owner's Manual, Slim Devices, 2003, 22 pages.
Acoustic Research. 900MHz Wireless Stereo Speakers Model AW871 Installation and Operation Manual, 2003, 15 pages.
Acoustic Research. 900MHz Wireless Stereo Speakers Model AW871 Installation and Operation Manual, 2007, 12 pages.
Acoustic Research. Wireless Stereo Speakers with Auto-Tuning. Model AW877 Installation and Operation Manual, 2007, 13 pages.
Amazon: Philips MCW770 WiFi Wireless PC Link AM/FM 5-CD Microsystem (Discontinued by Manufacturer): Home Audio & Theater, 5 pages [online]. [retrieved on Feb. 24, 2020]. Retrieved from the Internet URL: https://www.amazon.com/gp/product/B000278KLC.
Amazon.com: CD30 c300 Wireless Network MP3 Player (Analog/Digital): Home Audio & Theater, 5 pages [produced by Google in Inv. No. 337-TA-1191 on May 6, 2020].
Amazon.com, Cisco-Linksys Wireless-B Music System WMLS11B, 5 pages [produced by Google in Inv. No. 337-TA-1191 on May 6, 2020].
Amazon.com. Creative Labs Sound Blaster Wireless Music: Electronics, 7 pages, [produced by Google in Inv. No. 337-TA-1191 on May 6, 2020].

(56) References Cited

OTHER PUBLICATIONS

Apple. Airport Express, Setup Guide. May 20, 2004, 51 pages.
Apple. Airport Express, Setup Guide. 2004, 48 pages.
Apple Developer Connection. Browsing for Network Services. Nov. 12, 2002, 5 pages.
Apple. NewsRoom, Apple "Open Sources" Rendezvous. Sep. 25, 2002, 2 pages.
Apple. NewsRoom, Apple Ships New AirPort Express with AirTunes. Jul. 14, 2004, 3 pages.
Apple. NewsRoom, Apple Unveils AirPort Express for Mac & PC Users. Jun. 7, 2004, 3 pages.
Apple. NewsRoom, Developers Rapidly Adopt Apple's Rendezvous Networking Technology, Sep. 10, 2002, 3 pages.
Apple WWDC 2003 Session 105—Rendezvous—YouTube available via https://www.youtube.com/watch?v=Ge5bsDijGWM [produced by Google in Inv. No. 337-TA-1191 on May 6, 2020].
Ashcraft et al. P4 Protocol Specification vo.2. Apr. 6, 2002, 11 pages [online]. [retrieved on Mar. 26, 2020]. Retrieved from the Internet URL: https://snarfed.org/p4protocol.
Audio Authority. Access EZ: Demonstration Network. Home Audio and Video System Installation Manual, 60 pages [produced by Google in Inv. No. 337-TA-1191 on May 6, 2020].
AudioPoint from Home Director. Play Digital Music on Your Conventional Stereo System, 2002, 2 pages.
AudioPoint, Welcome to the coolest way to listen to digital music over your conventional stereo equipment, Home Director HD00B02, 2002, 2 pages.
Barix Download Exstreamer Software. Accessed via WayBack Machine, Apr. 6, 2003. http://www.barix.com/estreamer/software.download.html. 2 pages.
Barix. Exstreamer Datasheet. Accessed via WayBack Machine, Apr. 2, 2003. http://www.barix.com/exstreamer/, 1 page.
Barret, Ryan. P4 Proposal :CS194 Project Proposal. Toward an Application-Independent Distributed Network Platform. Apr. 9, 2002, 4 pages [online]. [retrieved on Mar. 26, 2020]. Retrieved from the Internet URL: https://snarfed.org/p4proposal.
Barrett, Ryan. (no title) Blog on P4Sync network and code, 1 page [online], [retrieved on Mar. 26, 2020]. Retrieved from the Internet URL: https://snarfed.org.p4.
Beatty et al. Web Services Dynamic Discovery WS-Discovery, Feb. 2004, 35 pages.
Blau, John. News Analysis, Wi-Fi Hotspot Networks Sprout Like Mushrooms, Sep. 2002, 3 pages.
Bluetooth Specification. Advanced Audio Distribution Profile (A2DP) Specification, 2007, 73 pages.
BoomBottle MM Blue Hatch 2-Pack. Blue Hatch Waterproof Dual Pairing Wireless Speakers each with Built-in-MagicMount, 4 pages [produced by Google in Inv. No. 337-TA-1191 on May 6, 2020].
Bootcamp. Digital Music on Your Stereo System. Jan. 10, 2003, 1 page.
Bose Lifestyle SA-2 and SA-3 Stereo Amplifier Owner's Guide, 2004, 32 pages.
Bose. The Bose Lifestyle 50 System. Owner's Guide, Oct. 17, 2001, 55 pages.
Bose. The Bose Lifestyle Powered Speaker System. Owner's Guide. Dec. 20, 2001, 19 pages.
BridgeCo—Wireless Loudspeaker Product Information Version 1.4, Dec. 16, 2003, 5 pages.
BridgeCo. BridgeCo Launches UPnP-Compliant Wireless Audio Adapter: Moving More Digital Audio to More Devices in More Locations, Wirelessly. Sep. 16, 2003, 1 page.
BridgeCo. Company Overview. 1 page [produced by Google in Inv. No. 337-TA-1191 on May 6, 2020].
BridgeCo. Networked Loudspeaker Product Information, 4 pages [produced by Google in Inv. No. 337-TA-1191 on May 6, 2020].
BridgeCo. Professional Loudspeaker—Product Information, 3 pages [produced by Google in Inv. No. 337-TA-1191 on May 6, 2020].
BridgeCo. User Manual, Wireless Audio Adapter. Sep. 22, 2003, 34 pages.
BridgeCo. Vision. 1 page [produced by Google in Inv. No. 337-TA-1191 on May 6, 2020].
BridgeCo. Vision, 5 Factors, 5 Missing Functionalities. 1 page [produced by Google in Inv. No. 337-TA-1191 on May 6, 2020].
BridgeCo. Vision, 5 Key Functions. 1 page [produced by Google in Inv. No. 337-TA-1191 on May 6, 2020].
BridgeCo. Vision, BridgeCo Solution. 1 page [produced by Google in Inv. No. 337-TA-1191 on May 6, 2020].
BridgeCo. Vision, Consumer Benefits. 1 page [produced by Google in Inv. No. 337-TA-1191 on May 6, 2020].
BridgeCo. Vision, Consumer Demand. 1 page [produced by Google in Inv. No. 337-TA-1191 on May 6, 2020].
BridgeCo. Vision, ENA Applications. 1 page [produced by Google in Inv. No. 337-TA-1191 on May 6, 2020].
BridgeCo. Vision, ENA Deployment. 1 page [produced by Google in Inv. No. 337-TA-1191 on May 6, 2020].
BridgeCo. Vision, ENA Functionality. 1 page [produced by Google in Inv. No. 337-TA-1191 on May 6, 2020].
BridgeCo. Vision, ENA Market. 1 page [produced by Google in Inv. No. 337-TA-1191 on May 6, 2020].
BridgeCo. Vision, Entertainment Continuum. 1 page [produced by Google in Inv. No. 337-TA-1191 on May 6, 2020].
BridgeCo. Vision, Entertainment Network Adapter. 1 page [produced by Google in Inv. No. 337-TA-1191 on May 6, 2020].
BridgeCo. Vision, New Entertainment. 1 page [produced by Google in Inv. No. 337-TA-1191 on May 6, 2020].
BridgeCo. Vision, Technical Problems. 1 page [produced by Google in Inv. No. 337-TA-1191 on May 6, 2020].
BridgeCo. Wireless Audio Adapter, Product Information. 3 pages [produced by Google in Inv. No. 337-TA-1191 on May 6, 2020].
BridgeCo. Wireless Audio Adapter Reference Design, Product Information. Version 1.3. Oct. 31, 2003, 2 pages.
BridgeCo. Wireless Loudspeaker, Product Information. 4 pages [produced by Google in Inv. No. 337-TA-1191 on May 6, 2020].
Buffalo. Link Theater LT-H90 Media Player v1.0, 2003-2008, 38 pages.
Buffalo. LinkTheater PC-P3LWG/DVD, 59 pages [produced by Google in Inv. No. 337-TA-1191 on May 6, 2020].
Business Wire. BridgeCo Adds Wireless Connectivity and Enhances Surround Sound Processing for New Generation Speakers. May 5, 2003, 2 pages.
C200 Wireless Network MP3 Player, Jun. 4, 2003, 1 page.
Carnoy, David. Parrot DS1120 Wireless Hi-Fi Speaker System Review, Jul. 15, 2008, 4 pages.
Case et al. RFC 1157—A Simple Network Management Protocol, May 1990, 36 pages.
Cd30. Audio Control Document V4.2 Released! Sep. 18, 2003, 7 pages.
Cd30 Audio Control Protocol. Version 4.2. Sep. 18, 2003, 24 pages.
Cd30. Audio Stream Protocol Released. Mar. 9, 2004, 2 pages.
Cd30. Audio Stream Protocol: Version 18. Mar. 9, 2004, 13 pages.
Cd30 Backgrounder, 1 page [produced by Google in Inv. No. 337-TA-1191 on May 6, 2020].
Cd30. c100 Network MP3 Player. Quick Product Summary .1 page [produced by Google in Inv. No. 337-TA-1191 on May 6, 2020].
Cd30. c200 Wireless Network MP3 Player. Quick Product Summary. 1 page [produced by Google in Inv. No. 337-TA-1191 on May 6, 2020].
Cd30. c300 Extended-Range Wireless Network MP3 Player. Quick Product Summary, 1 page [produced by Google in Inv. No. 337-TA-1191 on May 6, 2020].
Cd30 C300 Reviews. Digital Audio Receivers (DARs) Reviews by CNET, Mar. 30, 2003, 3 pages.
Cd30. Careers, Nov. 21, 2003, 1 page.
Cd30. Contact, Dec. 12, 2003, 1 page.
Cd30. Corporate Fact Sheet, 1 page [produced by Google in Inv. No. 337-TA-1191 on May 6, 2020].
Cd30 FAQs. What problem or need does cd30 address with their products? 2 pages [produced by Google in Inv. No. 337-TA-1191 on May 6, 2020].
Cd30 Frequently-Asked Questions About cd30 Network MP3 Players, Dec. 12, 2003, 6 pages.

(56) References Cited

OTHER PUBLICATIONS

Cd30 Introduces Family of MP3 Players at this year's Consumer Electronics Show. Jan. 9-12, 2003 Las Vegas Convention Center, Feb. 12, 2004, 2 pages.
Cd30 Introduces Family of MP3 Players at this year's Consumer Electronics Show. Jan. 9-12, 2003 Las Vegas Convention Center, 2 pages.
Cd30 Introduces Family of Wireless Network MP3 Players. Jan. 9-12, 2003 Las Vegas Convention Center, 2 pages.
Cd30. Logo page, 1 page [produced by Google in Inv. No. 337-TA-1191 on May 6, 2020].
Cd30 Management, Dec. 12, 2003, 1 page.
Cd30. Management Team, 1 page [produced by Google in Inv. No. 337-TA-1191 on May 6, 2020].
Cd30. Multi-Player Synchronization. Jan. 15, 2004, 4 pages.
Cd30 Network MP3 Player Models, Feb. 1, 2004, 1 page.
Cd30, Network MP3 Player, Product Manual. Copyright 2003, 65 pages.
Cd30 Network MP3 Player. Product Manual for c100, c200, and c300, 2003, 65 pages.
Cd30. Network MP3 Player. Quick Installation Guide, 1 page [produced by Google in Inv. No. 337-TA-1191 on May 6, 2020].
Cd30 Network MP3 Player Reviews. Feb. 1, 2004, 2 pages.
Cd30 Network MP3 Player Specifications. Feb. 2, 2004, 2 pages.
Cd30 Network MP3 Players, Nov. 18, 2003, 1 page.
Cd30 Network MP3 Players c100, c200, and c300, 1 page [produced by Google in Inv. No. 337-TA-1191 on May 6, 2020].
Cd30 Network MP3 Players: Stream music from your PC to your stereo, Nov. 18, 2003, 1 page.
Cd30 Network MP3 Players: Stream your MP3s to your stereo! May 24, 2003, 1 page.
Cd30. News, Reviews 21 Nov. 21, 2003, 2 pages.
Cd30. Product Support. May 10, 2006, 17 pages.
Cd30 Product Support Forums. Forum Index, Apr. 15, 2003, 1 page.
Cd30 Product Support Forums. Forum Index, Jun. 18, 2003, 1 page.
Cd30 Product Support Forums. Forum Index, Feb. 2, 2004, 1 page.
Cd30. Product Support Forums. Multiple stereos—multiple cd30s—same music? Nov. 3, 2003, 2 pages.
MediaLounge Entertainment Network D-Link DSM-320 Wireless Media Player Manual v 1.0, 59 pages [produced by Google in Inv. No. 337-TA-1191 on May 6, 2020].
Microsoft Windows XP Student Edition Complete. University of Salford. Custom Guide Learn on Demand, 2004, 369 pages.
Micro-Star International. 865PE Neo2. MS-6728 v1.X ATX Mainboard. Version 1.1. Apr. 2003, 118 pages.
Miller II, Stanley. Technology gets simpler and smarter. JSOnline Milwaukee Journal Sentinel, Jan. 13, 2003, 3 pages.
Model MRC88 Eight Zone—Eight Source Audio/Video Controller/Amplifier System, Xantech Corporation, 2003, 102 pages.
Moses, B., Home Networking Using IEEE 1394 in Combination with Other Networking Technologies. Audio Delivery. The Changing Home Experience—AES 17 UK Conference 2002, 16 pages.
Muherim et al. On the Performance of Clock Synchronization Algorithms for a Distributed Commodity Audio System. Audio Engineering Society Convention Paper presented at 114th Convention Mar. 22-25, 2003, 12 pages.
Multi-Zone Control Systems. ZR-8630AV MultiZone Receiver. Niles. http://www.ampersandcom.com/zr8630av.html accessed Mar. 26, 2020, 5 pages.
Murph, Darren. Rocketfish Wireless Whole Home Audio System Cuts the Cord on All Your Speakers. Engadget. Oct. 23, 2009, 9 pages.
Musica 5000 Series. Multi-Room Audio System, NetStreams, 2005, 7 pages.
Musica MU4602. Audio Distribution System. Data Sheet, 2004, 2 pages.
Musica MUR2E Network Interface. NetStreams Creating the future of home entertainment—today, 2004, 2 pages.
Musica MUR2EM Network Interface. NetStreams The IP Based Distributed Entertainment Company, 2005, 2 pages.
MusicCAST. Interactive Wireless. Home Music Network System, 6 pages [produced by Google in Inv. No. 337-TA-1191 on May 6, 2020].
MusicCAST System—About the Quick Manual, 1999, 7 pages.
Netgear. User's Manual for the MP101 Digital Music Player, Version 1.2, May 2004, 48 pages.
NetStreams. Musica MU4602 Audio Distribution System. Data Sheet. Copyright 2004, 2 pages.
NetStreams Musica MU5066. Multi-Room Audio System. Installation and User's Guide, 2005, 44 pages.
NetStreams Musica. NS-MU4602 Audio Distribution System, Integration & Design Guide. The IP-Based Audio Distribution Company, 2004, 22 pages.
NetStreams. Panorama PAN6400 Multi-Room Video & Control System Installation Guide, Jan. 1, 2006, 64 pages.
NetStreams Product Catalog 2003-2004. Creating the Future of Home Entertainment Today 20 pages.
Network Working Group. Zeroconf Multicast Address Allocation Protocol, Internet-Draft, Oct. 22, 2002, 14 pages.
NewRoom. Sirius, XM Companies Flood Cedia with New Products, Sep. 15, 2003, 2 pages.
NewRoom. SMC Ships New EZ-Stream Universal 80211ag Wireless Router, Jan. 14, 2004, 3 pages.
NewsRoom. AP DataStream, Wall Street Journal Digest, Jan. 15, 2004, 3 pages.
NewsRoom. AP Online, AP Technology NewsBrief. Dec. 26, 2003, 2 pages.
NewsRoom. AP Online, AP Technology NewsBrief. Dec. 27, 2003, 2 pages.
NewsRoom. Belleville News Democrat, Tunes, Pictures From Computer Can Be Sent to Your TV, Stereo, Dec. 27, 2003, 2 pages.
NewsRoom. BridgeCo Successfully Concludes Second Financing Round of US $13.3 Million, Business Wire, Jan. 9, 2003, 3 pages.
NewsRoom. Business Line, Cisco arm rolls out products for SOHO. Nov. 5, 2003, 2 pages.
NewsRoom. Business Wire, BridgeCo Adds Wireless Connectivity and Enhances Surround Sound Processing for New Generation Speakers. May 5, 2003, 3 pages.
NewsRoom. Business Wire, BridgeCo Launches Entertainment Network Adapter at CES2003, Jan. 9, 2003, 3 pages.
NewsRoom. Business Wire, BridgeCo Launches Entertainment Network Adapter for Pro Audio at NAMM Show, Jan. 16, 2003, 3 pages.
NewsRoom. Business Wire, BridgeCo Opens USA Business Development HQ in Silicon Valley and Expands Management Team, Mar. 15, 2004, 3 pages.
NewsRoom. Business Wire, BridgeCo Releases Silicon and Firmware Platform Compatible with Microsoft Windows Media Connect and Windows Media DRM Technology. May 3, 2004, 3 pages.
NewsRoom. Business Wire, CSR and BridgeCo Launch Design for New Generation Wireless Speakers; Transforms Traditional Speakers into Portable Internet Radio, May 6, 2003, 3 pages.
NewsRoom. Business Wire, Epson Announces the EPSON Stylus Photo 900: The First Photo Printer Under $200 to Print Directly Onto CDs and DVDs; New Printer Offers a Complete Printing Solution for Digital Lifestyles, Apr. 16, 2003, 4 pages.
NewsRoom. Business Wire, Good Guys Unveils Top 10 Holiday Electronics Gifts; Advances in Technology and Lower Prices Across the Industry Make for Great Deals on In-Demand Products This Season, Dec. 3, 2003, 3 pages.
NewsRoom. Bytestechnology Briefing, Feb. 19, 2002, 2 pages.
NewsRoom. CEA Announces 2007 Mark of Excellence Award Winners, Mar. 10, 2007, 3 pages.
NewsRoom. CEDIA Abuzz with Trends—Integrators agree: The hot products at this year's expo are the start of a revolutionary move for the home automation market. Oct. 9, 2006, 4 pages.
NewsRoom. Chicago Sun Times, Wireless stream player hits the right notes, Jan. 17, 2004, 3 pages.
NewsRoom. Computer Shopper, Entertainment geekly: the blueprints have been drawn for a connected home that fuses the PC with entertainment devices. All you have to do is install . . . , Nov. 1, 2003, 6 pages.

(56) References Cited

OTHER PUBLICATIONS

NewsRoom. Computer Shopper, Tunes all around, vol. 23; Issue 11, Nov. 1, 2003, 1 page.
NewsRoom. Computer Shopper, What we want: here's the gear our editors are wishing for this year, vol. 23; Issue 12, Dec. 1, 2003, 8 pages.
NewsRoom. Computer Shopper, Wi-Fi meets Hi-Fi: here's how to stream music, still images, and videos to your home entertainment center, Nov. 1, 2003, 5 pages.
NewsRoom. Custom Home, Easy listening: the hard disk is shaping the future of home entertainment. (The Wired House)., May 1, 2003, 3 pages.
NewsRoom. D-Link to Supply Omnifi with Exclusive New Antenna for Streaming Audio Throughout the House, Jan. 8, 2004, 3 pages.
NewsRoom. Easdown, R., System Heaven: Custom House Technofile, Nov. 24, 2003, 5 pages.
NewsRoom. Electronic House Expo Announces 2005 Multi-Room AudioNideo Award Winners. Nov. 18, 2005, 3 pages.
Teirikangas, Jussi. HAVi: Home Audio Video Interoperability. Helsinki University of Technology, 2001, 10 pages.
Thaler et al. Scalability and Synchronization in IEEE 1394-Based Content-Creation Networks. Audio Engineering Society Convention Paper 5461, Sep. 21-24, 2001, 16 pages.
TOA Electronics, Inc. DP-0206 Digital Signal Processor. DACsys 2000, 2001, 12 pages.
Tom's Hardware Guide: Nachrichten. Nachrichten vom Jan. 10, 2003, 3 pages [produced by Google in Inv. No. 337-TA-1191 on May 6, 2020].
Trask, Simon. NewsRoom, Pro Sound News Europe, Bluetooth to drive wireless speakers, vol. 18; Issue 6, Jun. 1, 2003, 2 pages.
Tsai et al. SIM-based Subscriber Authentication for Wireless Local Area Networks, 2003, 6 pages.
United States Patent and Trademark Office, U.S. Appl. No. 60/379,313, filed May 9, 2002, entitled "Audio Network Distribution System," 50 pages [produced by Google in Inv. No. 337-TA-1191 on May 6, 2020].
UPnP AV Architecture:0.83 for UPnP Version 1.0, Jun. 12, 2002, copyright 2000, 22 pages.
UPnP Forum. UPnP Device Architecture 1.0. Oct. 15, 2008, 80 pages.
Urien et al. EAP-TLS Smartcards, from Dream to Reality, 4th Workshop on Applications and Services in Wireless Networks, Aug. 9, 2004, 19 pages.
Valtchev et al. In Home Networking, Service Gateway Architecture for a Smart Home, Apr. 2002, 7 pages.
Weverka et al. Windows XP Gigabook for Dummies. Wiley Publishing, Inc. 2004, 915 pages.
Wi-Fi Alliance. Wi-Fi Protected Setup Specification, Version 1.0h, Dec. 2006, 110 pages.
Wildstrom, Stephen. At CES, Cool Tech Still Rules. BusinessWeek Online, Jan. 13, 2003, 3 pages.
Wilkins, N., SMC SMCWMR-AG EZ-Stream (wireless) review. CNET, Feb. 8, 2004, 3 pages.
Wilkins, N., SMC SMCWMR-AG EZ-Stream (wireless) review. CNET, Feb. 8, 2004, 5 pages.
Williams, A. Zero Configuration Networking. Requirements for Automatic Configuration of IP Hosts, Sep. 19, 2002, 19 pages.
Williams, Stephen. NewsRoom, Going Wireless, Oct. 21, 2003, 2 pages.
Williams, Stephen. NewsRoom, Newsday, As Wireless Evolves, Compatibility is Key, Jul. 21, 2003, 3 pages.
Windows XP: The Complete Reference—Chapter 19 Working with Sound, 6 pages [produced by Google in Inv. No. 337-TA-1191 on May 6, 2020].
Wired. Total Remote Control, Issue 11.06, Jun. 2003, 2 pages.
Wireless Home Audio Director. Wireless N Music Player with Integrated Amplifier DMC250. Datasheet. Linksys by Cisco. Fill Your Home with Music, 2008, 2 pages.
Wireless USB Adapter 11g CPWUA054, CPWUA054|00, CPWUA054|37, User Manual, Version: 1.0, Dec. 2003, 29 pages.

Yahoo Finance. BridgeCo Successfully Commercializes its BeBoB Application for the Music Industry: Four Manufacturers Demonstrate BeBoB-enabled Products at NAMM 2004. Jan. 16, 2004, 3 pages.
Yahoo Groups. Exstreamer. Barix Exstreamer. Access via Wayback Machine http://groups.yahoo.com/group/exstreamer/ Dec. 22, 2013, 1 page.
Yamaha Digital Audio Server, MCX-1000, Owner's Manual, 1996-2002, 148 pages.
Yamaha DME Designer 3.0 Owner's Manual; Copyright 2008, 501 pages.
Yamaha MusicCAST Digital Audio Server MCX-1000 Owner's Manual, Copyright 1996-2002, 148 pages.
Yamaha, MusicCAST: Digital Audio Terminal MCX-A10, Owner's Manual. Jun. 4, 2003, 76 pages.
Yamaha Personal Receiver RP-U200 Operation Manual ("Operation Manual"), Copyright 1992-1997, 57 pages.
Zero Configuration networking with Bonjour—YouTube available via https://www.youtube.com/watch?v=ZhtZJ6EsCXo 3 pages [produced by Google in Inv. No. 337-TA-1191 on May 6, 2020].
Zeroconf Working Group, Dynamic Configuration of IPv4 Link-Local Addresses, Internet-Draft, Jul. 8, 2004, 62 pages.
Zeroconf Working Group, Dynamic Configuration of IPv4 Link-Local Addresses, Internet-Draft, Jul. 1, 2004, 60 pages.
Zeroconf Working Group, Dynamic Configuration of IPv4 Link-Local Addresses, Internet-Draft, Jun. 7, 2004, 62 pages.
Zeroconf Working Group, Dynamic Configuration of Link-Local IPv4 Addresses, Internet-Draft, Feb. 16, 2004, 60 pages.
Zeroconf Working Group, Dynamic Configuration of Link-Local IPv4 Addresses, Internet-Draft, Mar. 31, 2004, 60 pages.
NewsRoom. Slim Devices Introduces Slimserver, Nov. 18, 2003, 2 pages.
NewsRoom. Slim Devices Introduces Slimserver. PR Newswire. Nov. 18, 2003, 2 pages.
NewsRoom. Slim Devices Introduces Squeezebox, Nov. 18, 2003, 2 pages.
NewsRoom. SMC Sponsors Canada's First Combined 'LAN Event' for Garners: DreamlanSMC, Jan. 15, 2004, 2 pages.
NewsRoom. SMC Sponsors Canada's First Combined 'LAN Event' for Garners: DreamlanSMC, Jan. 15, 2004, 3 pages.
NewsRoom. SMC Sponsors Home by Design Showhouse/ Connected by Design Tour, Jan. 6, 2004, 3 pages.
NewsRoom. SMC Teams with Get Digital to Offer Free Music Conversion to Its Wireless Audio Adapter Users, Feb. 23, 2004, 3 pages.
NewsRoom. SMC teams with Get Digital to offer free music conversion to wireless users, Mar. 29, 2004, 1 page.
NewsRoom. SMC to Offer Home Entertainment Networking Bundle With New Intel Desktop Boards, Nov. 3, 2003, 3 pages.
NewsRoom. Sonic divide crumbles, 2001 WLNR 5430795. Sep. 5, 2001, 3 pages.
NewsRoom. Sound and Fury the Latest in Volume and Video at SF Home Entertainment Show Jun. 6, 2003, 3 pages.
NewsRoom. Sound Blaster Goes Wireless, Sep. 30, 2003, 3 pages.
NewsRoom. St. Paul Pioneer Press, Guide to Better Giving You Know These People. Why Is It So Hard to Buy for Them? Maybe It's Not: Everyone Need Technology, From the Littlest Angel to the Most Resistant Grandparent, Nov. 24, 2003, 6 pages.
NewsRoom. Sullivan, A., PluggedIn—Digital music migrates to the home stereo, Oct. 28, 2003, 3 pages.
NewsRoom. Tech along, Jan. 25, 2004, 3 pages.
NewsRoom. Technology Life in the iPad. Mar. 15, 2007, 5 pages.
NewsRoom. Televisions defy hi-tech trend for minimalism, Feb. 19, 2004, 3 pages.
NewsRoom. The 50 Best Music Systems, Dec. 13, 2003, 15 pages.
NewsRoom. The Age (Australia), Fresh Gadgets, 2001 WLNR 13294645, Sep. 7, 2001, 3 pages.
NewsRoom. The Dallas Morning News, Honorable mentions worth a look, Nov. 20, 2003, 2 pages.
NewsRoom. The Dallas Morning News, Innovations Hasten Trend of On-the-Go Music, Video, Technology, Jan. 16, 2003, 4 pages.
NewsRoom. The Dallas Morning News, Wireless Technology Focus of Consumer Electronics Show in Las Vegas, Jan. 9, 2003, 4 pages.

(56) References Cited

OTHER PUBLICATIONS

NewsRoom, The Goods Whats' New What's Hot, Nov. 9, 2000, 2 pages.
NewsRoom. The Next Ace in the Hole?—Epson HP set the stage for promising alternatives to wired solutions in vertical markets, Jan. 14, 2002, 3 pages.
NewsRoom. The Orange County Register, Holiday Season Brings Gift Ideas for Tech-Heads, Gadget Groupie, Dec. 8, 2003, 4 pages.
NewsRoom. The personal computer shows its creative side. Technology has discovered its next "killer app." Aug. 14, 2003, 3 pages.
NewsRoom. The top 25: computer shopper editors handpick this months best desktops notebooks digital audio receivers, handhelds, and software. Nov. 1, 2003, 3 pages.
NewsRoom. The toys of summer: Some cool tools that will get you through the lazy days. Sep. 1, 2003, 3 pages.
NewsRoom. The wide world of Wi-Fi: wherever you are, wireless networking is where it's at. Find out which Wi-Fi components will help you stay connected while . . . May 1, 2004, 7 pages.
NewsRoom. Ticker, Aug. 1, 2003, 2 pages.
NewsRoom. Washington Post, Ask the Computer Guy, Jan. 11, 2004, 2 pages.
NewsRoom. Yamaha Announces the Worlds First Wireless Home Music System. Aug. 11, 2003, 2 pages.
NewsRoom. Yamaha Musiccast An easy way to spread music around your home. Dec. 1, 2003, 2 pages.
NewsRoom.Slim Devices Introduces Squeezebox. PR Newswire. Nov. 18, 2003, 2 pages.
Niles SI-1230. Systems Integration Amplifier. Installation & Operation Guide, 2009, 32 pages.
Niles SI-1260. Systems Integration Amplifier. Installation & Operation Guide, 2000, 32 pages.
Non-Final Office Action dated Apr. 13, 2020, issued in connection with U.S. Appl. No. 16/297,991, filed Mar. 11, 2019, 16 pages.
Olenick, Doug. Networked MP3 Player Lineup Bows From cd3o. Jan. 9, 2003, 6 pages.
Olenick, Doug. Twice, Networked MP3 Player Lineup Bows from cd3o, Jan. 9, 2003, 2 pages.
Omnifi A Simple Media Experience. DMSI User Manual, Jul. 2003 36 pages.
Omnifi DMS1 Wi-Fi Media Receiver p. 2, Sound & Vision, Copyright 2020, 7 pages.
Omnifi DMS1 Wi-Fi Media Receiver p. 3, Sound & Vision, Copyright 2020, 5 pages.
P4 0.3.1 software/source code available via link ("Download P4 0.3.1.") 1 page [online]. [retrieved on Mar. 26, 2020]. Retrieved from the Internet URL: http://snarfed.org/p4.
p4sync/player.cpp. GitHub. Copyright 2005, 4 pages [online], [retrieved on Mar. 26, 2020]. Retrieved from the Internet URL: http://github.com/snarfed/p4sync/blob/master/player.cpp.
Parrot—All Products—Bluetooth Hands Free Car Kits, Oct. 21, 2008, 3 pages.
Parrot DS1120—Wireless Hi-Fi Stereo Sound System, Nov. 22, 2008, 3 pages.
Parrot DS1120 User Guide, English. Retrieved on Mar. 26, 2020, 11 pages.
Parrot DS1120 User Manual, 2007, 22 pages.
Philips. Installation CD Content, software/ source code available via zip file ("Installation CD Content") published Sep. 15, 2004, 3 pages [online], [retrieved on Feb. 24, 2020]. Retrieved from the Internet URL : https://www.usa.philips.com/c-p/MCW770_37/-/support.
Philips Leads Consumer Electronics Industry with 21 CES Innovation Awards. Business Wire. 2004 International CES, Jan. 6, 2004, 3 pages.
Philips. MC W7708. Wireless PC Link Quick Installation. Published Dec. 22, 2004, 8 pages.
Philips. MCW770 Leaflet. Remote Control MP3 Music from Your PC . . . Wirelessly. MP3 Micro Hi-Fi System with 5 CD Tray Changer. Published Mar. 2, 2004, 2 pages.
Philips. MCW770 Quick Use Guide. English version. Published Dec. 22, 2004, 4 pages.
Philips Media Manager 3.3.12.0004 Release Notes, last modified Aug. 29, 2006, 2 pages.
Philips. Media Manager Software—English version: PMM 3.3.12, software/ source code available via zip file ("Media Manager Software—English") published Sep. 15, 2004, 3 pages [online], [retrieved on Feb. 24, 2020]. Retrieved from the Internet URL : https://www.usa.philips.com/c-p/MCW770_37/-/support.
Philips. PC Software version: V.12.1, software/ source code available via zip file ("PC Software") published Sep. 15, 2004, 3 pages [online], [retrieved on Feb. 24, 2020]. Retrieved from the Internet URL : https://www.usa.philips.com/c-p/MCW770_37/-/support.
Philips.Wireless PC Link Micro MCW770 Custom Installation, User Manual, published Aug. 24, 2004, 61 pages.
Pinnacle ShowCenter. Pinnacle Systems, Mar. 2005, 132 pages.
Pohlmann, Ken. Omnifi DMS1 Wi-Fi Media Receiver. Sound & Vision, Oct. 20, 2003, 7 pages.
Publishing Network Services. Apple Developer Connection. Rendezous Network Services: Publishing Network Services, Nov. 12, 2002, 6 pages.
Rendezous Network Services: Resolving and Using Network Services. Apple Developer Connection, Nov. 12, 2002, 5 pages.
Rendezvous Network Services: About Rendezvous. Apple Developer Connection, Nov. 12, 2002, 5 pages.
Rocketfish. Digital Wireless Speakers. RF-WS01/WS01-W/WS02 User Guide, 2008, 28 pages.
Rocketfish. Wireless Outdoor Speaker. RF-RBWS02 User Guide, 2009, 33 pages.
Roku SoundBridge Network Music Player User Guide v2.5, 2006, 40 pages.
Rose, B., Home Networks: A Standards Perspective. In-Home Networking, IEEE Communications Magazine, Dec. 2001, 8 pages.
Schertel, Barry. Griffin Evolve Wireless iPod Speakers, Feb. 18, 2008, 4 pages.
Shannon, Victoria. The New York Times, Company supports Apple: Philips sets up a 'Rendezvous', Sep. 11, 2002, 2 pages.
Sieborger, D. R., Multiprotocol Control of Networked Home Entertainment Devices, Feb. 2004, 131 pages.
SMC EZ-Stream Universal Wireless Multimedia Receiver—NextUp, Dec. 5, 2003, 4 pages.
SMC Network. SMCWMR-AG—EZ-Stream Universal Wireless Multimedia Receiver, Dec. 3, 2003, 2 pages.
SMC Networks Consumer Site. About SMC: Press Release Details, Feb. 21, 2004, 2 pages.
SMC Networks Consumer Site. Products: Home Entertainment Networking, Dec. 10, 2003, 1 page.
SMC Networks Consumer Site. Products: Home Entertainment Networking, Feb. 7, 2004, 1 page.
SMC Networks Consumer Site. Support: Support Center Downloads, Feb. 7, 2004, 1 page.
SMC Networks Ez-Stream Universal 2.4GHz/5GHz Wireless Multimedia Receiver. SMCWMR-AG Users Manual, 60 pages [produced by Google in Inv. No. 337-TA-1191 on May 6, 2020].
SMC Networks. SMCWAA-B EZ-Stream 2.4GHz Wireless Audio Adapter. User Guide, 2004, 51 pages.
SMC Networks. SMCWMR-AG EZ-Stream Universal Wireless Multimedia Receiver. User Guide, 2003, 43 pages.
SMC-GT1255FTX-SC EZ Card. SMC Networks: What's New, Feb. 5, 2004, 7 pages.
Snarfed/p4sync. GitHub: A library and plugins for a few music players that (attempts to) synchronize playback across multiple computers, 2 pages [online]. [retrieved on Mar. 26, 2020]. Retrieved online URL: https://github.com/snarfed/p4sync.
Software & drivers. Micro Audio System MCW770/37. Philips. Copyright 2004-2020, 3 pages [online]. [retrieved on Feb. 24, 2020]. Retrieved from the Internet URL: https://www.usa.philips.com/c-p/MCW770_37/-/support.
*Sonos* v. *Google*. Exhibit A to Respondents' Initial Invalidity Contentions dated Apr. 29, 2020, 194 pages.
*Sonos* v. *Google*. Respondents' Initial Invalidity Claim Charts for U.S. Pat. No. 10,439,896, Exhibits 1-16 and B, dated Apr. 29, 2020, 1102 pages.

(56) References Cited

OTHER PUBLICATIONS

*Sonos v. Google.* Respondents' Initial Invalidity Claim Charts for U.S. Pat. No. 10,209,953, Exhibits 1-10 and B, dated Apr. 29, 2020, 288 pages.
*Sonos v. Google.* Respondents' Initial Invalidity Claim Charts for U.S. Pat. No. 8,588,949, Exhibits 1-19 and B, dated Apr. 29, 2020, 280 pages.
*Sonos v. Google.* Respondents' Initial Invalidity Claim Charts for U.S. Pat. No. 9,195,258, Exhibits 1-10 and B, dated Apr. 29, 2020, 345 pages.
*Sonos v. Google.* Respondents' Initial Invalidity Claim Charts for U.S. Pat. No. 9,219,959, Exhibits 1-9 and B, dated Apr. 29, 2020, 344 pages.
*Sonos v. Google.* Respondents' Initial Invalidity Contentions dated Apr. 29, 2020, 200 pages.
Sony. Home Theatre System. HT-DDW790 and HT-DDW685 Operating Instructions, 2007, 64 pages.
Sony Shows Off Range of Home LANs, Dec. 15, 2000, 1 page.
Sound Blaster, Wireless Music. User's Guide: Creative Sound Blaster Wireless Music Version 1.0, Aug. 2003, 66 pages.
Space.com. Tech Today: News about the latest gizmos and gadgets conveniently available on Earth, Feb. 14, 2004, 2 pages.
Squeezebox Duet Network Music System by Logitech. User Guide English (North America), 2008, 45 pages.
Step-by-step P4 Connection. P4 Poster (without music), 5 pages [online], [retrieved on Mar. 26, 2020]. Retrieved from the Internet URL: https://snarfed.org/p4_poster/index.html.
Steve Jobs introduces AirPort Express All Things D2 (2004)—YouTube available via https://www.youtube.com/watch?v=hq5_P90pOqo 3 pages, [produced by Google in Inv. No. 337-TA-1191 on May 6, 2020].
Structured Media Components. Leviton Integrated Networks, last modified Apr. 10, 2006, 28 pages.
Support. Manuals & Documentation. Micro Audio System MCW770/37. Philips. Copyright 2004-2020, 3 pages. [online], [retrieved on Feb. 24, 2020]. Retrieved from the Internet URL: https://www.usa.philips.con/c-p/MCW770_37/-/support.
Synchronizing mp3 playback. 3 pages [online]. [retrieved on Mar. 26, 2020]. Retrieved from the Internet URL: https://snarfed.org/synchronizing_mp3_playback.
Technology. cd30 is developing products which implement NAVOS, allowing consumers to get better utility out of their home media libraries. Nov. 21, 2003, 1 pages.
Cd3o. Network MP3 Player, Product Manual, 2003, 65 pages.
Cd3o Product Support Center, Nov. 19, 2003, 1 page.
CES: MP3-Player mit Pfiff, Jan. 13, 2003, 4 pages [produced by Google in Inv. No. 337-TA-1191 on May 6, 2020].
Cheshire et al. RFC 3927—Dynamic Configuration of IPv4 Link-Local Addresses, 2005, 34 pages.
Cheshire et al. Zero Configuration Networking: The Definitive Guide. Dec. 2005, 288 pages.
Clipsal. Multi Room Audio Amplifier, User's Guide, V1.0, Dec. 2005, 28 pages.
Clipsal. Multi Room Audio Matrix Switcher, User's Guide, 560884, V1.0, Dec. 2005, 20 pages.
C-Media. CM102-A/102S USB 2CH Audio Controller, Data Sheet. Version 1.4. May 21, 2003, 20 pages.
C-Media Electronics Inc. CMI8768/8768+ Advanced Driver Software Architecture. User Manual, Revision: 1.0, May 25, 2004, 29 pages.
C-Media XeaR 3D Sound Solution. CMI8738 4/6-Channel PCI Audio Single Chip. User Manual, Rev. 2.1, May 21, 2002, 44 pages.
CNET. Wireless gizmo for PC music hits home, Sep. 30, 2003, 4 pages.
Compaq et al., Universal Serial Bus Specification, Revision 2.0, Apr. 27, 2000, 650 pages.
Connected Planet. Using PC Link. Streamium PC Link by Philips. Models MC-i200/250, SL300i, SL400i, MX6000i, last modified Aug. 5, 2004, 2 pages.
Creating the Future of Home Entertainment Today. NetStreams Product Catalog 2003/2004, 20 pages.
Creative Sound Blaster Wireless Music, User's Guide, Version 1.0, Aug. 2003, 61 pages.
Crest Audio Pro Series 8001 Power Amplifier. V. 2.2 Mar. 25, 1997, 2 pages.
Preston's Adagio Entertainment System with New AMS Processor Wins Awards at CEDIA, Sep. 29, 2006, 3 pages.
Crestron Adagio AMS Media System Operations Guide, 2008, 114 pages.
Crestron. Adagio. Home Entertainment is Just the Beginning . . . 2007, 10 pages.
Crestron. AVS Forum. Dec. 1, 2007, 9 pages.
Crestron, Industry Awards, Crestron's Spirit of Innovation has Resulted in the Most Award-Winning Products in the Industry, 2006, 6 pages.
Crestron, Industry Awards, Crestron's Spirit of Innovation has Resulted in the Most Award-Winning Products in the Industry, 2007, 5 pages.
Crome, Caleb. Logitech Squeezebox Boom Audio Design, 2008, 11 pages.
Davies, Chris. Sony Ericsson MS500 Bluetooth Splashproof Speaker. http://www.slashgear.com/sony-ericsson-ms500-bluetooth-splashproof. Mar. 17, 2009, 2 pages.
Denon AVR-3805 an Surround Receiver. Datasheet, last modified Mar. 1, 2004, 2 pages.
Dhir, Amit, "Wireless Home Networks—DECT, Bluetooth, Home RF, and Wirelss LANs," Xilinx, wp135 (v1.0), Mar. 21, 2001, 18 pages.
Dierks et al. RFC 2246 The TLS Protocol, Jan. 1999, 80 pages.
Digigram. EtherSound ES8in/8out Ethernet Audio Bridges. Easy and Cost-Effective Audio Distribution, Nov. 2002, 4 pages.
D-Link. User's Manual, Wireless HD Media Player, Version 1.1, DSM-520, Sep. 28, 2005, 127 pages.
DLNA. Overview and Vision, White Paper, Jun. 2004, 16 pages.
DLNA. Use Case Scenarios, White Paper, Jun. 2004, 15 pages.
DP-0206 TOA Digital Signal Processor. TOA Corporation, 2001, 4 pages.
Duo Soundolier. Sound & Light : Wireless Speaker Torchiere. Soundolier Integrated Wireless Technologies, 2006, 3 pages.
ECMA. Near Field Communication—White Paper, ECMA/TC32-TG19/2004/1, 9 pages [produced by Google in Inv. No. 337-TA-1191 on May 6, 2020].
ECMA. Near Field Communication, ECMA/TC32-TG19, Oct. 2002, 15 pages.
ECMA. Standard ECMA-340, Near Field Communication—Interface and Protocol NFCIP-1, Dec. 2002, 66 pages.
Ecma. What is Ecma? 2 pages [produced by Google in Inv. No. 337-TA-1191 on May 6, 2020].
Epson. EpsonNet 802.11B, Convenient Printing Using Wireless Technology, 2002, 2 pages.
Epson. EpsonNet 802.11b, User's Guide, 2002, 68 pages.
Epson Product Support Bulletin. PSB # PSB.2003.05.005, EpsonNet 802.11b Wireless Print Server, Apr. 30, 2003, 30 pages.
Epson Product Support Bulletin. PSB # PSB.2003.05.007, EpsonNet 802.11b Wireless Print Server, Apr. 23, 2003, 10 pages.
Epson Stylus C80WN. Quick Start, 2002, 2 pages.
Epson Stylus C80WN. Setup and Installation, Nov. 2001, 67 pages.
Exstreamer. Network MP3 player for digital audio streaming in a consumer, home installation and commercial applications. Barix Think Further. Sep. 2002, 2 pages.
Exstreamer. The Exstreamer Instruction Manual. Barix Think Further. Version 1.5 , Oct. 2002, 21 pages.
Exstreamer. The Exstreamer Technical Description: Version 1.5. Barix Think Further. Oct. 2002, 36 pages.
Exton System Integrator Speakers. System Integrator Speaker Series. ExtroNews. Issue 16.2, Winter 2005, 32 pages.
EZ-Stream 11 Mbps Wireless Audio Adapter. Model No. SMCWAA-B. Home Entertainment Networking, 2 pages [produced by Google in Inv. No. 337-TA-1191 on May 6, 2020].
Fielding et al. RFC 2616 Hypertext Transfer Protocol—HTTP/1.1, Jun. 1999, 114 pages.

(56) References Cited

OTHER PUBLICATIONS

FireBall Digital Music Manager E-40 and E-120. Meet FireBall. The Industry's choice for managing your entire music collection. Datasheet. 2003, 2 pages.
NewsRoom. Electronic House Expo Fall 2003 Exhibitor Profiles. Business Wire. Nov. 11, 2003, 7 pages.
NewsRoom. Electronic House Expo Spring 2004 Exhibitor Profiles. Business Wire. Mar. 10, 2004, 7 pages.
NewsRoom. Evangelista, B., Sound and Fury the Latest in Volume and Video at SF Home Entertainment Show, Jun. 6, 2003, 3 pages.
NewsRoom. Fallon et al. The Goods, Jul. 31, 2003, 2 pages.
NewsRoom. Future shocks—Connect: Your ultimate home-entertainment guide, Dec. 4, 2003, 3 pages.
NewsRoom. Greg, T., Rooms with a tune, Jul. 23, 2003, 3 pages.
NewsRoom. Hoffman, A., Computer networks start entertaining, Jun. 1, 2003, 3 pages.
NewsRoom. Home theater systems that are a real blast, New Straits. Jan. 6, 2000, 3 pages.
NewsRoom. IDG's PC World Announces Winners of the 2004 World Class Awards, Jun. 2, 2004, 3 pages.
NewsRoom. InfoComm 2004 Exhibitors vol. 7, Issue 5, May 1, 2004, 24 pages.
NewsRoom. International Herald Tribune, Transmitting media gets easier cheaply, Jan. 31, 2004, 2 pages.
NewsRoom. Latest electronic gadgets unveiled in Las Vegas: Wireless Devices take centre stage, Jan. 13, 2003, 4 pages.
NewsRoom. Linksys Extends Wireless Functionality to the Television, Jul. 14, 2003, 3 pages.
NewsRoom. Linksys Ships Wireless-B Media Link for Streamlined Delivery of Music From PC to Stereo Stream MP3s, Play Lists and Internet Radio to Any Stereo With the Wireless-B Media Link for Music, May 19, 2004, 3 pages.
NewsRoom. Linksys Wireless Home Products Are Hot Tech Gifts for 2003, Nov. 24, 2003, 3 pages.
NewsRoom. Living room expansion—The PC is going from word processor to entertainment hub for many households, Aug. 18, 2003, 4 pages.
NewsRoom. Macy's Returns to Electronics With Home Theater Boutique, Aug. 11, 2003, 2 pages.
NewsRoom. Many different ways to enjoy digital music library, Apr. 29, 2003, 3 pages.
NewsRoom. Marlowe, C., Pad gadgets: home is where the gear is. Oct. 20, 2003, 2 pages.
NewsRoom. Miller II, S. A., Technology gets simpler and smarter, Jan. 14, 2003, 2 pages.
NewsRoom. Miller, M., Adapted for flight: hands-on trial: wireless media adapters send digital entertainment soaring from PC to living room. Sep. 18, 2003, 3 pages.
NewsRoom. Miller, S., Creating Virtual Jukeboxes Gadgets Make Digital Music Portable. Aug. 19, 2003, 3 pages.
NewsRoom. Morning Call, Cutting the cord; Wi-Fi networks connect computers, TVs, DVD players and more without a clutter of wires, Feb. 2, 2003, 5 pages.
NewsRoom. Mossberg, W., PC-stored music sent without wires, Jan. 25, 2004, 2 pages.
NewsRoom. Nadel, B., Beam music, images from PC to stereo, TV: Linksys Wireless-B Media Adapter WMA11B. Nov. 1, 2003, 2 pages.
NewsRoom. Net Briefs, Jul. 21, 2003, 2 pages.
NewsRoom. NetWork World, The Toys of Summer, Sep. 1, 2003, 3 pages.
NewsRoom. Networked C300 Speaks Your Language. Apr. 6, 2003, 3 pages.
NewsRoom. New Camera—Now What? It's easy to go wild printing, sharing your digital photos. Oct. 16, 2003, 2 pages.
NewsRoom. New Products Allow Easier Access to Audio Video on Home Computers, Nov. 9, 2003, 3 pages.
NewsRoom. Newman, H., All-in-one Audio, Video Devices will be next big thing, Jan. 9, 2003, 3 pages.
NewsRoom. Norris, A., Come over to my house. Jan. 23, 2003, 3 pages.
NewsRoom. On the Printer Trail—Ream of new SMB models offers channel a range of sales hooks CRN Test Center finds. Oct. 13, 2003, 5 pages.
NewsRoom. One way to organize and weed Favorites, May 8, 2003, 3 pages.
NewsRoom, Outfitting your personal fortress of solitude, Mar. 14, 2002, 4 pages.
NewsRoom. Philadelphia Inquirer, Wireless solution for stereo sound, Aug. 7, 2003, 3 pages.
NewsRoom. Popular Science, Yamaha Musiccast an easy way to spread music around your home, Dec. 1, 2003, 2 pages.
NewsRoom. PR Newswire, "Home Director Announces Availability of AudioPoint Receiver," Sep. 27, 2002, 4 pages.
NewsRoom. Preview the New EZ-Stream Wireless Audio Adapter at CES Jan. 8-11, 2004 BridgeCo Booth 19629, Jan. 1, 2004, 3 pages.
NewsRoom. Receiver Lets Stereo Join the Wi-Fi Band, Apr. 10, 2003, 2 pages.
NewsRoom. Rogers, P., Speaker Screech: The End Is Near, Apr. 8, 2003, 2 pages.
NewsRoom. San Jose Mercury News, Intel Fund to Invest in Digital Home, Jan. 7, 2004, 2 pages.
NewsRoom. Science & Technology: Wired for sound and video, Jan. 14, 2004, 3 pages.
NewsRoom, Sears reveals plans for new Eatons stores, Oct. 26, 2000, 3 pages.
NewsRoom. Seattle Times, Inventions real stars of the show As speeches predict future 100,000 browse 'superstore', Jan. 13, 2003, 4 pages.
NewsRoom, Sensible Sound, Goin' to a show-show, Surveying the Soundscape, Jun. 1, 2003, 8 pages.
NewsRoom. Shaw, K., Cool Tools, Jan. 20, 2003, 2 pages.
NewsRoom. Sheehan, W., More brains, less brawn. Sep. 1, 2003, 3 pages.
NewsRoom. Sidener, J., Everett Roach, Jul. 14, 2003, 2 pages.
NewsRoom. Sirius XM Companies Flood Cedia With New Products. Satellite Week. Sep. 15, 2003, 2 pages.
Fireball E2 User's Manual. Escient. Gracenote cddb. 2000-2004, 106 pages.
First Action Pre-Interview Office Action dated Jun. 22, 2017, issued in connection with U.S. Appl. No. 14/516,883, filed Oct. 17, 2014, 4 pages.
First Office Action Interview dated Aug. 30, 2017, issued in connection with U.S. Appl. No. 14/516,883, filed Oct. 17, 2014, 5 pages.
Fried, John J. NewsRoom, Convergence melds personal computer, TV and stereo, Feb. 20, 2003, 4 pages.
Frodigh, Magnus. Wireless ad hoc networking—The art of networking without a network, Ericsson Review No. 4, 2000, 16 pages.
Gateway Solo 5300 User Manual, 305 pages [produced by Google in Inv. No. 337-TA-1191 on May 6, 2020].
Getting to know Logitech Squeezebox Touch Wi-Fi Music Player. Features Guide, 2010, 36 pages.
Godber et al. Secure Wireless Gateway. RightsLink. Arizona State University, pp. 41-46 [produced by Google in Inv. No. 337-TA-1191 on May 6, 2020].
Golem, WLAN-MP3-Player zum Anschluss an die Stereoanlage, Jun. 1, 2003, 2 pages.
Google's Answer to Complaint and Counterclaims filed with United States District Court Central District of California, Western Division on Mar. 2, 2020, 50 pages.
Google's Counterclaims to Sonos's Complaint filed with United States District Court Central District of California, Western Division on Mar. 11, 2020, 13 pages.
Guttman, Erik. An API for the Zeroconf Multicast Address Allocation Protocol, Jun. 6, 2001, 11 pages.
Guttman, Erik. Autoconfiguration for IP Networking: Enabling Local Communication, Jun. 2001, 6 pages.
Guttman, Erik. Network Working Group, Zeroconf Host Profile Applicability Statement, Internet-Draft, Jul. 20, 2001, 9 pages.
Hawn, Andrew. TechTV, First Look: cd3o c300, 2004, 2 pages.

(56) References Cited

OTHER PUBLICATIONS

High Fidelity. New Wave in Speaker Design. Oct. 1980, 130 pages.
HomePod—Wireless Network Digital Music Player with FM Tuner, User Manual, 2003, 16 pages.
HomePod MP-100, Wireless Network Music Player, with USB Jukebox, Internet Radio, and FM Tuner, Specification, 2003, 2 pages.
HomePod. User Manual, Wireless Network Digital Audio Player with FM Tuner, 2003, 49 pages.
How cd30 Network MP3 Players Work, Feb. 2, 2004, 3 pages.
Howe et al. A Methodological Critique of Local Room Equalization Techniques, 5 pages [produced by Google in Inv. No. 337-TA-1191 on May 6, 2020].
HP Deskjet 5850 User Guide, copyright 2003, 217 pages.
IEEE Standards 802.3. Part 3: Carver sense multiple access with collision detection CSMA/CD access method and physical layer specifications, Mar. 8, 2002, 1562 pages.
ILIVE. Users Guide IS809B Wireless Speaker System, Copyright 2010, 12 pages.
Intel Announces WS-Discovery Spec for Joining Devices and Web Services, Intel Developer Forum Spring 2004, Feb. 17, 2004, 4 pages.
Intel Sees Unified Platform and Ecosystem as Key to Enabling the Digital Home, Intel Developer Forum, Feb. 17, 2004, 4 pages.
Intel Tools Validate First Solutions that Enable Devices to Work Together in the Digital Home, Intel Developer Forum, Feb. 17, 2004, 2 pages.
Intel. User's Manual, An Intel Socket 478 Processor Based Mainboard. Mar. 27, 2003, 96 pages.
Introducing Roomlink Network Media Receiver—PCNA-MR10, Sony Vaio, 2003, 2 pages.
IPR Details—Apple Computer's Statement About IPR Claimed in draft-ietf-zeroconf-ipv4-linklocal, Apr. 26, 2004, 3 pages.
Japanese Patent Office, English Translation of Office Action dated Jun. 2, 2020, issued in connection with Japanese Application No. 2017-211958, 6 pages.
Japanese Patent Office, Office Action and Translation dated Jun. 2, 2020, issued in connection with Japanese Patent Application No. 2017-211958, 9 pages.
Johnson, Ian. SMC EZ-Stream Universal Wireless Multimedia Receiver—The Globe and Mail, Dec. 3, 2003, 6 pages.
Kostiainen, K., Intuitive Security Initiation Using Location-Limited Channels. Helsinki University of Technology, Masters Thesis Apr. 14, 2004, 86 pages.
Kraemer, Alan. Two Speakers Are Better Than 5.1—IEEE Spectrum, May 1, 2001, 6 pages.
LA Audio ZX135E 6 Zone Expander. Pro Audio Design Pro. Inc. https://www.proaudiodesign.com/products/la-audio-zx135e-6-zone-expander, accessed Mar. 26, 2020, 6 pages.
Linksys 2.4GHz Wireless-B—User Guide Media Link for Music Model WML11B/WMLS11B, 68 pages [produced by Google in Inv. No. 337-TA-1191 on May 6, 2020].
Linksys 2.4GHz Wireless-B—User Guide V2 Model WMA11B, 68 pages [produced by Google in Inv. No. 337-TA-1191 on May 6, 2020].
Linksys. Quick Installation for Windows XP Only. Wireless-B Media Adapter, 2 pages [produced by Google in Inv. No. 337-TA-1191 on May 6, 2020].
Linksys. Wireless Adapters, 2003, 2 pages.
Linksys. Wireless PrintServer, User Guide, Model No. WPS11 Version 3, 2002, 31 pages.
Linksys Wireless-B Media Adapter—User Guide V1 Model WMA11B, 2003, 32 pages.
Linksys. Wireless-B Media Adapter, Product Data, Model No. WMA11B, 2003, 2 pages.
Linksys. Wireless-B Media Adapter, WMA11B, 2003, 2 pages.
Ljungstrand et al. UBICOMP 2002, Adjunct Proceedings, Fourth International Conference on Ubiquitous Computing, 2002, 90 pages.
Logitech Slimserver. Server for Logitech Squeezebox Players. 1 page [produced by Google in Inv. No. 337-TA-1191 on May 6, 2020].
Logitech/slimserver. Github. 1 page [produced by Google in Inv. No. 337-TA-1191 on May 6, 2020].
Logitech/Slimserver. Github. Version 23 Release. May 19, 2002. 2 pages [produced by Google in Inv. No. 337-TA-1191 on May 6, 2020].
Marchetti, Nino. EdgeReview, CES 2003 Home Network Entertainment, Jan. 28, 2003, 2 pages.
McGlaun, Shane. Best Buy unveils new Rocketboost RF-RBKIT whole home audio solution and more. Oct. 22, 2009, 7 pages.
CobraNet, Programmer's Reference. Version 2.5. Feb. 2006, 147 pages. [Retrieved on Aug. 31, 2020].
CobraNet, Wikipedia. Dec. 9, 2007, 7 pages [retrieved on Aug. 31, 2020]. [Retrieved from the Internet: https://en.wikipedia.org/wiki/CobraNet].
European Patent Office, Summons to Attend Oral Proceedings mailed on Sep. 7, 2020, issued in connection with European Application No. 17198867.8, 10 pages.
Final Office Action dated Aug. 24, 2020, issued in connection with U.S. Appl. No. 16/773,966, filed Jan. 27, 2020, 22 pages.
Final Office Action dated Oct. 26, 2020, issued in connection with U.S. Appl. No. 16/297,991, filed Mar. 11, 2019, 16 pages.
Final Office Action dated Oct. 26, 2020, issued in connection with U.S. Appl. No. 16/670,109, filed Oct. 31, 2019, 17 pages.
Final Office Action dated Aug. 4, 2020, issued in connection with U.S. Appl. No. 16/422,160, filed May 24, 2019, 12 pages.
Non-Final Office Action dated Aug. 6, 2020, issued in connection with U.S. Appl. No. 15/130,919, filed Apr. 15, 2016, 17 pages.
Non-Final Office Action dated Jul. 9, 2020, issued in connection with U.S. Appl. No. 16/670,109, filed Oct. 31, 2019, 18 pages.
Notice of Allowance dated Aug. 19, 2020, issued in connection with U.S. Appl. No. 16/383,561, filed Apr. 12, 2019, 8 pages.
RF-RBWS02 Wireless Outdoor Speaker, Quick Setup Guide, RocketBoost Wireless, 2010, 4 pages. [produced by Google in Inv. No. 337-TA-1191 on Sep. 4, 2020].
Rocketfish—Rocket Boost Wireless, 13 pages [produced by Google in Inv. No. 337-TA-1191 on Sep. 4, 2020].
Rocketfish. Manuals & Support, RF-RBWS02, Oct. 10, 2010, 2 pages. [produced by Google in Inv. No. 337-TA-1191 on Sep. 4, 2020].
Rocketfish. Wireless Outdoor Speaker RF-RBWS02, Quick Setup Guide, 2 pages. [produced by Google in Inv. No. 337-TA-1191 on Sep. 4, 2020].
Search Results for Rocketfish Outdoor Wireless Speaker pdf, Google.com, 2 pages. [produced by Google in Inv. No. 337-TA-1191 on Sep. 4, 2020].
*Sonos, Inc.* v. *Google LLC*, Expert Report of Dr. Kevin Jeffay, Pi-I.D., Regarding the Invalidity of U.S. Pat. No. 9,219,959 [Redacted] dated Oct. 23, 2020, 195 pages.
*Sonos, Inc.* v. *Google LLC*. Order 20: Construing the Terms of the Asserted Claims of the Patents at Issue dated Sep. 25, 2020, 53 pages.
*Sonos, Inc.* v. *Google LLC*. Respondents' Final Invalidity Claims Charts for U.S. Pat. No. 9,219,959, Exhibits 1-9 and B, dated Sep. 4, 2020, 525 pages.
*Sonos, Inc.* v. *Google LLC*. Respondents' Final Invalidity Contentions [Redacted] dated Sep. 4, 2020, 261 pages.
Wireless Speakers. Best Buy, Mar. 4, 2010, 4 pages. [produced by Google in Inv. No. 337-TA-1191 on Sep. 4, 2020].
Advisory Action dated Dec. 10, 2020, issued in connection with U.S. Appl. No. 16/670,109, filed Oct. 31, 2019, 2 pages.
Notice of Allowance dated Jan. 13, 2021, issued in connection with U.S. Appl. No. 16/670,109, filed Oct. 31, 2019, 7 pages.
Notice of Allowance dated Nov. 23, 2020, issued in connection with U.S. Appl. No. 16/422,160, filed May 24, 2019, 8 pages.
*Sonos, Inc.* v. *Google LLC*, Complainant Sonos, Inc.'s Pre-Hearing Brief [Redacted Jan. 29, 2021] dated Jan. 22, 2021, 513 pages.
*Sonos, Inc.* v. *Google LLC*, Direct Witness Statement of Kevin Jeftay, Ph.D. [Redacted Jan. 28, 2021] dated Dec. 18, 2020, 282 pages.

(56) References Cited

OTHER PUBLICATIONS

*Sonos, Inc.* v. *Google LLC*, Rebuttal Expert Report of Kevin C. Almeroth [Redacted Jan. 29, 2021] dated Nov. 13, 2020, 547 pages.
*Sonos, Inc.* v. *Google LLC*, Rebuttal Witness Statement of Kevin C. Almeroth [Redacted Jan. 29, 2021] dated Jan. 8, 2021, 735 pages.
*Sonos, Inc.* v. *Google LLC*, Respondent Google's Pre-Trial Brief [Redacted Jan. 29, 2021] dated Jan. 22, 2021, 516 pages.
Notice of Allowance dated Nov. 4, 2019, issued in connection with U.S. Appl. No. 16/422,160, filed May 24, 2019, 13 pages.
*Sonos, Inc.* v. *Implicit, LLC*: Declaration of Roman Chertov in Support of the Inter Partes Review of U.S. Pat. No. 7,391,791 dated Mar. 9, 2018, 92 pages.
*Sonos, Inc.* v. *Implicit, LLC*: Declaration of Roman Chertov in Support of the Inter Partes Review of U.S. Pat. No. 8,942,252 dated Mar. 9, 2018, 81 pages.
*Sonos, Inc.* v. *Lenbrook Industries Limited et al.*, Defendants' Answer to Plaintiff's Complaint—Exhibit A, filed Oct. 14, 2019, 3 pages.
*Sonos, Inc.* v. *Lenbrook Industries Limited et al.*, Defendants' Answer to Plaintiff's Complaint—Exhibit C, filed Oct. 14, 2019, 16 pages.
*Sonos, Inc.* v. *Lenbrook Industries Limited et al.*, Defendants' Answer to Plaintiff's Complaint—Exhibit D, filed Oct. 14, 2019, 36 pages.
*Sonos, Inc.* v. *Lenbrook Industries Limited et al.*, Defendants' Answer to Plaintiff's Complaint—Exhibit E, filed Oct. 14, 2019, 21 pages.
*Sonos, Inc.* v. *Lenbrook Industries Limited et al.*, Defendants' Answer to Plaintiff's Complaint, filed Oct. 14, 2019, 66 pages.
*Sonos, Inc.* v. *Lenbrook Industries Limited et al.*, Defendants' First Amended Answer and Counterclaims to Plaintiff's Complaint, filed Nov. 14, 2019, 66 pages.
AuviTran AVB32-ES User's Manual, 2005, 25 pages.
AuviTran AVKIT-ES for AD8HR User's Manual, 2005, 15 pages.
Chinese Patent Office, Second Office Action and Translation dated Jun. 27, 2019, issued in connection with Chinese Application No. 201610804134.8, 15 pages.
Chinese Patent Office, Translation of Office Action dated Jun. 27, 2019, issued in connection with Chinese Application No. 201610804134.8, 10 pages.
CobraNet Manager, Direct control over your audio network. www.peakaudio.com/CobraNet/FAQ.html, 2005 [retrieved online Jul. 12, 2019 at web.archive.org/web/20050403214230/http://www.peakaudio.com/CobraNet/FAQ] 13 pages.

European Patent Office, European Office Action dated Sep. 16, 2019, issued in connection with European Application No. 17198867.8, 6 pages.
Japanese Patent Office, Final Office Action dated Jun. 4, 2019, issued in connection with Japanese Patent Application No. 2017-211958, 8 pages.
Japanese Patent Office, Office Action dated Dec. 18, 2018, issued in connection with Japanese Application No. 2017-211958, 8 pages.
Japanese Patent Office, Translation of Final Office Action dated Jun. 4, 2019, issued in connection with Japanese Patent Application No. 2017-211958, 5 pages.
Japanese Patent Office, Translation of Office Action dated Dec. 18, 2018, issued in connection with Japanese Application No. 2017-211958, 6 pages.
Machine Translation of JP2004-193868A Wireless Transmission and Reception System and Wireless Transmission and Reception Method, 12 pages.
Machine Translation of JP2007-2888405A Video Sound Output System, Video Sound Processing Method, and Program, 64 pages.
Non-Final Office Action dated Jul. 17, 2019, issued in connection with U.S. Appl. No. 15/130,919, filed Apr. 15, 2016, 15 pages.
Non-Final Office Action dated Aug. 28, 2019, issued in connection with U.S. Appl. No. 16/422,160, filed May 24, 2019, 14 pages.
Non-Final Office Action dated Jul. 5, 2019, issued in connection with U.S. Appl. No. 16/383,561, filed Apr. 12, 2019, 12 pages.
Non-Final Office Action dated Jul. 5, 2019, issued in connection with U.S. Appl. No. 16/383,565, filed Apr. 12, 2019, 11 pages.
Notice of Allowance dated Sep. 9, 2019, issued in connection with U.S. Appl. No. 16/383,561, filed Apr. 12, 2019, 18 pages.
Notice of Allowance dated Jun. 10, 2019, issued in connection with U.S. Appl. No. 16/128,443, filed Sep. 11, 2018, 10 pages.
Notice of Allowance dated Jan. 15, 2019, issued in connection with U.S. Appl. No. 15/487,686, filed Apr. 14, 2017, 8 pages.
Notice of Allowance dated May 30, 2019, issued in connection with U.S. Appl. No. 16/129,758, filed Sep. 12, 2018, 7 pages.
Notice of Allowance dated Sep. 5, 2019, issued in connection with U.S. Appl. No. 16/383,565, filed Apr. 12, 2019, 14 pages.
Notice of Allowance dated Dec. 7, 2018, issued in connection with U.S. Appl. No. 15/228,812, filed Aug. 4, 2016, 7 pages.
Notice of Allowance dated Feb. 3, 2021, issued in connection with U.S. Appl. No. 15/130,919, filed Apr. 15, 2016, 8 pages.
Notice of Allowance dated Feb. 3, 2021, issued in connection with U.S. Appl. No. 16/297,991, filed Mar. 11, 2019, 8 pages.
*Sonos, Inc.* v. *Google LLC*, WDTX Case No. 6:20-cv-00881, Google's Answer and Counterclaims; dated Jan. 8, 2021, 39 pages.

\* cited by examiner

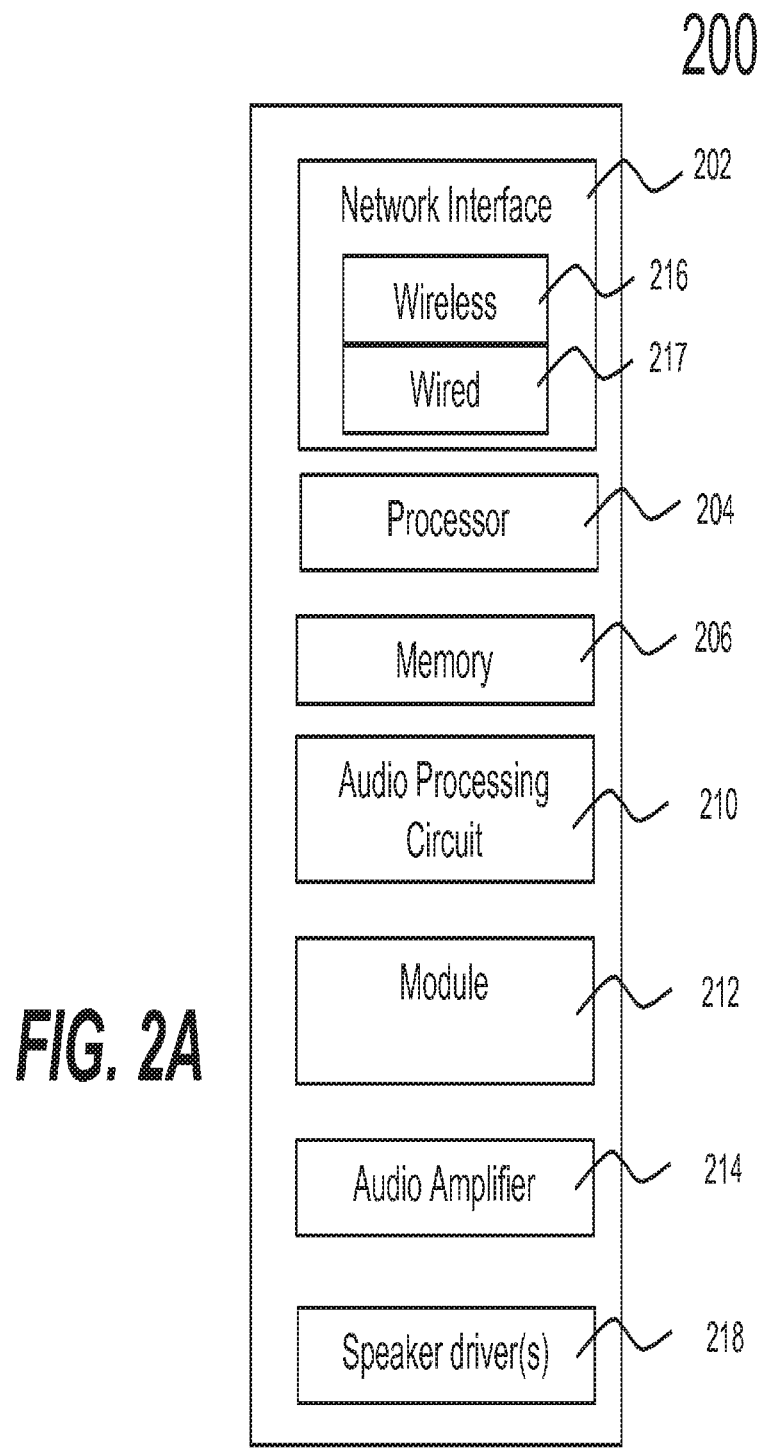

MULTI-CHANNEL PAIRING IN A MEDIA SYSTEM

CROSS-REFERENCE TO RELATED APPLICATIONS

The present application is a continuation of U.S. application Ser. No. 14/825,961, titled "Multi-Channel Pairing in a Media System," filed Aug. 13, 2015; U.S. application Ser. No. 14/825,961 is a continuation of U.S. application Ser. No. 14/299,847, titled "Multi-Channel Pairing in a Media System," filed Jun. 9, 2014, and issued Dec. 22, 2015, as U.S. Pat. No. 9,219,959, and Ex Parte Reexamination 90/013,756 of U.S. Pat. No. 9,219,959 was filed May 25, 2016; U.S. application Ser. No. 14/299,847 is a continuation of U.S. application Ser. No. 13/083,499, titled "Multi-Channel Pairing in a Media System," filed on Apr. 8, 2011, and issued Jul. 22, 2014, as U.S. Pat. No. 8,788,080; U.S. application Ser. No. 13/083,499 is a continuation-in-part of U.S. application Ser. No. 13/013,740, titled "Controlling and grouping in a multi-zone media system," filed on Jan. 25, 2011, and issued Dec. 1, 2015, as U.S. Pat. No. 9,202,509; U.S. application Ser. No. 13/013,740 is a continuation-in-part of U.S. application Ser. No. 11/853,790, titled "Controlling and manipulating groupings in a multi-zone media system," filed Sep. 11, 2007, and issued Jul. 9, 2013, as U.S. Pat. No. 8,483,853; U.S. application Ser. No. 11/853,790 claims priority to U.S. Prov. App. 60/825,407, titled "Controlling and manipulating groupings in a multi-zone music or media system," filed on Sep. 12, 2006. The entire contents of the Ser. Nos. 14/825,961; 14/299,847; 13/083,499; 13/013,740; 11/853,790 and 60/825,407 applications are incorporated herein by reference.

BACKGROUND

The presently described technology is directed towards technology for use in the area of consumer electronics. In particular, certain embodiments are directed to multi-channel pairing in a media system.

Music is very much a part of our everyday lives. And thanks to the advancement of technology, music content is now more accessible than ever. The same can be said of other types of media, such as television, movies, and other audio and video content. In fact, now a user can even access the content over the Internet through an online store, an Internet radio station, online music service, online movie; service, and the like, in addition to the more traditional means of accessing audio and video content.

The demand for such audio and video content continues to surge. Given the high demand over the years, technology used to access and play such content has likewise improved. Even still, technology used in accessing the content and the playback of such content can be significantly improved or developed in ways that the market or end users may not anticipate.

SUMMARY

The embodiments described herein, include, but are not limited to, various devices, systems, methods, and computer program products. This section is for the purpose of summarizing some aspects of certain embodiments. Simplifications or omissions in this section as well as in the abstract or the title of this description may be made to avoid obscuring the purpose of this section, the abstract and the title. Such simplifications or omissions are not intended to limit the scope of the various inventions described herein.

In brief summary, the embodiments described herein provide technology for grouping, consolidating, and pairing individual playback devices to create or enhance a multi-channel listening environment. Particularly, the embodiments described herein enable two or more playback devices to be paired, such that multi-channel audio is achieved or enhanced. Such embodiments may be used to produce stereo sound or other audio environments suitable for audio content encoded with more than two channels, such as for certain kinds of television, movies, and music.

For example, an apparatus according to an embodiment comprises a network interface, a plurality of speaker drivers, an amplifier, and a processor. The network interface receives audio data over a network. The amplifier powers the plurality of speaker drivers. The processor processes the audio data to be output through the plurality of speaker drivers. The processor further configures a first equalization of the output from the plurality of speaker drivers in accordance with a first type of pairing and configuring a second equalization of the output from the plurality of speaker drivers in accordance with a second type of pairing.

In another example, a method according to an embodiment comprises receiving audio data over a network and processing the audio data to be output through a plurality of speaker drivers. The method further includes configuring a first equalization of the output from the plurality of speaker drivers in accordance with a first type of pairing and configuring a second equalization of the output from the plurality of speaker drivers in accordance with a second type of pairing.

One of the objects, features, and advantages of the present invention is to achieve or enhance a multi-channel listening environment. Many other objects, features, and advantages of the present invention will become apparent upon examining the following detailed description of an embodiment thereof, takers in conjunction with the attached drawings.

BRIEF DESCRIPTION OF THE DRAWINGS

These and other features, aspects, and advantages of the presently described technology will become better understood by a person skilled in the art with regard to the following description, appended claims, and accompanying drawings where:

FIG. 2A shows an illustrative functional block diagram of a player in accordance with certain embodiments;

Figure 1:
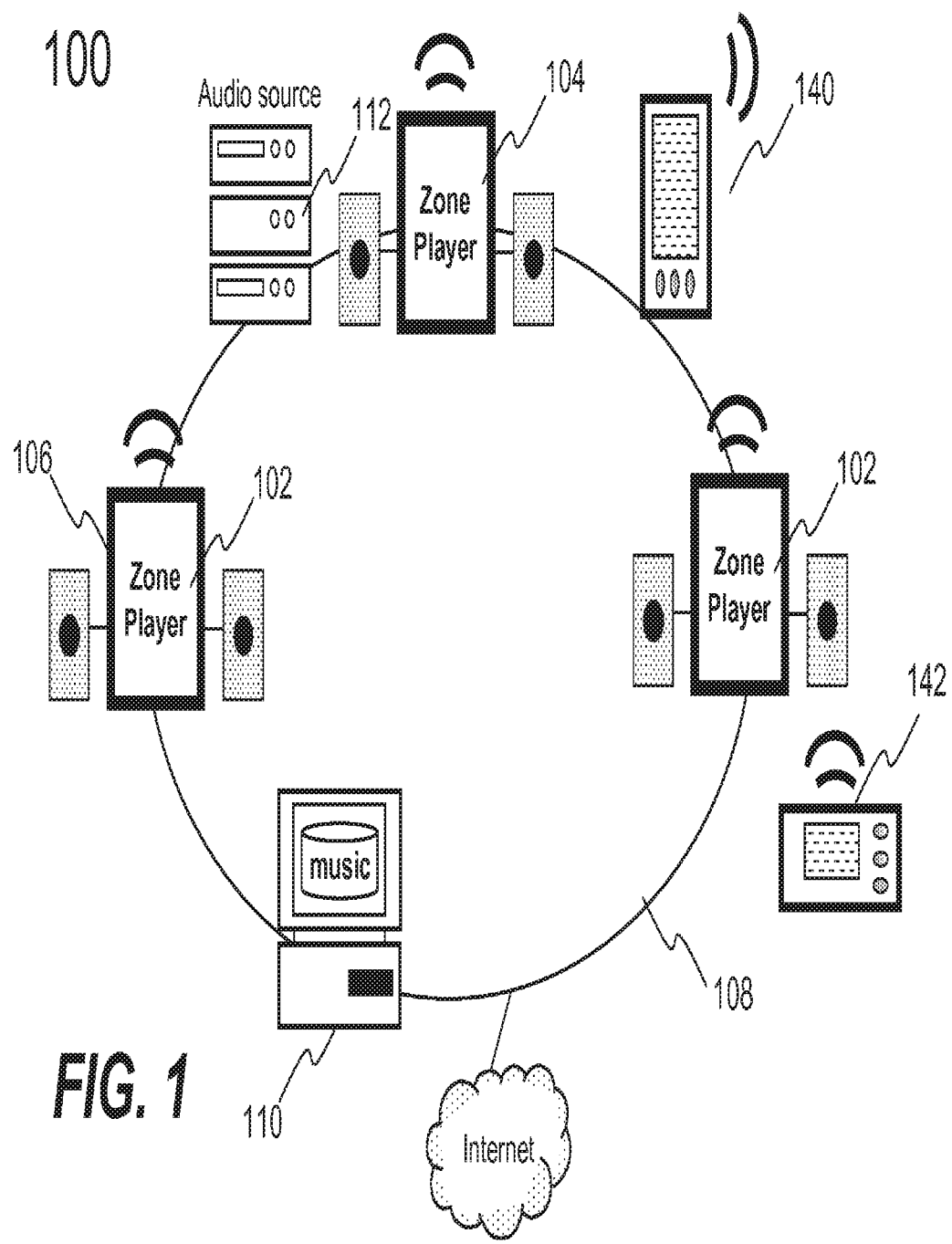
FIG. 1 shows an illustrative configuration in which certain embodiments may be practiced.

In addition, the drawings are for the purpose of illustrating certain embodiments, but it is understood that the inventions are not limited to the arrangements and instrumentality shown in the drawings.

DETAILED DESCRIPTION

I. Overview

The embodiments described herein relate to multi-channel pairing in a media system. The embodiments are particularly useful in pairing two or more playback devices together to create or enhance multi-channel audio reproduction, like stereo, surround sound, or some other multi-channel environment. The embodiments will also find utility in connection with any system for which multi-channel pairing is desired.

In an embodiment, two playback devices that are each configured to output a plurality of audio channels independent of each other are selectively paired, such that subsequent to pairing, one playback device is configured to output a first subset of the plurality of audio channels and the other playback device is configured to output a second subset of the plurality of audio channels. The first and second subsets are different. For instance, each playback device is configured to operate in a two-channel mode or stereo mode prior to being paired (e.g., each playback device is configured to play both right and left channel audio). Subsequent to pairing, one playback device is reconfigured to output a first channel (e.g., right channel audio and not left channel audio) and the other playback device is reconfigured to output a second channel (e.g., left channel audio and not right channel audio), which is different from the first channel.

In another embodiment, a collection of three or more playback devices that are each configured to output a plurality of audio channels independent of another playback device in the collection are selectively paired, such that subsequent to pairing, each of the playback devices is configured to output a different audio channel from the collection. This embodiment is particularly useful in a television or movie theater type setting where a particular playback device of the multiple playback devices is configured to output in two-channel or stereo mode at one time (e.g., when playing a song), and subsequent to pairing, is configured to output as a front-right channel, a front-center channel, a front-left channel, a rear-right channel, a rear-left channel, a subwoofer channel, and so on (e.g., when watching television or a movie or listening to music that contains more than two-channels).

In another embodiment, one of the paired playback devices processes the data of an audio item to separate the data into channels, each of the channels representing a single-sound track, for example. The playback device sends the separated channel(s) to the other, respective playback device(s). The playback devices play their distinctive channels in synchrony, thus creating a multi-channel listening environment. Alternatively, each of the paired playback devices processes the data of an audio item, or a portion of the data, and plays only those one or more channels designated for the respective playback device.

In another embodiment, two or more playback devices may be grouped into a single or consolidated playback device and the consolidated playback device may be paired with one or more playback devices. For instance, two playback devices may be grouped into a first consolidated playback device and two additional playback devices may be grouped into a second consolidated playback device. The first and second consolidated playback devices may be paired, for example. In certain embodiments, each playback device of a consolidated playback device is put into consolidated mode, which may result in a changed equalization for one or more speaker drivers of any particular playback device. Further, one or more additional playback devices may be added to a consolidated playback device.

In certain embodiments, a playback device that is configured to output an audio channel is paired with one or more additional playback devices, such that the playback device is reconfigured to output a different audio channel. For instance, the playback device might be configured to output a right channel for stereo mode, but subsequent to being paired with one or more additional playback devices, might be reconfigured to output a rear, right channel for theater mode. The playback device may be paired to one or more other playback devices.

In certain embodiments, a playback device that is configured to output a plurality of audio channels is paired with one or more additional playback devices, such that the playback device is configured to output a subset of the plurality of audio channels relative to the one or more additional playback devices. For instance, the playback device might be configured to output in two-channel or stereo mode, but subsequent to being paired with one or more playback devices might be configured to output a right or left channel. The playback device may be paired to one or more other playback devices.

In certain embodiments, a playback device comprises a network interface, one or more speaker drivers, an amplifier, and a processor. The network interface receives audio data over a network. The amplifier powers the speaker drivers. The processor processes the audio data to be output through the speaker drivers. The processor further configures a first equalization of the output from the speaker drivers in accordance with a first type of pairing and configuring a second equalization of the output from the speaker drivers in accordance with a second type of pairing. The playback device may operate in any of: non paired mode, paired mode, consolidated mode, and grouped mode.

In certain embodiments, a controller is configured to, among other things, pair two or more playback devices to establish a multi-channel audio environment. That is, through the controller, a user can select which playback devices to pair. Once programmed, the playback devices may operate in paired mode until disengaged, for example. In some embodiments, the controller is wirelessly coupled to the one or more playback devices. In other embodiments, the controller is wired to the one or more playback devices.

According to certain embodiments, the action of pairing two or more playback devices is triggered based on a command from a user via a control interface (e.g., a manual command creates a pair) or responsive to an event (e.g., an automatic command creates a pair). Example events include a detection in the change of audio content (e.g., the audio content goes from having two-channel content to three or more channel content, and vice-versa), a detection of a certain time, a detection of a certain kind of entertainment (e.g., detecting that the user is watching television versus just listening to music), or any other event that is programmed to create a pair amongst playback devices. The event detection might occur by a controller, one of the playback devices, or some other device, for example.

According to certain embodiments, in an attempt to optimize the multi-channel pairing, the configuration of a playback device may include any of: changing the equalization of the playback device by changing the equalization of one or more specific speaker drivers and optimizing the synchronization between paired devices. Examples of changing the equalization are described more below.

These embodiments and many additional embodiments are described more below. Further, the detailed description is presented largely in terms of illustrative environments, systems, procedures, steps, logic blocks, processing, and other symbolic representations that directly or indirectly resemble the operations of data processing devices coupled to networks. These process descriptions and representations are typically used by those skilled in the art to most effectively convey the substance of their work to others skilled in the art. Numerous specific details are set forth in order to provide a thorough understanding of the present invention. However, it is understood to those skilled in the art that certain embodiments of the present invention may be practiced without certain, specific details. In other instances, well known methods, procedures, components, and circuitry have not been described in detail to avoid unnecessarily obscuring aspects of the embodiments.

Reference herein to "embodiment" means that a particular feature, structure, or characteristic described in connection with the embodiment can be included in at least one embodiment of the invention. The appearances of this phrase in various places in the specification are not necessarily all referring to the same embodiment, nor are separate or alternative embodiments mutually exclusive of other embodiments. The embodiments described herein, explicitly and implicitly understood by one skilled in the art, may be combined with other embodiments.

II. Example Environment

Referring now to the drawings, in which like numerals may refer to like parts throughout the several views. FIG. 1 shows an exemplary configuration 100 in which certain embodiments may be practiced. The configuration 100 may represent, but not be limited to, a part of a residential home, a business building, or a complex with multiple zones. There are a number of multimedia players of which three examples 102, 104 and 106 are shown as audio devices. Each of the audio devices may be installed or provided in one particular area or zone and hence referred to as a zone player herein. It is understood that a zone can comprise more than one zone player.

As used herein, unless explicitly stated otherwise, an audio source or audio sources are generally in digital format and can be transported or streamed over a data network. To facilitate the understanding of the example environment of FIG. 1, it is assumed that the configuration 100 represents a home. Though, it is understood that this technology is not limited to its place of application. Referring back to FIG. 1, the zone players 102 and 104 may be located in one or two of the bedrooms while the zone player 106 may be installed or positioned in a living room. All of the zone players 102, 104, and 106 are coupled directly or indirectly to a data network 108. In addition, a computing device 110 is shown to be coupled on the network 108. In reality, any other device such as a home gateway device, a storage device, or an MP3 player may be coupled to the network 108 as well.

The network 108 may be a wired network, a wireless network or a combination of both. In one example, all devices including the zone players 102, 104, and 106 are coupled to the network 108 by wireless means based on an industry standard such as IEEE 802.11. In yet another example, all devices including the zone players 102, 104, and 106 are part of a local area network that communicates with a wide area network (e.g., the Internet). In still another example, all devices including the zone players 102, 104 and 106 and a controller 142 forms an ad-hoc network and may be, specifically named, e.g., a household identifier: Smith Family, to be differentiated from a similar neighboring setup with a household identifier, e.g., Kallai Family.

Many devices on the network 108 are configured to download and store audio sources. For example, the computing device 110 can download audio sources, such as music or audio associated with videos, from the Internet the "cloud") or some other source and store the downloaded audio sources locally for sharing with other devices on the Internet or the network 108. The computing device 110 or any of the zone players 102, 104, and 106 can also be configured to receive streaming audio. Shown as a stereo system, the device 112 is configured to receive an analog audio source (e.g., from broadcasting) or retrieve a digital audio source (e.g., from a compact disk). The analog audio sources can be converted to digital audio sources. In accordance with certain embodiments, the various audio sources may be shared among the devices on the network 108.

Two or more zone players ((e.g., any two or more of the zone players 102, 104, and 106) may be grouped together to form a new zone group. Any combinations of zone players and an existing zone group may be grouped together. In one instance, a new zone group is formed by adding one zone player to another zone player or an existing zone group.

In certain embodiments, there are two or more zone players in one environment (e.g., a living room in a house). Instead of grouping these two zone players to play back the same audio source in synchrony, these two zone players may be configured to play two separate sounds in left and right channels. In other words, the stereo effects of a sound are reproduced or enhanced through, these two zone players, one for the left sound and the other for the right sound. Likewise, for a 3-channel (or 2.1 sound effects) sound, three such zone players may be reconfigured as if there are three speakers: left and right speakers and a subwoofer to form a stereo sound. The details of the reconfiguring the zone players and operating these audio products are described more below. Similar configurations with multiple channels greater than 3, such as 4, 5, 6, 7, 9 channels and so on) also apply. For example, configurations that use more than two channels may be useful in television and theater type settings, where video content such as in the form of television and movies is played together with audio content that contains more than two channels. Further, certain music might similarly be encoded with more than two channel sound.

In certain embodiments, two or more zone players may be consolidated to form a single, consolidated zone player. The consolidated zone player may further be paired with a single zone player or yet another consolidated zone player. A consolidated zone player may comprise one or more individual playback devices. Each playback device of a consolidated playback device is preferably set in a consolidated mode.

According to some embodiments, one can continue to do any of: group, consolidate, and pair until a desired configuration is complete. The actions of grouping, consolidation, and pairing are preferably performed through a control interface and not by physically connecting and re-connecting speaker wire, for example, to individual, discrete speakers to create different configurations. As such, certain embodiments described herein provide a more flexible and dynamic platform through which sound reproduction can be offered to the end-user.

It is understood that the technology described herein is not limited to its place of application. For example, it is understood that zones and zone players, and the embodiments described herein, may also be used in vehicles, on water craft, airplanes, amphitheaters, outdoors, along the streets in a village or city, and so on, in addition to homes, offices, gyms, schools, hospitals, hotels, movie theaters, malls, stores, casinos, museum, entertainment parks, or any other place where audio content is played. As such, it will be appreciated that the embodiments described herein may be used in connection with any system application for which multi-channel pairing is desired.

III. Example Playback Devices

Referring now to FIG. 2A, there is shown an exemplary functional block diagram of a zone player 200 in accordance with an embodiment. The zone player 200 includes a network interface 202, a processor 204, a memory 206, an audio processing circuit 210, a module 212, optionally, an audio amplifier 214 that may be internal or external, and optionally, a speaker unit 218 connected to the audio amplifier 214. The network interface 202 facilitates a data flow between a data network (i.e., the data network 108 of FIG. 1) and the zone player 200 and typically executes a special set of rules (i.e., a protocol) to send data back and forth. One of the common protocols used in the Internet is TCP/IP (Transmission Control Protocol/Internet Protocol). In general, a network interface 202 manages the assembling of an audio source or file into smaller packets that are to be transmitted over the data network or reassembles received packets into the original source or file. In addition, the network interface 202 handles the address part of each packet so that it gets to the right destination or intercepts packets destined for the zone player 200. Accordingly, in certain embodiments, each of the packets includes an IP-based source address as well as an IP-based destination address.

The network interface 202 may include one or both of a wireless interface 216 and a wired interface 217. The wireless interface 216, also referred to as an RF interface, provides network interface functions by a wireless means for the zone player 200 to communicate with other devices in accordance with a communication protocol (such as the wireless standard IEEE 802.11a, 802.11b, 802.11g, 802.11n, or 802.15.1). The wired interface 217 provides network interface functions by a wired means (e.g., an Ethernet cable). In one embodiment, a zone player includes both of the interfaces 216 and 217, and other zone players include only a RF or wired interface. Thus these other zone players communicate with other devices on a network or retrieve audio sources via the zone player. The processor 204 is configured to control the operation of other parts in the zone player 200. The memory 206 may be loaded with one or more software modules that can be executed by the processor 204 to achieve desired tasks. According to one embodiment, a software module implementing an embodiment, such as described herein, is executed, the processor 204 operates in accordance with the software module in reference to a saved zone group configuration characterizing a zone group created by a user, the zone player 200 is caused to retrieve an audio source from another zone player or a device on the network and synchronize the players in the zone group to play back the audio source as desired. According to another embodiment, a software module implementing an embodiment described herein creates a pair between two or more zone players to create a desired multi-channel audio environment.

According to one embodiment, the memory 206 is used to save one or more saved zone configuration files that may be retrieved for modification at any time. Typically, a saved zone group configuration file is transmitted to a controller (e.g., the controlling device 140 or 142 of FIG. 1, a computer, a portable device, or a TV) when a user operates the controlling device. The zone group configuration provides an interactive user interface so that various manipulations or control of the zone players may be performed.

In certain embodiments, the audio processing circuit 210 resembles the circuitry in an audio playback device and includes one or more digital-to-analog converters (DAC), an audio preprocessing part, an audio enhancement part or a digital signal processor and others. In operation, when an audio source is retrieved via the network interface 202, the audio source is processed in the audio processing circuit 210 to produce analog audio signals. The processed analog audio signals are then provided to the audio amplifier 214 for playback on speakers. In addition, the audio processing circuit 210 may include necessary circuitry to process analog signals as inputs to produce digital signals for, sharing with other devices on a network.

Depending on an exact implementation, the module 212 may be implemented as a combination of hardware and software. In one embodiment, the module 212 is used to save a scene. The audio amplifier 214 is typically an analog circuit that powers the provided analog audio signals to drive one or more speakers.

It is understood that zone player 200 is an example of a playback device. Examples of playback devices include those zone players that are commercially offered for sale by Sonos, Inc. of Santa Barbara, Calif. They currently include a ZonePlayer 90, ZonePlayer 120, and Sonos S5. The ZonePlayer 90 is an example zone player without a built-in amplifier, whereas the ZonePlayer 120 is an example zone player with a built-in amplifier. The S5 is an example zone player with a built-in amplifier and speakers. In particular, the S5 is a five-driver speaker system that includes two tweeters, two mid-range drivers, and one sub woofer. When playing audio content via the S5, the left audio data of a track is sent out of the left tweeter and left mid-range driver, the right audio data of a track is sent out of the right tweeter and the right mid-range driver, and mono bass is sent out of the subwoofer. Further, both mid-range drivers and both tweeters have the same equalization (or substantially the same equalization). That is, they are both sent the same frequencies, just from different channels of audio. While the S5 is an example of a zone player with speakers, it is understood that a zone player with speakers is not limited to one with a certain number of speakers (e.g., five speakers as in the S5), but rather can contain one or more speakers. Further, a zone player may be part of another device, which might even serve a primary purpose different than audio.

IV. Example Controller

Figure 2B:
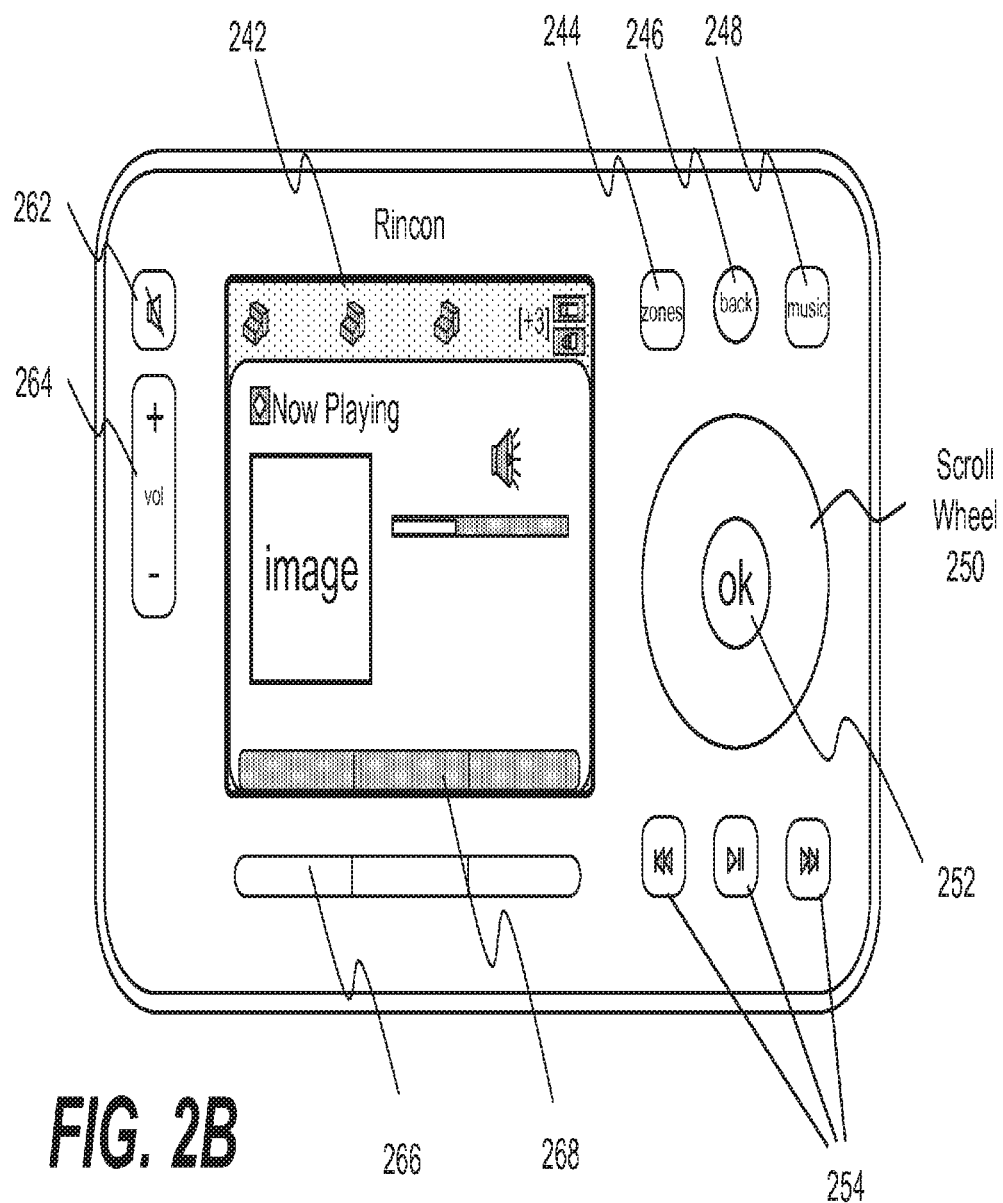
FIG. 2B shows an example of a controller that may be used to remotely control one or more players of FIG. 2A.

Referring now to FIG. 2B, there is shown an exemplary controller 240, which may correspond to the controlling device 140 or 142 of FIG. 1. The controller 240 may be used to facilitate the control of multi-media applications, automation and others in a complex. In particular, the controller 240 is configured to facilitate a selection of a plurality of audio sources available on the network, controlling operations of one or more zone players (e.g., the zone player 200) through a RF interface corresponding to the wireless interface 216 of FIG. 2A. According to one embodiment, the wireless means is based on an industry standard (e.g., infrared, radio, wireless standard IEEE 802.11a, 802.11b 802.11g, 802.11n, or 802.15.1). When a particular audio source is being played in the zone player 200, a picture, if there is any, associated with the audio source may be transmitted from the zone player 200 to the controller 240 for display. In one embodiment, the controller 240 is used to synchronize audio playback of more than one zone player by grouping the zone players in a group. In another embodiment, the controller 240 is used to control the volume of each of the zone players in a zone group individually or together.

In an embodiment, the controller 240 is used to create a pairing between two or more playback devices to create or enhance a multi-channel listening environment. For example, the controller 240 may be used to select and pair two or more playback devices. In addition, the controller 240 may be used to turn pairing on or off. The controller 240 may also be used to consolidate playback devices, and further to set a particular playback device in consolidated mode. Accordingly, in some embodiments, the controller 240 provides a flexible mechanism for dynamically configuring a multi-channel audio environment. In some instances, the pairing creates a multi-channel listening environment. In some instances, the pairing enhances a multi-channel listening environment by increasing the separation between devices. For example, two individual playback devices, which are positioned at a distance from each other, may provide more channel separation to the listener than the audio coming from only a single device.

The user interface for the controller 240 includes a screen 242 (e.g., a LCD screen) and a set of functional buttons as follows: a "zones" button 244, a "back" button 246, a "music" button 248, a scroll wheel 250, "ok" button 252, a set of transport control buttons 254, a mute button 262, a volume up/down button 264, a set of soft buttons 266 corresponding to the labels 268 displayed on the screen 242.

The screen 242 displays various screen menus in response to a user's selection. In one embodiment, the "zones" button 244 activates a zone management screen or "Zone Menu", which is described in more details below. The "back" button 246 may lead to different actions depending on the current screen. In one embodiment, the "back" button triggers the current screen display to go back to a previous one. In another embodiment, the "back" button negates the user's erroneous selection. The "music" button 248 activates a music menu, which allows the selection of art audio source (e.g., a song) to be added to a zone player's music queue for playback.

The scroll wheel 250 is used for selecting an item within a list, whenever a list is presented on the screen 242. When the items in the list are too many to be accommodated in one screen display, a scroll indicator such as a scroll bar or a scroll arrow is displayed beside the list. When the scroll indicator is displayed, a user may rotate the scroll wheel 250 to either choose a displayed item or display a hidden item in the list. The "OK" button 252 is used to confirm the user selection on the screen 242.

There are three transport buttons 254, which are used to control the effect of the currently playing song. For example, the functions of the transport buttons may include play/pause and forward/rewind a song, move forward to a next song track, or move backward to a previous track. According to one embodiment, pressing one of the volume control buttons such as the mute button 262 or the volume up/down button 264 activates a volume panel. In addition, there are three soft buttons 266 that can be activated in accordance with the labels 268 on the screen 242. It is understood that, in a multi-zone system, there may be multiple audio sources being played respectively in more than one zone players. The music transport functions described herein shall apply selectively to one of the sources when a corresponding one of the zone players or zone groups is selected.

Figure 2C:
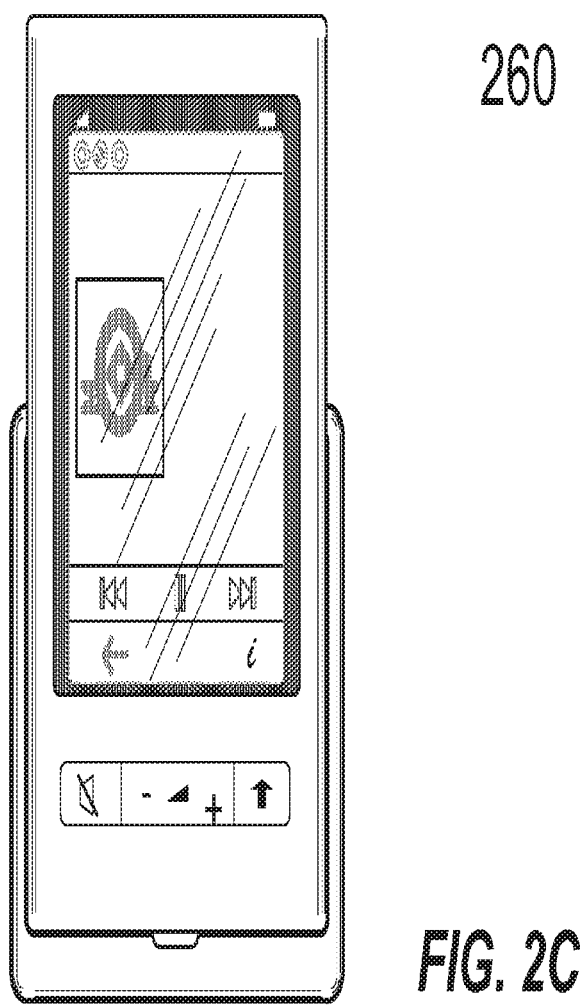
FIG. 2C shows an example of a controller that may be used to remotely control one or more players of FIG. 2A.

FIG. 2C shows an exemplary controller 260 which may correspond to the controlling device 140 or 142 of FIG. 1. The controller 260 is provided with a touch screen that allows a user to interact with the controller, for example, to navigate a playlist of many items, to control operations of one or more players. In one embodiment as it will be further shown in FIGS. 10A to 10F, a user may interact with the controller to make a multi-channel audio environment, such as create a stereo pair for example, and may even be used to separate the multi-channel audio environment, such as disengage a stereo pair. It should be noted that other network-enabled portable devices such as an iPhone, iPad or any other smart phone or network-enabled device may be used as a controller to interact or control multiple zone players in an environment (e.g., a networked computer such as a PC or Mac may also be used, as a controller). According to one embodiment, an application may be downloaded into a network enabled device. Such an application may implement most of the functions discussed above for the controller 240 using a navigating mechanism or touch screen in the device. Those skilled in the art will appreciate the flexibility of such an application and its ability to be ported to a new type of portable device given the detailed description herein.

Figure 2D:
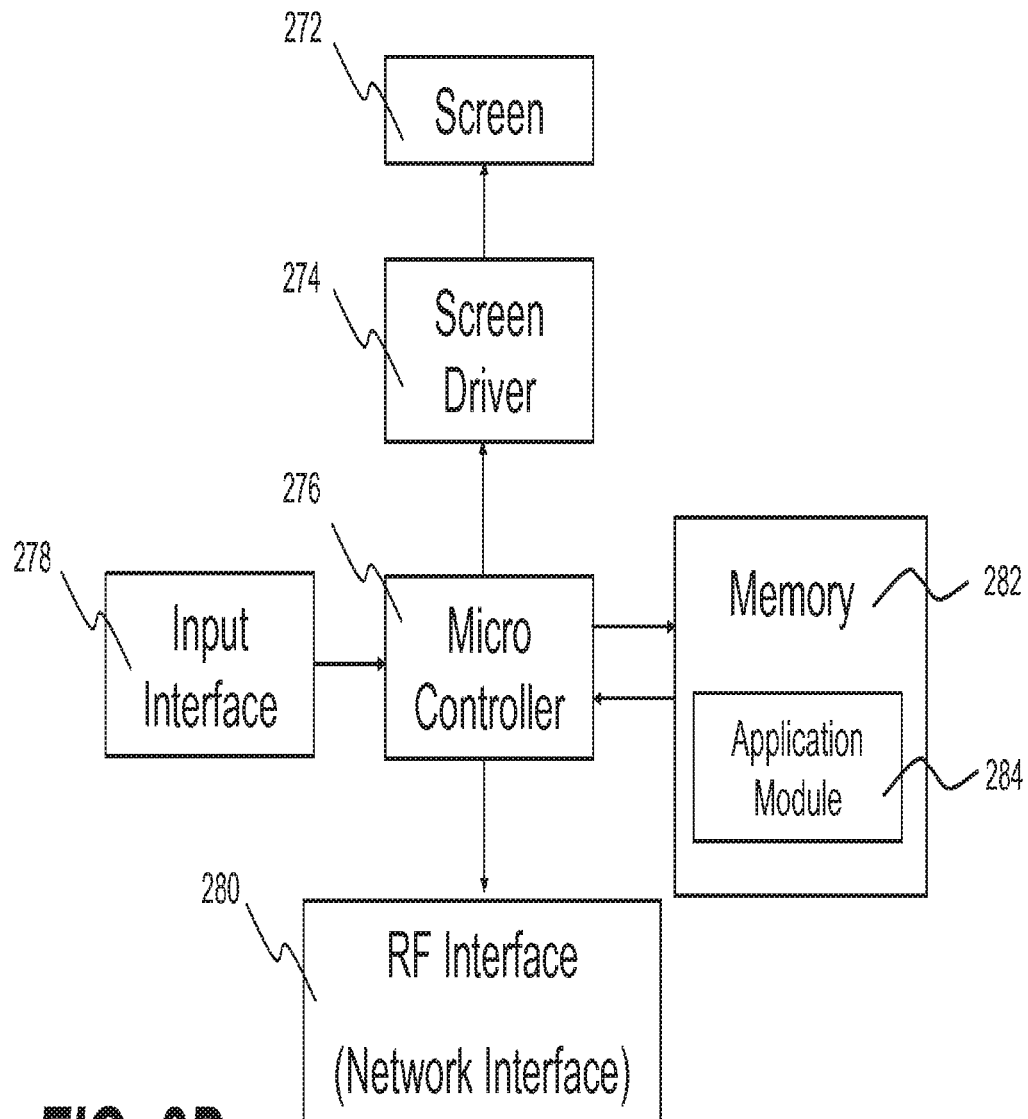
FIG. 2D shows an example internal functional block diagram of a controller in accordance with certain embodiments.

FIG. 2D illustrates an internal functional block diagram of an exemplary controller 270, which may correspond to the controller 240 of FIG. 2B, a computing device, smart phone, or any other communicative device. The screen 272 on the controller 270 may be an LCD screen. The screen 272 communicates with and is commanded by a screen driver 274 that is controlled by a microcontroller (e.g., a processor) 276. The memory 282 may be loaded with one or more application modules 284 that can be executed by the microcontroller 276 with or without a user input via the user interface 278 to achieve desired tasks. In one embodiment, an application module is configured to facilitate grouping a number of selected zone players into a zone group and synchronizing the zone players for one audio source. In another embodiment, an application module is configured to control together the audio sounds (e.g., volume) of the zone players in a zone group. In operation, when the microcontroller 276 executes one or more of the application modules 284, the screen driver 274 generates control signals to drive the screen 272 to display an application specific user interface accordingly, more of which will be described below.

The controller 270 includes a network interface 280 referred to as a RF interface 280 that facilitates wireless communication with a zone player via a corresponding RF interface thereof. In one embodiment, the commands such as volume control and audio playback synchronization are sent via the RF interfaces. In another embodiment, a saved zone group configuration is transmitted between a zone player and a controller via the RF interfaces. The controller 270 may control one or more zone players, such as 102, 104 and 106 of FIG. 1. Nevertheless, there may be more than one controller, each preferably in a zone (e.g., a room or rooms nearby each other) and configured to control any one and all of the zone players.

In one embodiment, a user creates a zone group including at least two zone players from the controller 240 that sends signals or data to one of the zone players. As all the zone players are coupled on a network, the received signals in one zone player can cause other zone players in the group to be synchronized so that all the zone players in the group play back an identical audio source or a list of identical audio sources in a timely synchronized manner such that no (or substantially no) audible delays or hiccups could be heard. Similarly, when a user increases the audio volume of the group from the controller, the signals or data of increasing the audio volume for the group are sent to one of the zone players and causes other zone players in the group to be increased together in volume and in scale.

According to one implementation, an application module is loaded in memory 282 for zone group management. When a predetermined key (e.g. the "zones" button 244) is activated on the controller 240, the application module is executed in the microcontroller 276. The input interface 278 coupled to and controlled by the microcontroller 276 receives inputs from a user. A "Zone Menu" is then displayed on the screen 272. The user may start grouping zone players into a zone group by activating a "Link Zones" or "Add Zone" soft button, or de-grouping a zone group by activating an "Unlink Zones" or "Drop Zone" button. The detail of the zone group manipulation will be further discussed below.

As described above, the input interface 278 includes a number of function buttons as well as a screen graphical user interface. It should be pointed out that the controller 240 in FIG. 2B is not the only controlling device that may practice the embodiments. Other devices that provide the equivalent control functions (e.g., a computing device, a hand-held device) may also be configured to practice the present invention. In the above description, unless otherwise specifically described, it is clear that keys or buttons are generally referred to as either the physical buttons or soft buttons, enabling a user to enter a command or data.

One mechanism for 'joining' zone players together for music playback is to link a number of zone players together to form a group. To link a number of zone players together, a user may annually link each zone player or room one after the other. For example, there is a multi-zone system that includes the following zones:
Bathroom
Bedroom
Den
Dining Room
Family Room
Foyer If a user wishes to link five of the six zone players using the current mechanism, the user may start with a single zone and then manually link each zone to that zone. This mechanism may be sometimes quite time consuming. According to one embodiment, a set of zones can be dynamically linked together using one command. Using what is referred to herein as a theme or a zone scene, zones can be configured in a particular scene (e.g., morning, afternoon, or garden), where a predefined zone grouping and setting of attributes for the grouping are automatically effectuated.

Figure 3A:
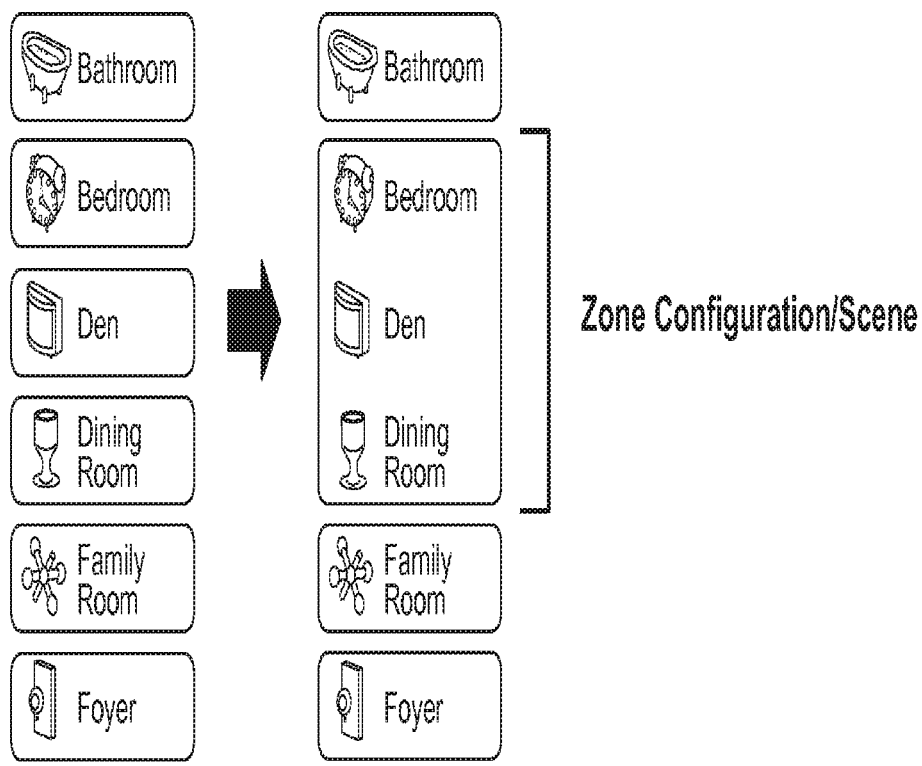
FIG. 3A provides an illustration of a zone scene configuration.

For instance, a "Morning" zone scene/configuration command would link the Bedroom, Den and Dining Room together in one action. Without this single command, the user would need to manually and individually link each zone. FIG. 3A provides an illustration of one zone scene, where the left column shows the starting zone grouping—all zones are separate, the column on the right shows the effects of grouping the zones to make a group of 3 zones named after "Morning".

Expanding this idea further, a Zone Scene can be set to create multiple sets of linked zones. For example, a scene creates 3 separate groups of zones, the downstairs zones would be linked together, the upstairs zones would be linked together in their own group, and the outside zones (in this case the patio) would move into a group of its own.

Figure 3B:
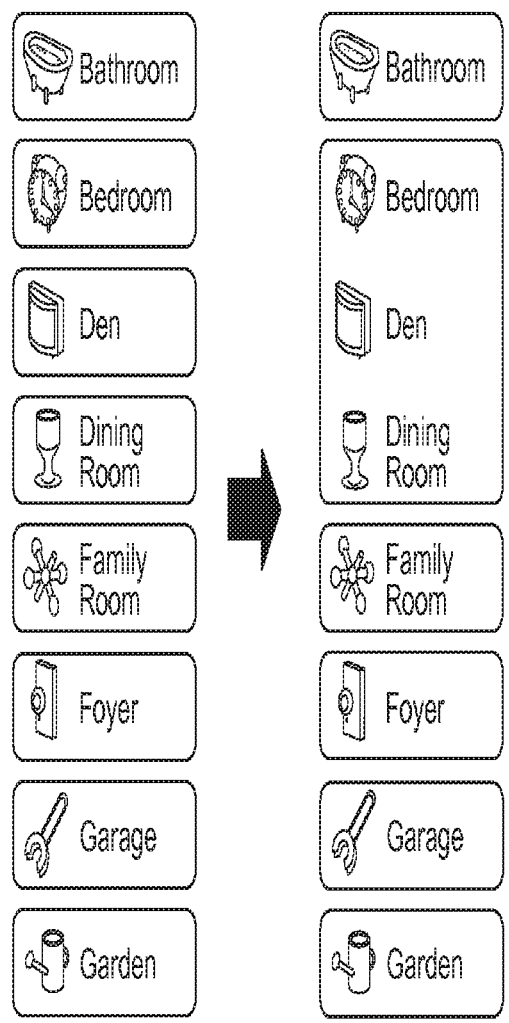
FIG. 3B shows that a user defines multiple groups to be gathered at the same time.

In one embodiment as shown in FIG. 3B, a user defines multiple groups to be gathered at the same time. For example: an "Evening Scene" is desired to link the following zones:
Group 1
Bedroom
Den
Dining Room
Group 2
Garage
Garden
where Bathroom, Family Room and Foyer should be separated from any group if they were part of a group before the Zone Scene was invoked.

A feature of certain embodiments is that zones do not need to be separated before a zone scene is invoked. In one embodiment, a command is provided and links all zones in one step, if invoked. The command is in a form of a zone scene. After linking the appropriate zones, a zone scene command could apply the following attributes:
Set volumes levels in each zones (each zone can have a different volume)
Mute/Unmute zones.
Select and play specific music in the zones.
Set the play mode of the music (Shuffle, Repeat, Shuffle-repeal)
Set the music playback equalization of each zone (e.g., bass treble).

A further extension of this embodiment is to trigger a zone scene command as an alarm clock function. For instance the zone scene is set to apply at 8:00 am. It could link appropriate zones automatically, set specific music to play and then stop the music after a defined duration. Although a single zone may be assigned to an alarm, a scene set as an alarm clock provides a synchronized alarm, allowing any zones linked in the scene to play a predefined audio (e.g., a favorable song, a predefined playlist) at a specific time or for a specific duration. If, for any reason, the scheduled music failed to be played (e.g., an empty playlist, no connection to a share, failed UPnP, no Internet connection for an Internet Radio station), a backup buzzer will sound. This buzzer will be a sound file that is stored in a zone player.

Figure 4:
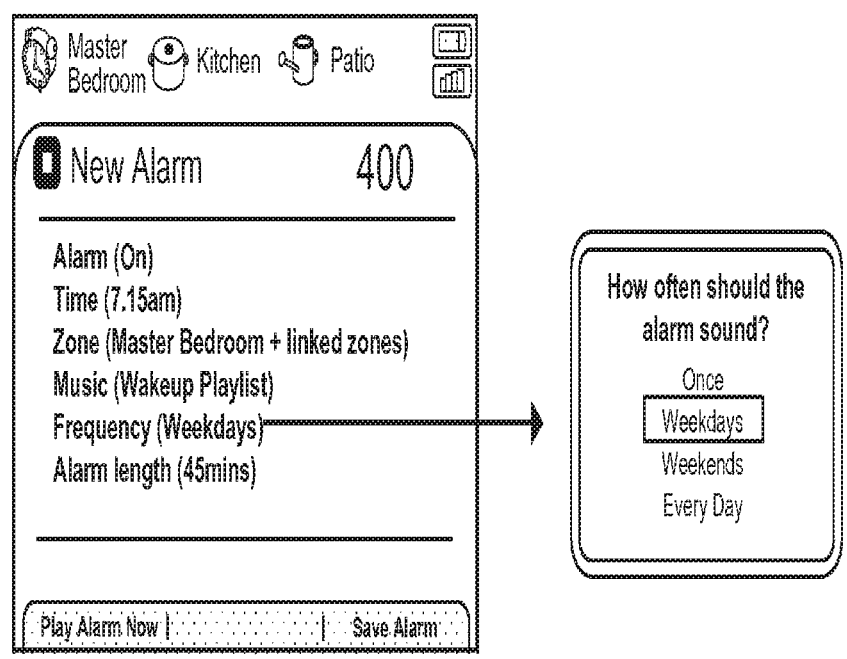
FIG. 4 shows an example user interface that may be displayed on a controller or a computer of FIG. 1.

FIG. 4 shows an exemplary user interface 400 that may be displayed on a controller 142 or a computer 110 of FIG. 1. The interface 400 shows a list of items that may be set up by a user to cause a scene to function at a specific time. In the embodiment shown in FIG. 4, the list of items includes "Alarm", "Time", "Zone", "Music", "Frequency" and "Alarm length". "Alarm" can be set on or off. When "Alarm" is set on, "Time" is a specific time to set off the alarm. "Zone" shows which zone players are being set to play a specified audio at the specific time. "Music" shows what to be played when the specific time arrives. "Frequency" allows the user to define a frequency of the alarm. "Alarm length" defines how long the audio is to be played. It should be noted that the user interface 400 is provided herein to show some of the functions associated with setting up an alarm. Depending on an exact implementation, other functions, such as time zone, daylight savings, time synchronization, and time/date format for display may also be provided.

According to one embodiment, each zone player in a scene may be set up for different alarms. For example, a "Morning" scene includes three zone players, each in a bedroom, a den, and a dining room. After selecting the scene, the user may set up an alarm for the scene as whole. As a result, each of the zone players will be activated at a specific time.

Figure 5A:
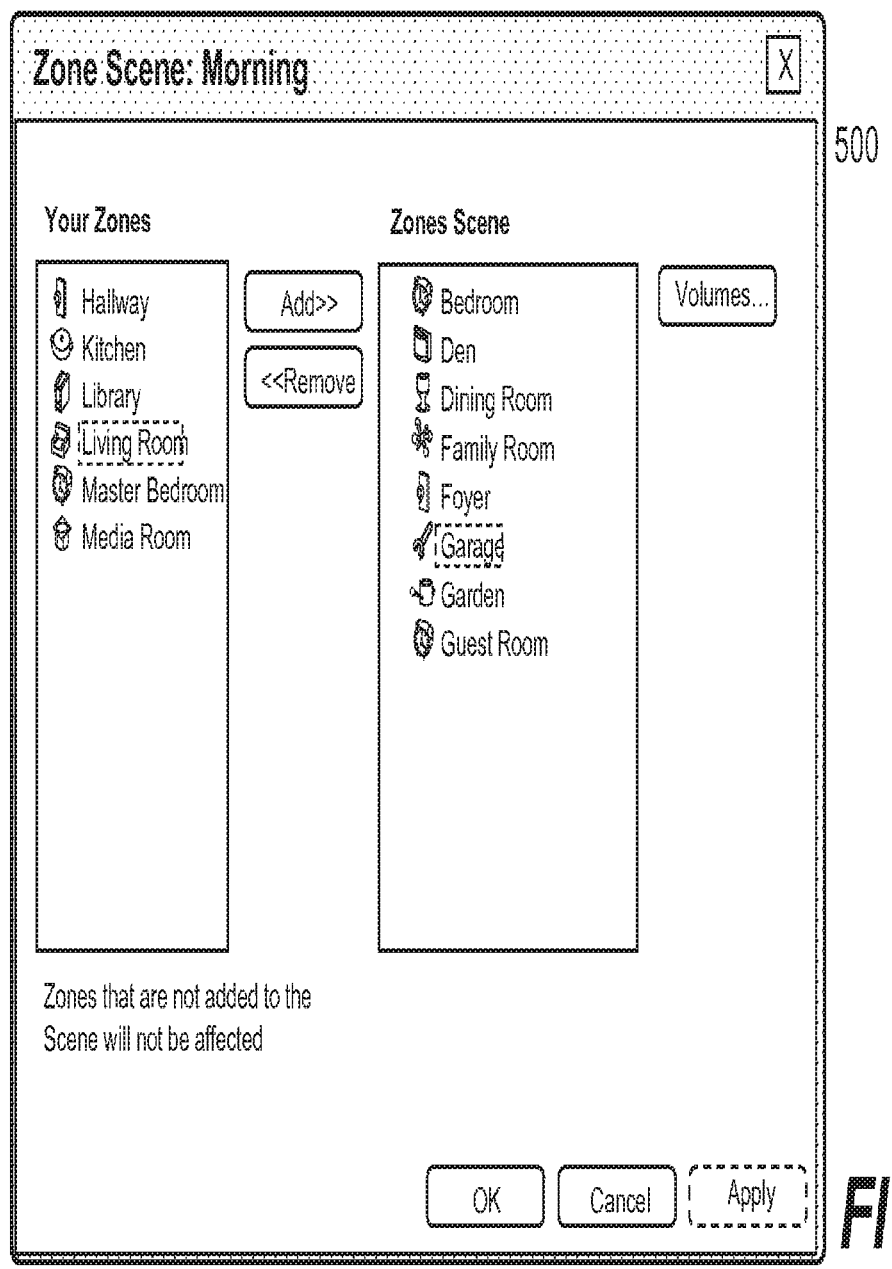
FIG. 5A shows an example user interface to allow a user to form a scene.

FIG. 5A shows a user interface 500 to allow a user to form a scene. The panel on the left shows the available zones in a household. The panel on the right shows the zones that have been selected and be grouped as part of this scene. Depending on an exact implementation of a user interface, Add/Remove buttons may be provided to move zones between the panels, or zones may be dragged along between panels.

Figure 5B:
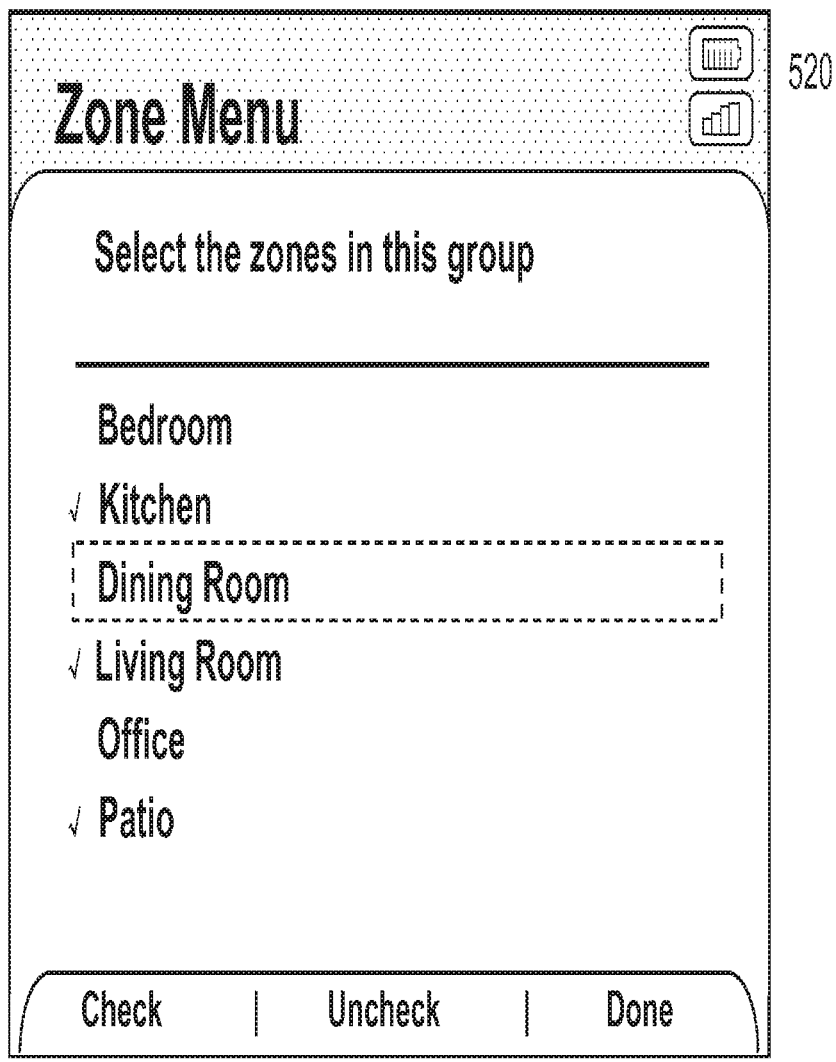
FIG. 5B shows another example user interface to allow a user to form a scene.

FIG. 5B shows another user interface 520 to allow a user to form a scene. The user interface 520 that may be displayed on a controller or a computing device, lists available zones in a system. A checkbox is provided next to each of the zones so that a user may check in the zones to be associated with the scene.

Figure 5C:
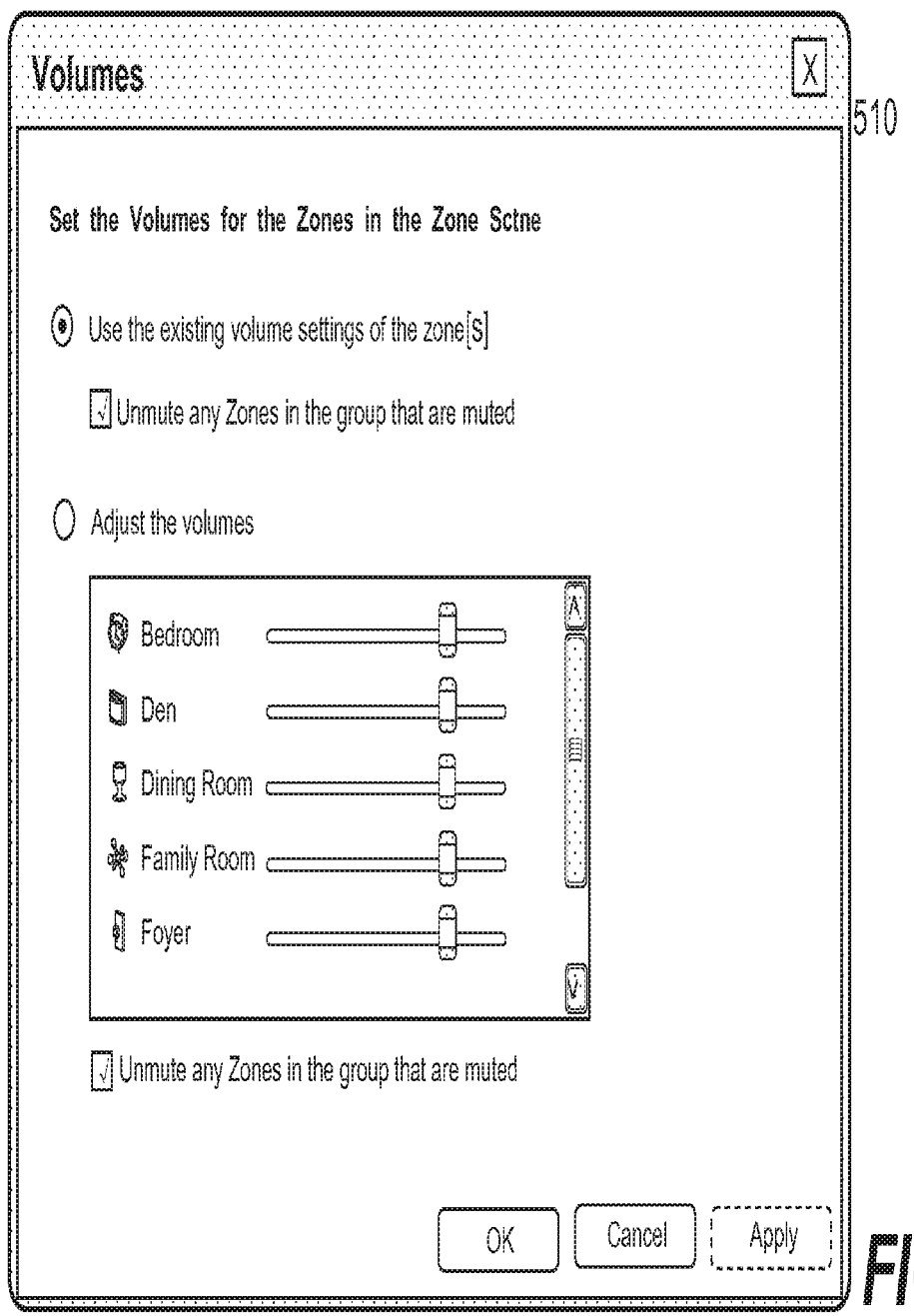
FIG. 5C shows an example user interface to allow a user to adjust a volume level of the zone players in a zone scene individually or collectively.

FIG. 5C shows a user interface 510 to allow a user to adjust a volume level of the zone players in a zone scene individually or collectively. As shown in the user interface 510, the 'Volumes . . . ' button shown as sliders, other forms are possible) allows the user to affect the volumes of the associated zone players when a zone scene is invoked. In one embodiment, the zone players can be set to retain whatever volume that they currently have when the scene is invoked. Additionally the user can decide if the volumes should be unmated or muted when the scene is invoked.

V. Providing Example Player Themes or Zone Scenes

Figure 6:
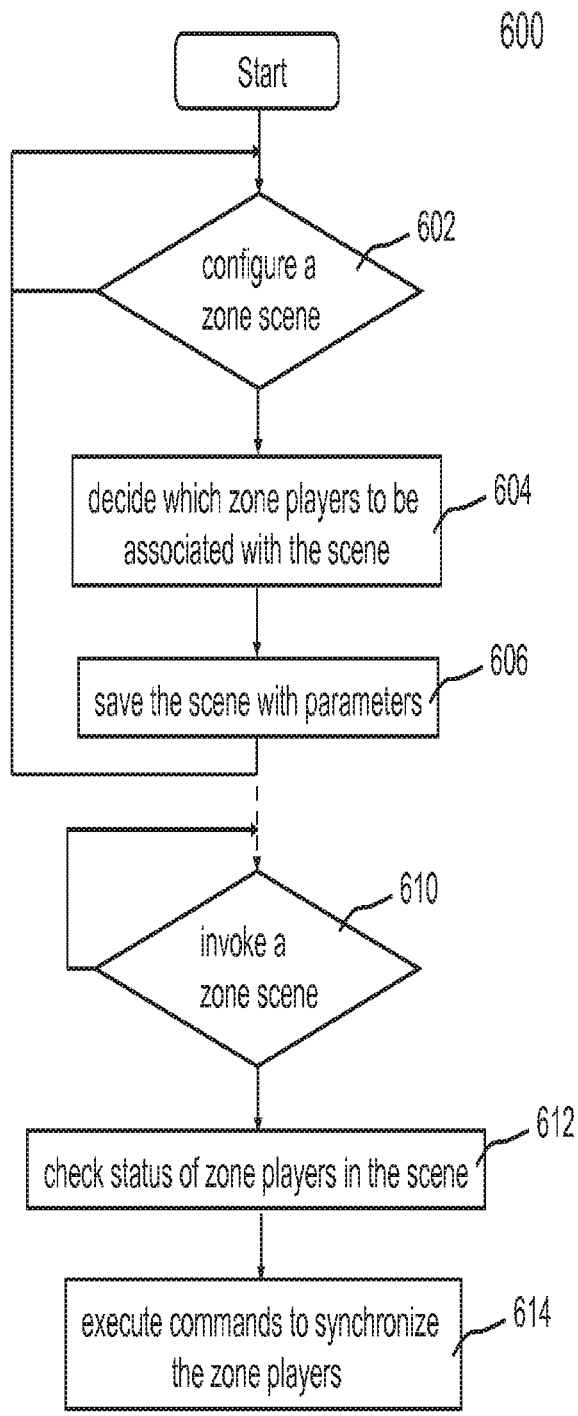
FIG. 6 shows a flowchart or process of providing a player theme or a zone scene for a plurality of players, where one or more of the players are placed in a zone.

FIG. 6 shows a flowchart or process 600 of providing a player theme or a zone scene for a plurality of players, where one or more of the players are placed in a zone. The process 600 is presented in accordance with one embodiment of the present invention and may be implemented in a module to be located in the memory 282 of FIG. 2C.

The process 600 is initiated when a user decides to proceed with a zone scene at 602. The process 600 then moves to 604 where it allows a user to decide which zone players to be associated with the scene. For example, there are ten players in a household, and the scene is named after "Morning". The user may be given an interface to select four of the ten players to be associated with the scene. At 606, the scene is saved. The scene may be saved in any one of the members in the scene. In the example of FIG. 1, the scene is saved in one of the zone players and displayed on the controller 142. In operation, a set of data pertaining to the scene includes a plurality of parameters. In one embodiment, the parameters include, but may not be limited to, identifiers (e.g., IP address) of the associated players and a playlist. The parameters may also include volume/tone settings for the associated players in the scene. The user may go back to 602 to configure another scene if desired.

Given a saved scene, a user may activate the scene at any time or set up a timer to activate the scene at 610. The process 600 can continue when, a saved scene is activated at 610. At 612, upon the activation of a saved scene, the process 600 checks the status of the players associated with the scene. The status of the players means that each, of the players shall be in condition to react in a synchronized manner. In one embodiment, the interconnections of the players are checked to make sure that the players communicate among themselves and/or with a controller if there is such a controller in the scene.

It is assumed that all players associated with the scene are in good condition. At 614, commands are executed with the parameters (e.g., pertaining to a playlist and volumes). In one embodiment, data including the parameters is transported from a member (e.g., a controller) to other members in the scene so that the players are caused to synchronize an operation configured in the scene. The operation may cause all players to play back a song in identical or different volumes or to play back a pre-stored file.

VI. Example Multi-Channel Environments

Figure 7:
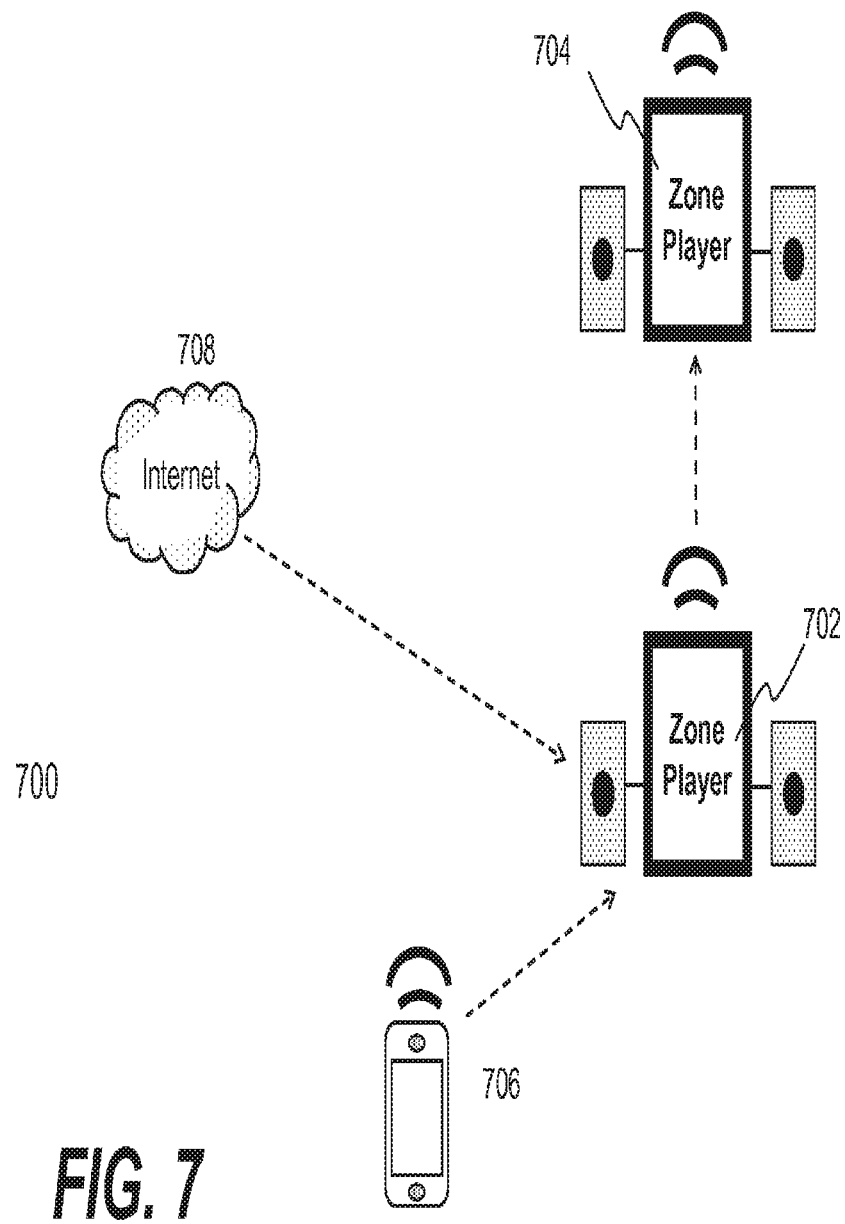
FIG. 7 shows an illustrative configuration in which an audio source is played back on two players in accordance to an embodiment.

FIG. 7 shows an example configuration in which an audio source is played back on two players 702 and 704, according to an example embodiment. These two players 702 and 704 may be located in and around one place (e.g., a hall, room, or nearby rooms) and are designated to play two sound tracks respectively. For example, an audio source may have left and right sound channels or tracks (e.g., stereo sound). Instead of grouping the players 702 and 704 to play back the audio source together in synchrony, where each player 702 and 704 plays the same audio content at substantially the same time, the players 702 and 704 can be paired to play different channels of the audio source in synchrony. As a result of pairing, the stereo sound effects can be simulated or enhanced via two players 702 and 704 versus one player or non of the players, for example.

In certain embodiments, each, player of players 702 and 704 includes a network interface, one or more speaker drivers (two or more speaker drivers in some instances, such as when the player can play in stereo mode absent pairing), an amplifier, and a processor, such as shown in FIG. 2A. The network interface receives audio data over a network. One or more amplifiers power the speaker drivers. The processor processes the audio data to be output through the speaker drivers. The processor may further configure a first equalization of the output from the speaker drivers in accordance with a first type of pairing and configuring a second equalization of the output from the speaker drivers in accordance with a second type of pairing.

In an embodiment, the two players 702 and 704 are configured to output a plurality of audio channels independent of each other. For example, each player 702 and 704 may be configured to output audio content in stereo independently from each other. Subsequent to pairing, one playback device (e.g., player 702) is configured to output a first subset of the plurality of audio channels and the other playback device (e.g., player 704) is configured to output a second subset of the plurality of audio channels. The first and second subsets are different. In this example, subsequent to pairing players 702 and 704, player 702 might play the right channel and player 704 might play the left channel. In another example, player 702 might play the right channel plus a center channel (e.g., in television or theater mode) and player 704 might play the left channel plus the center channel. Even in the latter example, the first and second subsets are different in that player 702 is playing channels Right+Center and player 704 is playing channels Left+

Center. In yet another embodiment, subsequent to pairing, player 702 might play all channels except certain bass frequencies, which may be played via player 704, thereby using player 704 as a subwoofer.

In another embodiment, a collection of three or more playback devices (e.g., players 702, 704, and one or more additional players) are each configured to output a plurality of audio channels independent of another playback device in the collection. Subsequent to pairing, each of the playback devices is configured to output a generally different audio channel(s) from the collection. This embodiment is particularly useful in a television or movie theater setting where a particular playback device of the multiple playback devices is configured to output in two-channel or stereo mode at one time (e.g., when playing a song), and subsequent to pairing, is configured to output as a front-right channel, a front-center channel, a front-left channel, a rear-right channel, a rear-left channel, and so on e.g., when watching a movie or television).

In another embodiment, one of the paired playback devices (e.g., player 702 or player 704) processes the data of the audio item, essentially separating the data into channels, each of the channels representing a single-sound track, for example, and being played back in one of the playback devices, thus creating or enhancing a multi-channel listening environment. In an alternative embodiment, both playback devices (e.g., players 702 and 704) may receive and process the data of the audio item and each playback device may output only the audio content designated for the respective player. For example, player 702 might receive both left and right channel audio, but only play the left channel, whereas player 704 might also receive both left and right channel audio, but only play the right channel.

In another embodiment, two or more playback devices (e.g., players 702 or 704) may be grouped into a single or consolidated playback device and the consolidated playback device (e.g., consolidated player 702+704) may be paired with, one or more playback devices. For instance, two playback devices maybe grouped into a first consolidated playback device and two additional playback devices maybe grouped into a second consolidated playback device. Then, the first and second consolidated playback devices may be paired to create or enhance a multi-channel listening environment.

In certain embodiments, a playback device (e.g., either player 702 or 704) that is configured to output an audio channel is paired with one or more additional playback devices, such that the playback device is configured to output a different audio channel than previously configured. For instance, the playback device might be configured to output a right channel in stereo mode, but subsequent to being paired with one or more additional playback devices, might be configured to output a rear, right channel in theater mode. The playback device may be paired to one or more other playback devices.

In certain embodiments, a playback device (e.g., either player 702 or 704) that is configured to output a plurality of audio channels is paired with one or more additional playback devices, such that the playback device is configured to output a subset of the plurality of audio channels relative to the one or more additional playback devices. For instance, the playback device might be configured to output in two-channel or stereo mode, but subsequent to being paired with one or more playback devices might be configured to output a right or left channel. The playback device may be paired to one or more other playback devices.

According to certain embodiments, the action of pairing two or more playback devices is triggered based on a command from a user via a control interface (e.g., a manual command) or responsive to an event (e.g., an automatic command). For example, using a controller, a user can create a pairing between two or more playback devices or disengage the pairing between two or more playback devices. In another example, pairing may be triggered by the audio content itself, a signal received from a source device, or some other predefined event, such that pairing occurs when the event is detected by the controller or playback device, for example. In addition, another device might be programmed to detect the event and provide a pairing signal to the controller and/or playback devices.

Further, it is understood that going from a configuration of no pairing (unpaired or non paired) to a configuration of pairing or from one kind of pairing (e.g., a pairing used in a Type of stereo mode or theater mode) to a different kind of pairing (e.g., another pairing used in a type of stereo mode or theater mode) are all various types of "pairing" that can occur according to certain embodiments. In addition, disengaging a pairing between multiple playback devices might go from pairing to no pairing or from pairing of a first kind back to pairing of a previous kind, for example.

In one example, a first type of pairing might include "no pairing" with another playback device and a second type of pairing might include pairing with one or more additional playback devices. In a second example, a first type of pairing might include pairing with a second playback device and a second type of pairing might include pairing with a plurality of playback devices. In a third example, a first type of pairing might include reproducing two channel sound via the speaker drivers and a second type of pairing comprises reproducing no more than one channel of the two channel sound via the speaker drivers. In a fourth example, a first type of pairing might comprise reproducing a first audio channel via the speaker drivers and the second type of pairing might include reproducing a second audio channel via the speaker drivers. In a fifth example, a first type of pairing might include reproducing the audio content via the speaker drivers in stereo mode and a second type of pairing might include reproducing the audio content via the speaker drivers in theater mode. In a sixth example, a first type of pairing might include reproducing the audio content via the speaker drivers and a second type of pairing comprises reproducing the audio content via the speaker drivers when in consolidated mode. It is understood that various variations and modifications may be made to the examples described just above with the attainment of some or all of the advantages of the technology described herein.

According to certain embodiments, the configuration of a playback device may include any of: changing the equalization of the playback device by changing the equalization, of one or more specific speaker drivers and optimizing the synchronization between paired devices. Changing the equalization, of the playback, device might include any of: turning on or off (or effectively muting) one or more specific speaker drivers, changing the channel output of one or more speaker drivers, changing the frequency response of one or more specific speaker drivers, changing the amplifier gain of any particular speaker driver, changing the amplifier gain of the playback device as a whole.

In certain embodiments, changing the equalization of a playback device (e.g., changing the equalization of one or more speaker drivers of the playback device) may affect frequency dependent parameters. Examples might include the adjustment of the strength of frequencies within the audio data, a phase adjustment, and time-delay adjustment. In addition, a particular equalization may use a first type of pass filter, such as one that attenuates high, middle, or low frequencies, for example, while allowing other frequencies to pass unfiltered (or substantially unfiltered). Filters might also be different kinds or of a different order (e.g., first order filter, second order filter, third order filter, fourth order filter, and so on). For example, a first equalization of a playback device might include using a first type of pass filter to modify the output based on a first type of pairing and a second equalization of the playback device might include using a second type of pass filter to modify the output based on the second type of pairing. In this example, the first and second type of pass filters have one or different properties and/or behaviors, thus changing the equalization and sonic behavior of the device.

By way of illustration, when two S5 devices are paired to create a stereo pair, for example, one S5 device may be configured as the "left" and the other S5 device may be configured as the "right." In one embodiment, the user may determine which is left or right. In this configuration, for example, the left and right audio data may be sent to both S5 devices, but the left audio data of the track is played out of the S5 device configured as left and the right audio data of a track is played out of the S5 device configured as right. In addition, the equalization of each S5 device is changed in an attempt to reduce or eliminate certain constructive or destructive interference. For example, one tweeter on each S5 device may be turned off or substantially muted. In certain embodiments, the crossover frequency to each driver may even be changed from a previous configuration so that two or more drivers are not necessarily outputting the exact same audio data, otherwise constructive and/or destructive interference may occur. In certain embodiments, the amplifier gain is adjusted for a particular speaker driver and/or for the playback device as a whole.

In operation, according to certain embodiments, a controller 706 (e.g., a controller 142 of FIG. 1 or 240 of FIG. 2B or a portable device) is used to initiate the operation. Through a user interface, the controller 706 causes a player 702 to retrieve the audio source, provided the audio source is on a network 708 (e.g., the Internet or a local area network). Similarly, the controller 706 may also cause a designated device e.g., another networked device) to establish a communication session with the player 702 to deliver the requested audio source. In any case, either one or both of the players 702 and 704 may have access to the data representing the audio source.

In certain embodiments, a module in the player 702 is activated to process the data. According to one embodiment, the right and left sound tracks are separated. One sound track is retained locally in one player and the other sound track is pushed or uploaded to the other device (e.g., via an ad-hoc network). When the right and left sound tracks are played back simultaneously or substantially simultaneously, the stereo sound effect can be appreciated.

In another embodiment, several tracks are separated, such as in television or theater mode. For example, the tracks may be separated into a center channel, right front channel, left front channel, right rear channel, left rear channel, and so on. Accordingly, one or more sound tracks may be retained locally in one player and the other sound tracks are pushed or uploaded to the other devices.

In yet another embodiment, one player might process the data and retain one or more tracks locally, while the remaining data is sent onto another player. The receiving player may then process the data and retain one or more tracks locally and send any remaining data onto another player. This process, or one like it, may continue until all of the tracks are retained locally by corresponding player devices.

In yet another embodiment, each player might receive and process the data and play only the channel or channels that arc designated for that player.

In certain embodiments, it is important to maintain good synchronization, especially when pairing two or more independently clocked playback devices so that the multi-channel audio content is played back as it was originally intended. According to an embodiment, a message may be initiated from one device to another that is also activated to send back an acknowledgement. Upon receiving the acknowledgement, the time delay in transporting data from one device to another can be measured. The time delay will be considered when synchronizing the two players to play back the two separated sound tracks. In certain embodiments, if sending a packet (e.g., a packet in accordance with SNTP protocol) to a playback device and receiving a response takes more than fifteen milliseconds, for example, the timing information contained within that packet, such as clock information, is discarded. If sending and receiving a packet is less than fifteen milliseconds, then the information from the packet is used to adjust playback, if so necessary.

Additional details of synchronizing operations of two or more independently clocked players are provided in commonly assigned U.S. application Ser. No. 10/816,217, filed Apr. 1, 2004, entitled "System and Method For Synchronizing Operations Among A Plurality Of Independently Clocked Digital Data Processing Devices" which is hereby incorporated by reference.

Figure 8:
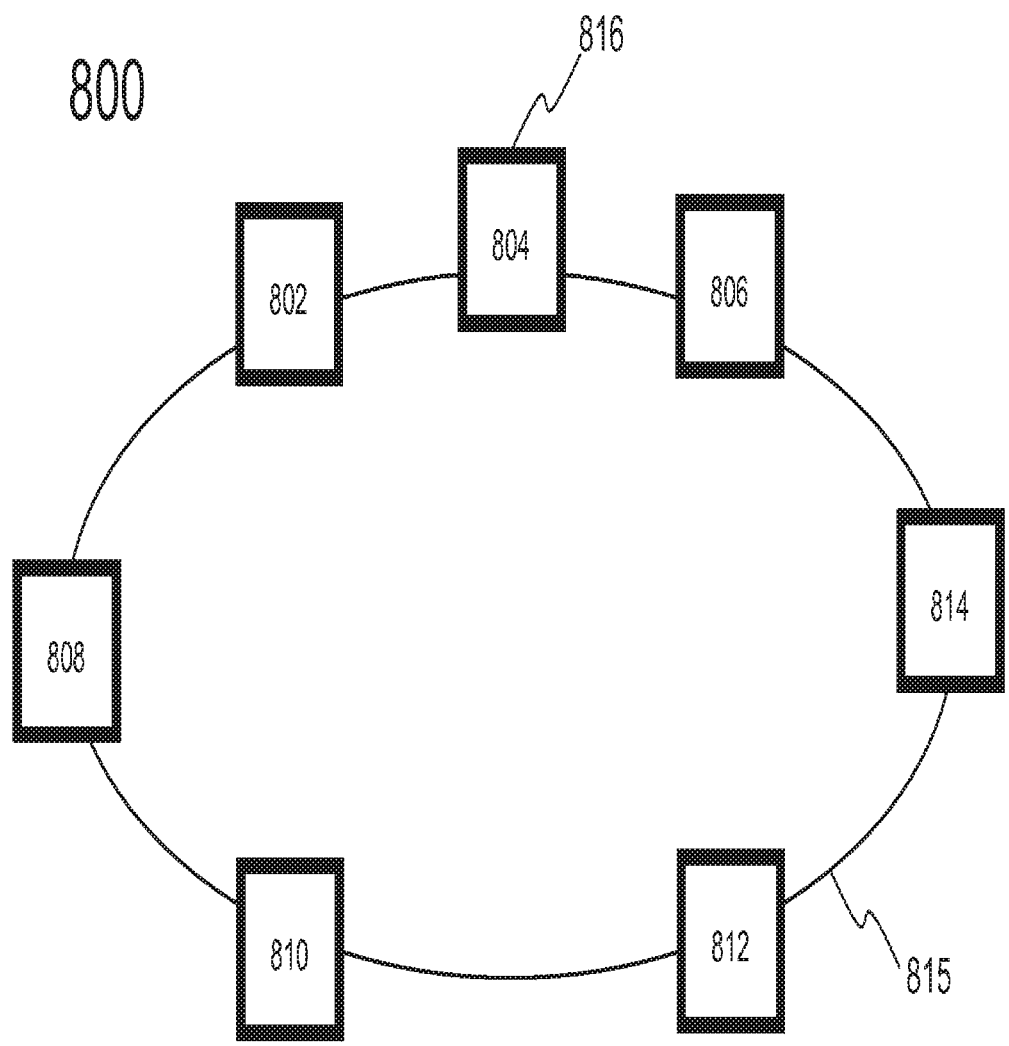
FIG. 8 shows an illustrative configuration of a pairing amongst multiple players in accordance to an embodiment.

FIG. 8 shows an example configuration of a pairing amongst multiple players 802, 804, 806, 808, 810, and 812 in a theater-like environment, in accordance to an embodiment. Player 802 may operate as a front-left channel, player 804 may operate as a center channel, player 806 may operate as a front-right channel, player 808 may operate as a subwoofer, player 810 may operate as a rear, right channel, and player 812 may operate as a rear, right channel. In this example, the players 802, 804, 806, 808, 810, and 812 are wirelessly coupled over network 815 so as to receive and transmit data over a wireless network, and obtain power from power outlets in the wall or through some other power source (e.g., a battery). Players 802, 804, 806, 808, 810, and 812 may be wired, if so configured in an alternate embodiment. Controller 814 may be a network-enabled device, examples of which include a smart phone, tablet computer, laptop computer, desktop computer, or a television.

In one embodiment, a designated player, such as player 804, receives multi-channel audio content from a source 816. Source 816 might include audio and/or video content downloaded or streamed from the Internet, a DVD or Blu-Ray player, or from some other source of audio and/or video content. Player 804 separates the multi-channel audio and sends respective audio channels to its playback owner. For example, if a particular audio channel is designated for the front, right speaker, then that content is wirelessly directed from player 804 to player 802, and so on. Players 802, 804, 806, 808, 810, and 812 play the audio content synchronously, so as to create a multi-channel listening environment. Moreover, if source 816 provides video content along with audio content, then the audio content is preferably played in synchrony with the video content.

In another embodiment, each player of players 802, 804, 806, 808, 810, and 812 may separate out its own one or more channels for playback. That is, either all audio content, or a portion thereof, is sent to each player (e.g., from source 816 or another playback device) and the player itself obtains its own data for playback.

In addition, players 802, 804, 806, 808, 810, and 812 may be reconfigured to operate in many different configurations, such as described above. For example, players 802 and 806 may be paired to operate in stereo mode, while the other players remain in sleep mode or turned off (player 808 may remain on in any particular configuration, if so desired and configured, because it is operating as a subwoofer). In another example, players 802 and 810 may be consolidated and output left channel audio, while players 806 and 812 may be consolidated and output right channel audio. In yet another example, some of players 802, 804, 806, 808, 810, and 812 are consolidated into a single player and paired with additional playback devices, such as in an adjacent room. In a further example, players 802, 804, 806, 808, 810, and 812 are grouped and not paired, when the audio content is music (versus movie content, for example). These are just some configuration examples. Many other configurations are possible using the teachings described herein.

Figure 9:
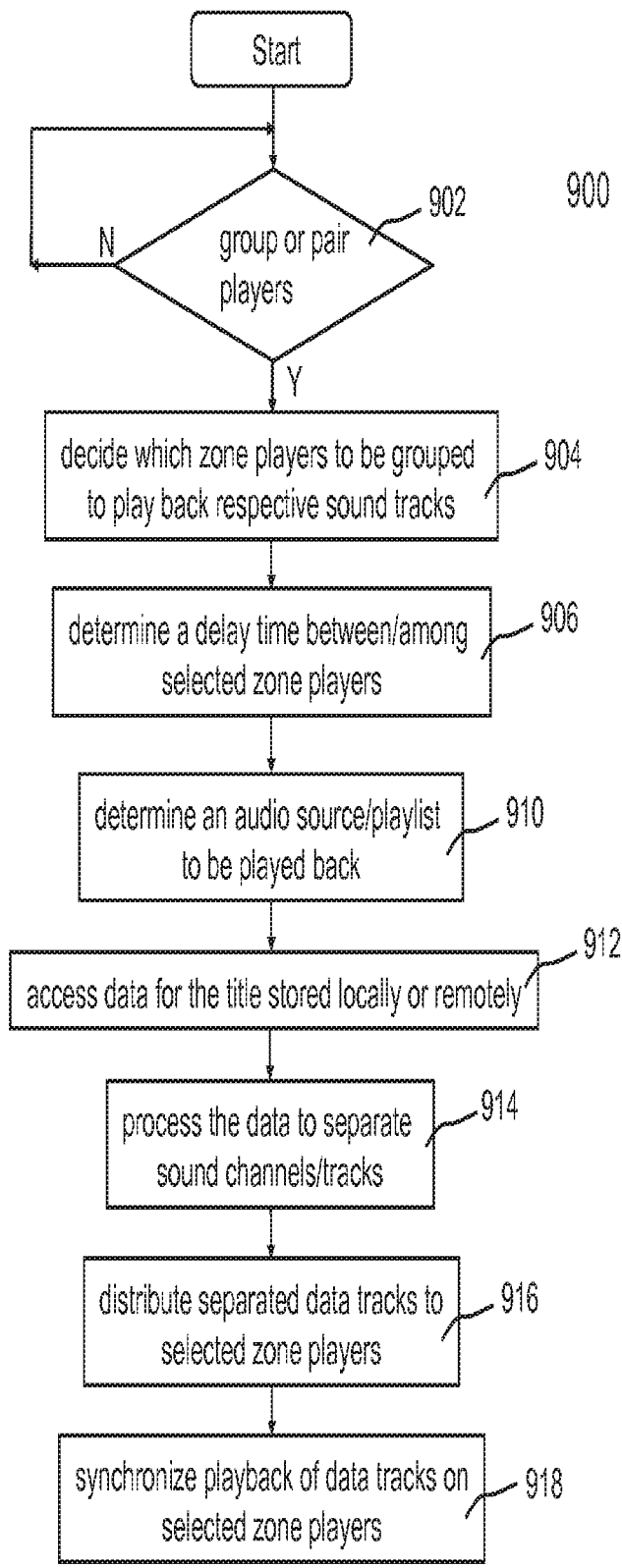
FIG. 9 shows a flowchart or process of grouping a plurality of audio products to play separated sound tracks in synchronization to simulate a multi-channel listening environment.

FIG. 9 shows a flowchart or process 900 of grouping a plurality of audio products to play separated sound tracks in synchronization to simulate a multi-channel listening environment. The process 900 is presented in accordance with certain embodiments and may be implemented in a module to be located in the memory 282 of FIG. 2D. To facilitate the description of process 900, a listening environment of stereo sound with left and right channels is described. Those skilled in the art can appreciate that the description can be equally applied to other forms of multi-channel listening environment (e.g., three, five, seven channel environments).

Typically, there is a plurality of players being controlled by one or more controllers, where these players are disposed in various locations. For example, there are five players in a house; three of them are respectively disposed in three rooms while two players are disposed in a larger room. Accordingly, these two players would be candidates to be paired to simulate a stereo listening environment, instead of just playing synchronized audio from both in a grouped fashion. In another example, there are four players in a large space or adjacent spaces, two pairs of the players may be paired to simulate a stereo listening environment, in which two players in one consolidated pair can be grouped to play back one (left) sound track and the other two in the other consolidated pair can be grouped to play back one (right) sound track.

In any case, two groups of players or two players are decided to be paired at 902. If no players are paired, the process 900 will not be activated. It is assumed that two players from a group of players being controlled by a controller are selected to be paired at 902. The process 900 proceeds.

At 904, a user may decide which player s to play back which sound track. Depending on the location of the user or listener(s) with respect to the selected players, it is assumed that a player or unit A is chosen to play back a left sound track and another player or unit B is chosen to play back a right sound track. In an alternative embodiment, the players themselves (or the controller) may automatically determine which, unit is configured to play the right channel and which unit is configured to play the left channel without input from the user.

According to one embodiment, a time delay in transporting data between the two units A and B is measured at 906. This time delay may facilitate sound synchronization between the two units as one of the units will receive a processed sound track from the other. The user may continue to operate on a controller to select a title (e.g., an audio source or an item from a playlist) for playback on the two units at 910.

Once the title is determined at 912, the data for the title is accessed. Depending on where the data is located, the controller may be configured to cause one of the two units to obtain or stream in the data. In one embodiment, the controller or unit A initiates a request to a remotely-networked device providing or storing the data. Assuming an authentication procedure, if any, completes successfully, the remote device starts to upload the data to the unit A. Likewise, if the data is locally stored in the unit A, the data can be accessed locally without requesting the same from the network. As the data is being received or accessed in the unit A, a processing module is activated in the unit A to process the data, essentially separating the data into two streams of sound tracks at 914. In an alternative embodiment, each unit may receive and process the data, essentially separating the data into a stream to be played by the respective unit.

At 916, one of the streams is uploaded from the unit A to unit B via a local network (e.g., the ad-hoc network formed by all the players being controlled by the controller). As the streams are being distributed, the two units are configured to play back the streams respectively, each reproducing the sound of a single sound track at 918. Together, in synchrony, the two units create a stereo sound listening environment.

It should be noted that the delay time, if noticeable, may be incorporated into the unit A to delay the consumption of the stream by the delay time to synchronize with the unit B. Alternatively, a non-selected player may be used to process a streaming data of the title and configured to supply two streams to the pair of players, thus equalizing the delay time that would be otherwise experienced by the unit B.

FIGS. 10A-10F show illustrative screenshots of a controller for creating a stereo pair in accordance with certain embodiments. The screenshots are from a computing device (e.g., a tablet computer, laptop, or desktop) used as a controller. Those skilled in the art can appreciate that FIGS. 10A-10F may be readily modified to be used in a portable device with network capability, such as, for example, iPhone or iTouch or other smart phone or other network-enabled devices. Additionally, the controller might exist as part of a player itself or directly/indirectly coupled to the player, and therefore such screenshots may be modified accordingly—such a controller need not have network capability as the player will have network connectivity.

Figure 10A:
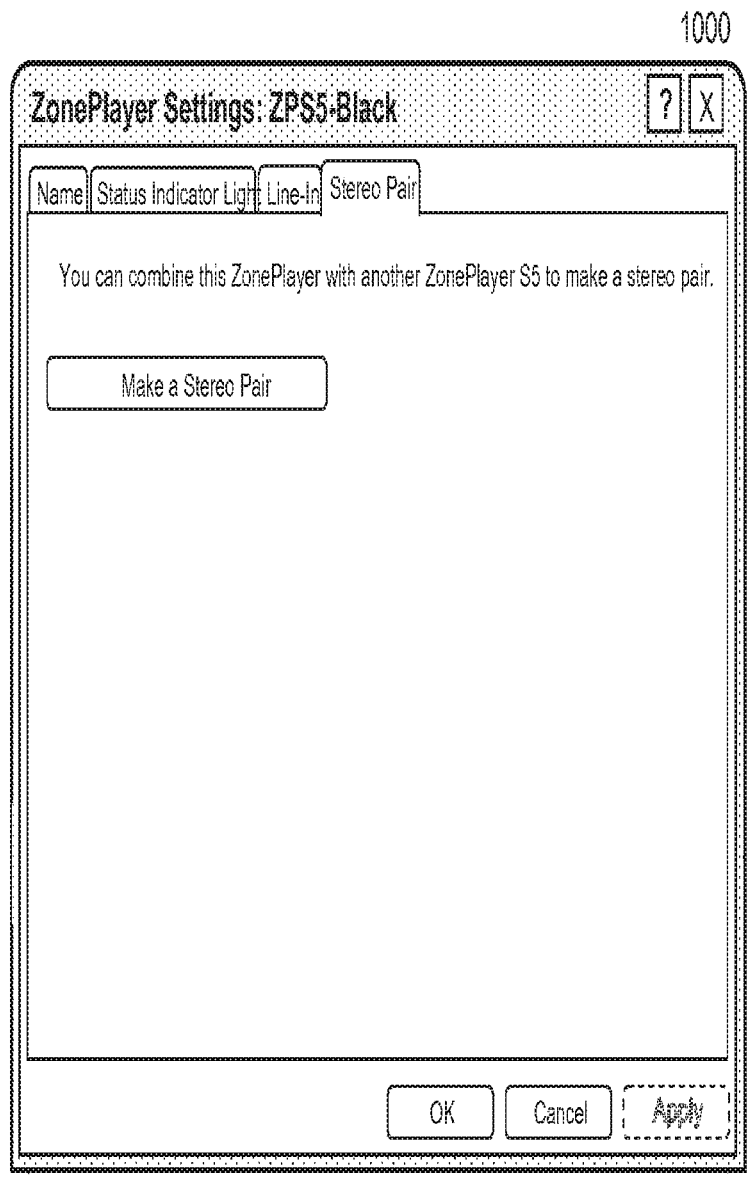
FIGS. 10A to 10F show example snapshots of a controller used in certain embodiments.

FIG. 10A shows a graphic interface 1000 that may be displayed on a controller when a user desires to create a stereo pair with two players in a system. It is understood that the system may include two or more players. If a stereo pair is desired, such as discussed with respect to the example of FIGS. 10A-10F, then any two players (one or both of which may be a consolidated player) in the system may be paired. However, if pairing more than two players is desired, such as creating an environment which is capable of playing more than two channel audio data, then the graphic interface 1000 may include an additional option or options. For example, an option might include "Make a Movie Surround Sound Pairing," "Make a Music Surround Sound Pairing," or "Make a Dolby Pro Logic Pairing." Any descriptive language may be used to appropriately indicate to the user the type of pairing that can be created. Upon selecting an option, a setup wizard on the controller may help the user appropriately configure the system such that multi-channel discrete audio may be effectively realized by the system.

Turning back to FIG. 10A, the interface 1000 allows a user to initiate a stereo pair with a zone player named "ZPS5-Black." In certain embodiments, the system recognizes that ZPS5-Black is part of a particular zone (e.g., kitchen, family room, bedroom, and so on). The system may allow the user to pair ZPS5-Black with another player in the same zone only, or alternatively, the system may allow the user to pair ZPS5-Black with another player in a different zone (such as an adjacent zone). Pairing players in different zones may be particularly useful when an open space is divided into two or more zones (e.g., an open space might include a kitchen and family room, for example).

Additionally, the system may be programmed such that pairing players from different zones creates another zone to reflect the players in paired mode (e.g., a single kitchen-family room zone during paired operation might originate from a kitchen, zone and a family room zone during non-paired operation). In such an embodiment, a user may be able to switch between zones or dynamically create new zones.

Figure 10B:
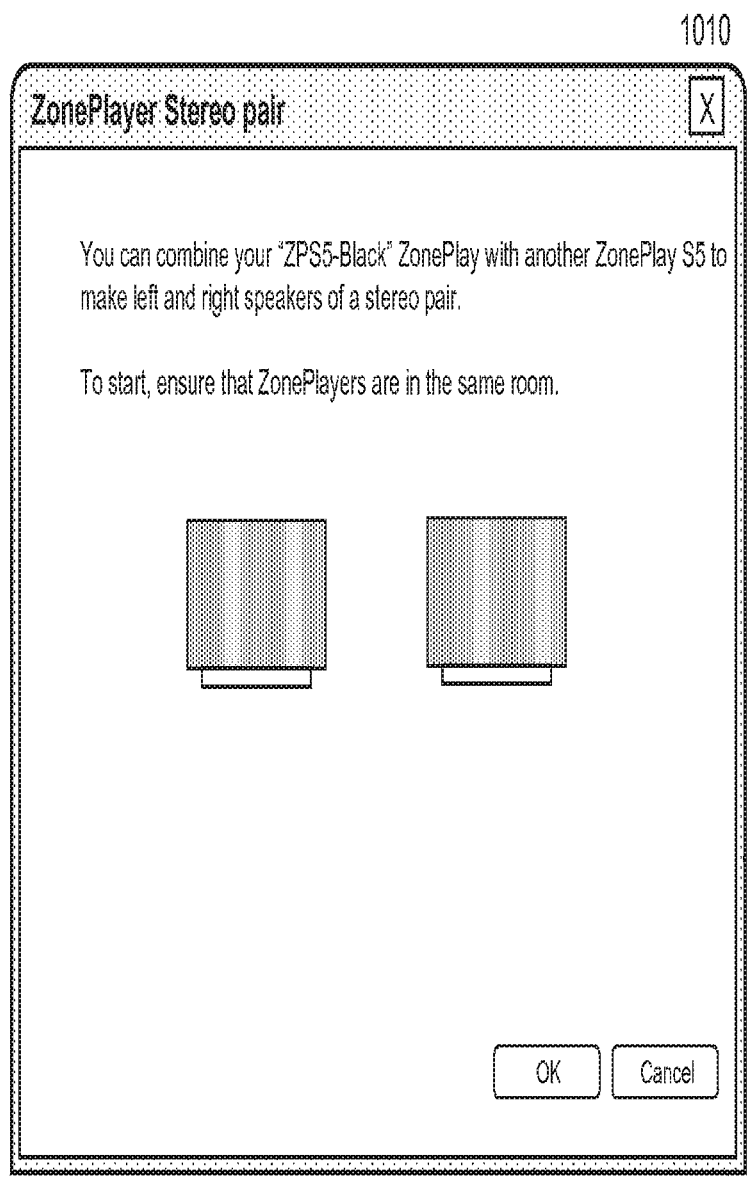

In certain embodiments, if another similar player is available to be paired, then the screenshot of FIG. 10B may be displayed. If the user wishes to continue with creating a pair, then the user may select "OK." If not, then the user may select "Cancel." In another embodiment, a different player (e.g., a player that is not an S5) may be paired together. That is, different types of players may be paired, if the players are so designed to be paired. To accommodate the differences in player type, the equalization of one or more players may be adjusted accordingly to compensate for things like the number and size of speaker drivers used in one player versus the other player. In yet another embodiment, a list of the players in the system may be displayed (not shown), from which the user selects two or more players to make the stereo pair. The list of players may be automatically determined by the system based on a player's particular location within a home, room, or configuration with other players within a room, for example.

Figure 10C:
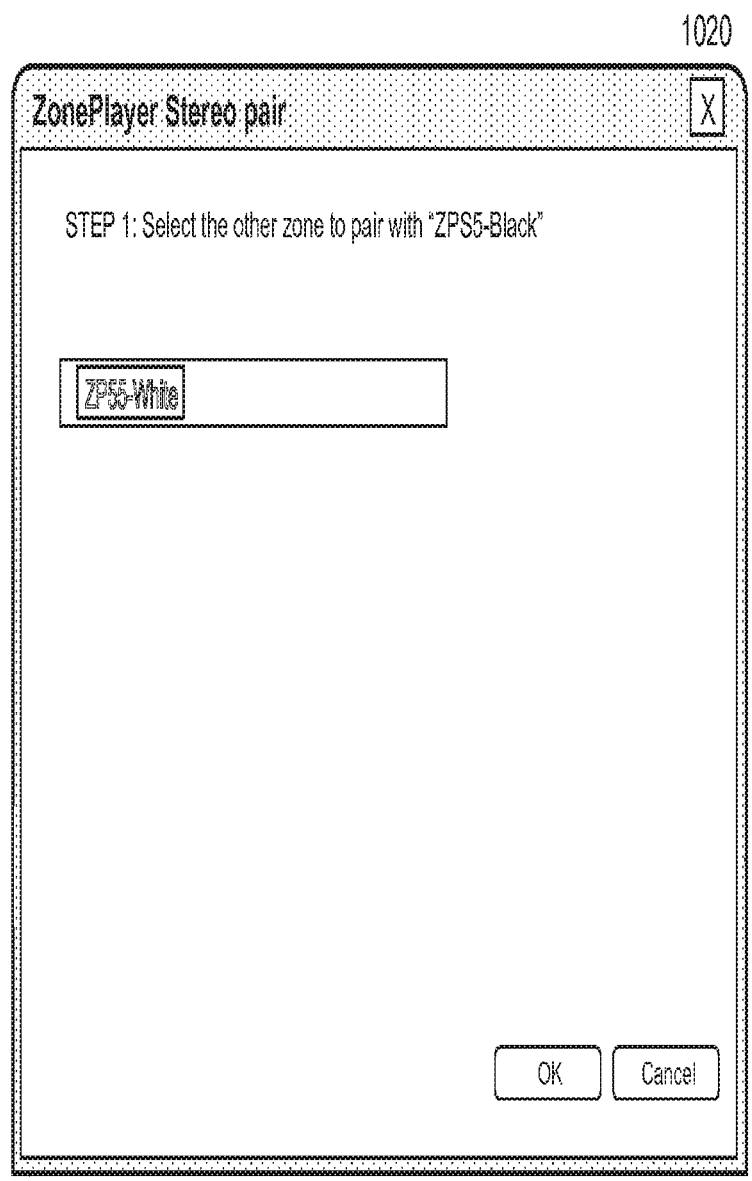

Turning now to FIG. 10C, in this example, it is assumed that the user may select a zone player named "ZPS5-White" to be paired with "ZPS5-Black" to create a stereo pair. If so desired, the user may select "OK" to proceed with the pairing. Otherwise, the user may select "Cancel." In certain embodiments, ZPS5-White may be in the same zone as ZPS5-Black. In other embodiments, ZPS5-White may be in a different zone as ZPS5-Black.

Figure 10D:
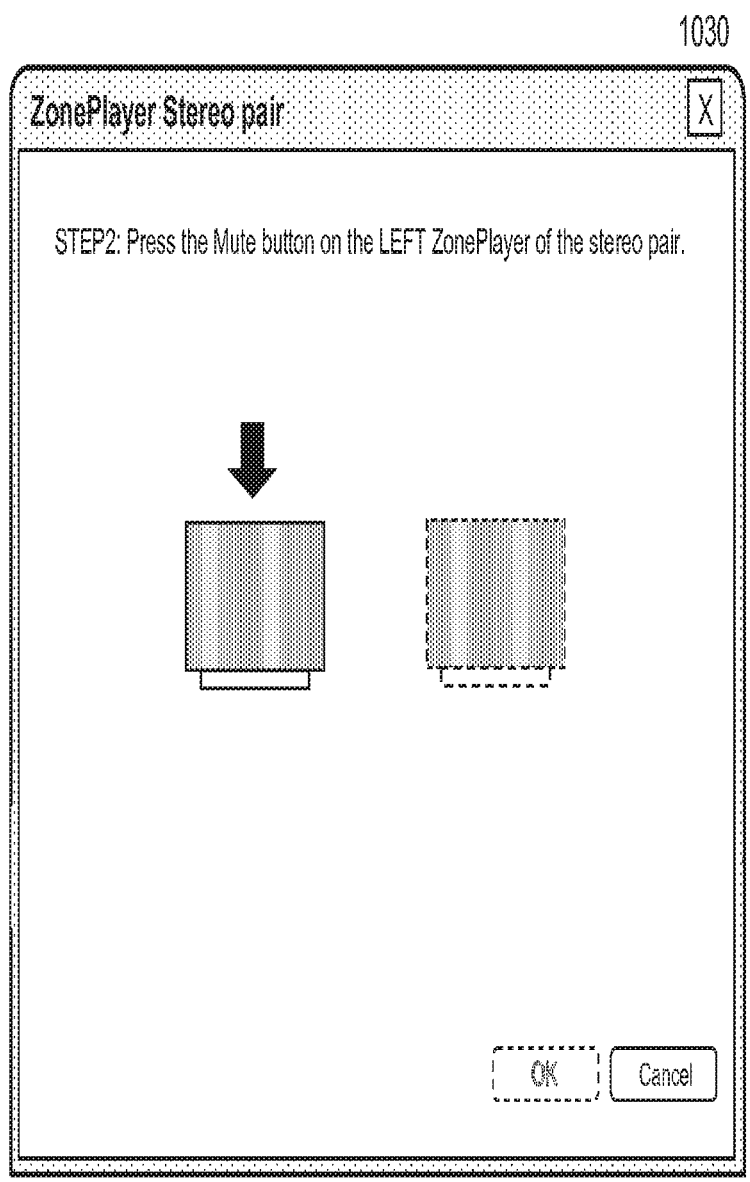
Figure 10E:
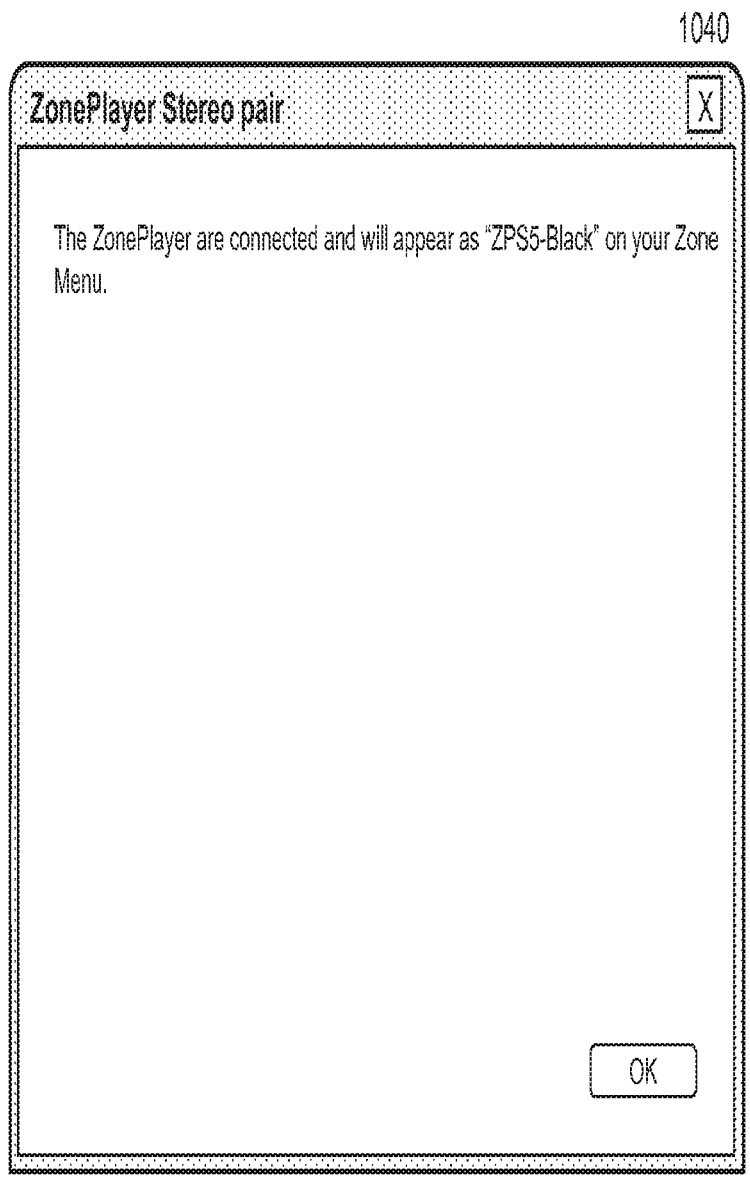
Figure 10F:
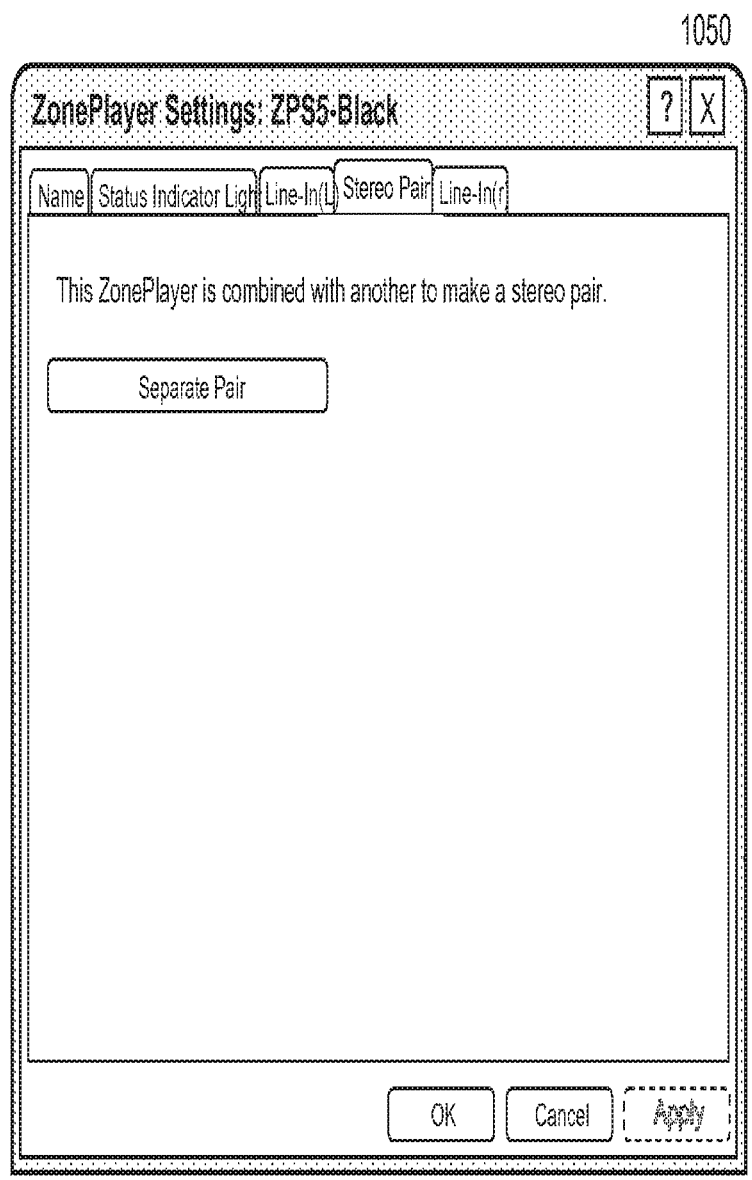

Upon selecting "OK" in FIG. 10C, a screenshot like that of FIG. 10D may be displayed to the user, thereby instructing the user to press the mute button (or some other designated button) on the "LEFT" player of the stereo pair. Further, a light on the players may flash to further indicate that each of the players is a possibility for left channel pairing. Upon selection of the left player, FIG. 10E may be displayed to inform the user that a pair has been created along with a name for the pair, if so desired. Responsively, the system will play the left channel audio from the user designated player and will automatically play the right channel audio from the other player. FIG. 10F provides an example screenshot to allow the user to separate the stereo pair if so desired.

In an alternative embodiment, the creation of a stereo pair may be an option for a particular zone or a number of zones (e.g., a household of zones). For example, an, option like "Create, a Stereo Pair" may exist such that upon selection, a setup wizard may launch asking the user to press a flashing mute button (or some other designated button) on whichever speaker the user wanted to be the left speaker in the zone, a portion of zones, or all of the zones. In one embodiment, flashing would occur for all, of the same speaker types. In another embodiment, flashing would occur for all speaker types that are capable of being paired. After choosing the left speaker, the wizard screen would ask the user to do the same for the right speaker. Preferably, only the speakers that are capable of being paired as the right speaker are flashing so as to appropriately narrow the choices for the user.

Additionally, in one embodiment and as shown in FIG. 3A or 3B, a graphic display is provided to show to the user all the players in a system and how they are grouped or named. A nickname for the stereo pair in die display 1040 may be highlighted and would be further displayed in FIG. 3A if FIG. 3A is modified after the stereo pair is complete A similar graphic interface may be used to create a pair in an environment having more than two channels. For example, in a home theater environment, the system may list more than two separate players from which the user can create a pairing by selecting which, player is to operate as the front right, center, front left, rear right, and rear left. A subwoofer may also be added to the list, so that it can be integrated into the multi-channel pairing by the user.

As an example, similar to what is described in the various embodiments above with respect to creating a stereo pair, the system may flash an indicator tight on all relevant players and a setup wizard may ask the user to select the "front-left," then the "front-right," then the "front-center," then the "rear-left," then the "rear-right" and so on until all of the players are appropriately paired. Preferably, only the speakers that are capable of being paired as the next speaker are flashing so as to appropriately narrow the choices for the user.

VII. Conclusion

The components, elements, and/or functionality of the systems discussed above may be implemented alone or in combination in various forms in hardware, firmware, and/or as a set of instructions in software, for example. Certain embodiments may be provided as a set of instructions residing on a computer-readable medium, such as a memory, hard disk, CD-ROM, DVD, and/or EPROM, for execution on a processing device, such as a controller and/or playback device.

Various inventions have been described in sufficient detail with a certain degree of particularity. It is understood to those skilled in the art that the present disclosure of embodiments has been made by way of examples only and that numerous changes in the arrangement and combination of parts may be resorted without departing from the spirit and scope of the invention as claimed. While the embodiments discussed herein may appear to include some limitations as to the presentation of the information units, in terms of the format and arrangement, the embodiments have applicability well beyond such embodiment, which can be appreciated by those skilled in the art. Accordingly, the scope of the present invention is defined by the appended claims rather than the forgoing description of embodiments.

We claim:

1. A playback device configured to output audio in a multi-channel listening environment, the playback device comprising:
   a network interface configured to receive audio data over a network;
   at least one speaker driver configured to output audio based on the audio data;
   one or more processors; and
   tangible, non-transitory, computer readable memory comprising instructions encoded therein, wherein the instructions are executable by the one or more processors such that the playback device is configured to (i) process the audio data before the playback device outputs audio from the at least one speaker driver, (ii) determine whether a type of pairing of the playback device comprises one of at least a first type of pairing or a second type of pairing, wherein while configured in at least one of the first type of pairing or the second type of pairing, the playback device is configured to generate and transmit one or more messages to one or more additional playback devices to coordinate playback of audio data by the playback device and the one or more additional playback devices, (iii) configure the playback device to perform a first equalization of the audio data before outputting audio from the at least one speaker driver when the type of pairing is determined by the playback device to comprise the first type of pairing, wherein the audio output from the at least one speaker driver is based on the audio data, and (iv) configure the playback device to perform a second equalization of the audio data before outputting audio from the at least one speaker driver when the type of pairing is determined by the playback device to comprise the second type of pairing, wherein the audio output from the at least one speaker driver is based on the audio data.

2. The playback device of claim 1, wherein performing the first equalization comprises using a first type of pass filter to modify the audio data before outputting audio from the at least one speaker driver, wherein performing the second equalization comprises using a second type of pass filter to modify the audio data before outputting audio from the at least one speaker driver, wherein the first type of pass filter and the second type of pass filter are different.

3. The playback device of claim 1, wherein the first type of pairing comprises no pairing with another playback device and the second type of pairing comprises pairing with the one or more additional playback devices.

4. The playback device of claim 1, wherein the first type of pairing comprises pairing with a second playback device and the second type of pairing comprises pairing with a plurality of playback devices.

5. The playback device of claim 1, further comprising program instructions stored in the tangible, non-transitory, computer readable memory that are executable by the one or more processors such that in the first type of pairing, the playback device is configured to output audio comprising two channel sound via the at least one speaker driver, and wherein in the second type of pairing, the playback device is configured to output audio comprising no more than one channel of the two channel sound via the at least one speaker driver.

6. The playback device of claim 1, further comprising program instructions stored in the tangible, non-transitory, computer readable memory that are executable by the one or more processors such that in the first type of pairing, the playback device is configured to output audio of a first audio channel of the audio data via the at least one speaker driver and wherein in the second type of pairing, the playback device is configured to output audio of a second audio channel of the audio data via the at least one speaker driver, and wherein the first audio channel and the second audio channel are different.

7. The playback device of claim 1, further comprising program instructions stored in the tangible, non-transitory, computer readable memory that are executable by the one or more processors such that in the first type of pairing, the playback device is configured to output audio based on the audio data via the at least one speaker driver in a stereo mode, and wherein in the second type of pairing, the playback device is configured to output audio based on the audio data via the at least one speaker driver in a theater mode.

8. The playback device of claim 1, further comprising program instructions stored in the tangible, non-transitory, computer readable memory that are executable by the one or more processors such that in the first type of pairing, the playback device is configured to output audio via the at least one speaker driver, wherein the audio output via the at least one speaker driver is based on the audio data and wherein in the second type of pairing, the playback device is configured to output audio via the at least one speaker driver in a consolidated mode, wherein the audio output via the at least one speaker driver is based on the audio data.

9. The playback device of claim 1, further comprising program instructions stored in the tangible, non-transitory, computer readable memory that are executable by the one or more processors such that the playback device is further configured to (i) separate the audio data into separate audio channels, (ii) output audio based on audio data of at least one separate audio channel from the at least one speaker driver, and (ii) transmit at least one additional separate audio channel over the network.

10. The playback device of claim 1, further comprising program instructions stored in the tangible, non-transitory, computer readable memory that are executable by the one or more processors such that the playback device is further configured to receive a signal from a controller over the network, wherein the signal comprises an instruction for the playback device to pair with one or more playback devices.

11. The playback device of claim 1, further comprising program instructions stored in the tangible, non-transitory, computer readable memory that are executable by the one or more processors such that the playback device is further configured to receive a signal from a controller over the network, wherein the signal comprises an instruction to configure the playback device in consolidation mode.

12. The playback device of claim 1, further comprising program instructions stored in the tangible, non-transitory, computer readable memory that are executable by the one or more processors such that the playback device further comprises a button that when selected configures the playback device to output audio comprising one channel of the audio data.

13. The playback device of claim 1, wherein the network is a wireless network.

14. A method for outputting audio in a multi-channel listening environment, wherein the method is performed by a playback device, the method comprising:
receiving audio data over a network;
processing the audio data before the playback device outputs audio from at least one speaker driver based on the audio data;
determining whether a type of pairing of the playback device comprises one of at least a first type of pairing or a second type of pairing;
when the playback device has determined it is configured for the first type of pairing, performing a first equalization of the audio data before outputting audio from the at least one speaker driver, wherein the audio output from the at least one speaker driver is based on the audio data;
when the playback device has determined it is configured for the second type of pairing, performing a second equalization of the audio data before outputting audio from the at least one speaker driver, wherein the audio output from the at least one speaker driver is based on the audio data; and wherein while configured in at least one of the first type of pairing or the second type of pairing, the playback device is configured to generate and transmit one or more messages to one or more additional playback devices to coordinate playback of audio data by the playback device and the one or more additional playback devices.

15. The method of claim 14, wherein performing the first equalization comprises using a first type of pass filter to modify the audio data before outputting audio from the at least one speaker driver, wherein performing the second equalization comprises using a second type of pass filter to modify the audio data before outputting audio from the at least one speaker driver, wherein the first type of pass filter and the second type of pass filter are different, and wherein the audio output from the at least one speaker driver is based on the audio data.

16. The method of claim 14, wherein the first type of pairing comprises no pairing with another playback device and the second type of pairing comprises pairing with the one or more additional playback devices.

17. The method of claim 14, wherein the first type of pairing comprises pairing with a second playback device and the second type of pairing comprises pairing with a plurality of playback devices.

18. The method of claim 14, wherein in the first type of pairing, the playback device is configured to output audio comprising two channel sound via the at least one speaker driver, and wherein in the second type of pairing, the playback device is configured to output audio comprising no more than one channel of the two channel sound via the at least one speaker driver.

19. The method of claim 14, wherein in the first type of pairing, the playback device is configured to output audio comprising a first audio channel of the audio data via the at least one speaker driver, and wherein in the second type of pairing, the playback device is configured to output audio comprising a second audio channel of the audio data via the at least one speaker driver, and wherein the first audio channel and the second audio channel are different.

20. The method of claim 14, wherein in the first type of pairing, the playback device is configured to output audio via the at least one speaker driver in a stereo mode, wherein the audio output via the at least one speaker driver is based on the audio data, and wherein in the second type of pairing, the playback device is configured to output audio via the at least one speaker driver in a theater mode, wherein the audio output via the at least one speaker driver is based on the audio data.

21. The method of claim 14, further comprising separating the audio data into separate audio channels, wherein at least one separate audio channel is output from the at least one speaker driver and at least one additional separate audio channel is transmitted over the network.

22. The method of claim 14, further comprising sending a signal over the network to a controller that is configured to select a channel of the audio data that is output from the at least one speaker driver.

* * * * *